United States Patent
Liu et al.

(10) Patent No.: US 11,221,512 B2
(45) Date of Patent: Jan. 11, 2022

(54) DISPLAYS WITH DIRECT-LIT BACKLIGHT UNITS AND COLOR CONVERSION LAYERS

(71) Applicant: Apple Inc., Cupertino, CA (US)

(72) Inventors: Rong Liu, Sunnyvale, CA (US); Daming Xu, Santa Clara, CA (US); Jun Qi, San Jose, CA (US); Ling Han, Cupertino, CA (US); Mookyung Son, Cupertino, CA (US); Chenhua You, San Jose, CA (US); Victor H. Yin, Cupertino, CA (US); Xinyu Zhu, Sunnyvale, CA (US); Heesang Suh, Saratoga, CA (US); Juan He, Orlando, FL (US); Joshua A. Spechler, Cupertino, CA (US); Zhenyue Luo, Santa Clara, CA (US); Suraj P. Gorkhali, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/294,731

(22) Filed: Mar. 6, 2019

(65) Prior Publication Data
US 2019/0285943 A1     Sep. 19, 2019

Related U.S. Application Data

(60) Provisional application No. 62/642,539, filed on Mar. 13, 2018.

(51) Int. Cl.
*G02F 1/13357*     (2006.01)
*H05K 1/02*     (2006.01)
(Continued)

(52) U.S. Cl.
CPC .......... *G02F 1/133603* (2013.01); *F21K 9/64* (2016.08); *G02F 1/133605* (2013.01);
(Continued)

(58) Field of Classification Search
CPC ......... G02F 1/133603; G02F 1/133605; G02F 1/133606; G02F 1/133614; G02F 1/133504; G02F 1/133617
(Continued)

(56) References Cited

U.S. PATENT DOCUMENTS

| 4,526,818 A | 7/1985 | Hoshikawa et al. |
| 5,723,937 A | 3/1998 | Whitman et al. |

(Continued)

FOREIGN PATENT DOCUMENTS

| CN | 1641432 A | 7/2005 |
| CN | 101004459 A | 7/2007 |

(Continued)

*Primary Examiner* — Bryon T Gyllstrom
*Assistant Examiner* — Christopher E Dunay
(74) *Attorney, Agent, or Firm* — Treyz Law Group, P.C.; Joseph F. Guihan

(57) ABSTRACT

A display may have a pixel array such as a liquid crystal pixel array. The pixel array may be illuminated with backlight illumination from a backlight unit. The backlight unit may include a printed circuit board, a plurality of light-emitting diodes mounted on the printed circuit board, at least one light spreading layer formed over the printed circuit board that spreads light received from the plurality of light-emitting diodes, a partially reflective layer formed over the at least one light spreading layer, a color conversion layer formed over the partially reflective layer, a collimating layer formed over the color conversion layer, a brightness enhancement film formed over the collimating layer, and a diffuser formed over the brightness enhancement film. The at least one light spreading layer may include two light spreading layers with elongated protrusions that are rotated relative to each other.

8 Claims, 56 Drawing Sheets

(51) Int. Cl.
*H05K 1/18* (2006.01)
*H05K 3/22* (2006.01)
*H05K 3/34* (2006.01)
*F21K 9/64* (2016.01)
*H01L 25/075* (2006.01)
*H01L 33/54* (2010.01)
*H01L 33/62* (2010.01)
*H01L 33/64* (2010.01)
*F21Y 115/10* (2016.01)
*G02F 1/1335* (2006.01)

(52) U.S. Cl.
CPC .. *G02F 1/133606* (2013.01); *G02F 1/133608* (2013.01); *G02F 1/133609* (2013.01); *G02F 1/133611* (2013.01); *H05K 1/0204* (2013.01); *H05K 1/181* (2013.01); *H05K 3/22* (2013.01); *H05K 3/3431* (2013.01); *H05K 3/3494* (2013.01); *F21Y 2115/10* (2016.08); *G02F 1/133607* (2021.01); *G02F 1/133612* (2021.01); *G02F 1/133614* (2021.01); *G02F 1/133628* (2021.01); *H01L 25/0753* (2013.01); *H01L 33/54* (2013.01); *H01L 33/62* (2013.01); *H01L 33/644* (2013.01); *H01L 2933/0066* (2013.01); *H01L 2933/0091* (2013.01); *H05K 1/0203* (2013.01); *H05K 2201/10106* (2013.01); *H05K 2201/10522* (2013.01)

(58) Field of Classification Search
USPC .......................................................... 428/690
See application file for complete search history.

(56) References Cited

U.S. PATENT DOCUMENTS

| | | | |
|---|---|---|---|
| 5,811,925 A * | 9/1998 | Anandan | H01J 9/247 |
| | | | 313/493 |
| 7,167,154 B2 | 1/2007 | Sato et al. | |
| 7,400,439 B2 | 7/2008 | Holman | |
| 8,094,266 B2 | 1/2012 | Nishino | |
| 8,382,337 B2 | 2/2013 | Ing et al. | |
| 8,471,479 B2 | 6/2013 | Tomiyoshi | |
| 8,514,165 B2 | 8/2013 | Yoshida | |
| 8,608,361 B2 | 12/2013 | Kim et al. | |
| 8,625,049 B2 | 1/2014 | Kim et al. | |
| 8,687,028 B2 | 4/2014 | Albrecht et al. | |
| 8,860,657 B2 | 10/2014 | Lee et al. | |
| 8,947,473 B2 | 2/2015 | Yee et al. | |
| 9,052,421 B2 | 6/2015 | Park et al. | |
| 9,316,385 B2 | 4/2016 | Maeda | |
| 9,568,768 B2 | 2/2017 | Tran et al. | |
| 9,599,855 B2 | 3/2017 | Kim et al. | |
| 9,857,518 B2 | 1/2018 | Thompson et al. | |
| 10,025,128 B2 | 7/2018 | Ochi et al. | |
| 10,067,379 B2 | 9/2018 | Sakuragi et al. | |
| 10,168,461 B2 | 1/2019 | Oh et al. | |
| 10,170,060 B2 | 1/2019 | Tseng et al. | |
| 10,197,849 B2 | 2/2019 | Shinkai et al. | |
| 10,215,905 B2 | 2/2019 | Nichol et al. | |
| 10,264,225 B2 | 4/2019 | Seetzen et al. | |
| 10,527,886 B1 | 1/2020 | Lin et al. | |
| 2002/0067443 A1* | 6/2002 | Bayley | G02F 1/133617 |
| | | | 349/61 |
| 2005/0001537 A1 | 1/2005 | West et al. | |
| 2005/0127375 A1 | 6/2005 | Erchak et al. | |
| 2005/0140860 A1 | 6/2005 | Olczak | |
| 2006/0082698 A1 | 4/2006 | Ko et al. | |
| 2006/0139955 A1 | 6/2006 | Noh et al. | |
| 2006/0290253 A1 | 12/2006 | Yeo et al. | |
| 2006/0290839 A1 | 12/2006 | Hasei et al. | |
| 2007/0047254 A1 | 3/2007 | Schardt et al. | |
| 2007/0200974 A1 | 8/2007 | Daiku | |
| 2007/0242197 A1 | 10/2007 | Watson et al. | |
| 2009/0009050 A1 | 1/2009 | Kanade et al. | |
| 2009/0059119 A1 | 3/2009 | Ohta et al. | |
| 2010/0165240 A1 | 7/2010 | Cho et al. | |
| 2010/0265694 A1* | 10/2010 | Kim | G02B 6/0068 |
| | | | 362/97.1 |
| 2010/0320482 A1 | 12/2010 | Tachibana | |
| 2011/0141746 A1 | 6/2011 | Ing et al. | |
| 2011/0176328 A1* | 7/2011 | Anandan | G02F 1/133605 |
| | | | 362/606 |
| 2012/0044668 A1 | 2/2012 | Takeuchi | |
| 2012/0050870 A1 | 3/2012 | Hsieh et al. | |
| 2012/0075549 A1 | 3/2012 | Lin et al. | |
| 2012/0224378 A1 | 9/2012 | Koike et al. | |
| 2012/0327311 A1 | 12/2012 | Kuromizu | |
| 2013/0027633 A1 | 1/2013 | Park et al. | |
| 2013/0264970 A1 | 10/2013 | Kuan et al. | |
| 2015/0043196 A1 | 2/2015 | Fleig et al. | |
| 2015/0219310 A1* | 8/2015 | Lee | G02F 1/0105 |
| | | | 362/84 |
| 2015/0293391 A1 | 10/2015 | Yanai et al. | |
| 2015/0338705 A1* | 11/2015 | Itou | G02F 1/133606 |
| | | | 349/43 |
| 2016/0070137 A1 | 3/2016 | You et al. | |
| 2016/0363708 A1 | 12/2016 | You et al. | |
| 2017/0199451 A1 | 7/2017 | Akiyama | |
| 2017/0207422 A1 | 7/2017 | Inoue | |
| 2017/0250316 A1 | 8/2017 | Yeon et al. | |
| 2017/0254518 A1 | 9/2017 | Vasylyev | |
| 2017/0269279 A1 | 9/2017 | Wyatt | |
| 2017/0269431 A1 | 9/2017 | Teragawa | |
| 2017/0299792 A1 | 10/2017 | Oh et al. | |
| 2018/0023784 A1 | 1/2018 | Tamura et al. | |
| 2018/0059482 A1 | 3/2018 | Li et al. | |
| 2018/0062049 A1 | 3/2018 | Otsuka et al. | |
| 2018/0080625 A1 | 3/2018 | Yamada et al. | |
| 2018/0081096 A1* | 3/2018 | Claes | G02B 5/201 |
| 2018/0129085 A1 | 5/2018 | Kuniyasu et al. | |
| 2018/0149914 A1 | 5/2018 | Lee | |
| 2018/0157102 A1 | 6/2018 | Sohn et al. | |
| 2018/0182940 A1* | 6/2018 | Yamamoto | H01L 33/60 |
| 2018/0292712 A1 | 10/2018 | Kishimoto et al. | |
| 2018/0342654 A1 | 11/2018 | Chen | |
| 2018/0358582 A1 | 12/2018 | Hochman et al. | |
| 2019/0025590 A1 | 1/2019 | Haddick | |
| 2019/0041684 A1 | 2/2019 | Imaoku et al. | |
| 2019/0114027 A1 | 4/2019 | Tanaka et al. | |
| 2019/0121012 A1 | 4/2019 | Jeon et al. | |
| 2019/0129249 A1 | 5/2019 | Lee et al. | |
| 2019/0187518 A1 | 6/2019 | Her et al. | |
| 2019/0204678 A1 | 7/2019 | Hosoki | |
| 2019/0220121 A1 | 7/2019 | Kim et al. | |
| 2019/0250462 A1* | 8/2019 | Lin | G02F 1/133603 |
| 2019/0251897 A1* | 8/2019 | Toyama | B82Y 20/00 |
| 2019/0258115 A1 | 8/2019 | Kyoukane et al. | |
| 2019/0324322 A1 | 10/2019 | Zha et al. | |
| 2020/0271994 A1* | 8/2020 | Zha | G02F 1/133605 |

FOREIGN PATENT DOCUMENTS

| | | |
|---|---|---|
| CN | 101135738 A | 3/2008 |
| CN | 101162745 A | 4/2008 |
| CN | 101231462 A | 7/2008 |
| CN | 101344682 A | 1/2009 |
| CN | 101649969 A | 2/2010 |
| CN | 101657676 A | 2/2010 |
| CN | 101793379 A | 8/2010 |
| CN | 101922652 A | 12/2010 |
| CN | 102142505 A | 8/2011 |
| CN | 102597819 A | 7/2012 |
| CN | 105116611 A | 12/2015 |
| CN | 105892149 A | 8/2016 |
| CN | 106707614 A | 5/2017 |
| CN | 107390424 A | 11/2017 |
| CN | 107608134 A | 1/2018 |
| CN | 206946014 U | 1/2018 |
| EP | 2851742 B1 | 2/2019 |
| JP | 2010262827 A | 11/2010 |
| JP | 2011514624 A | 5/2011 |

(56) References Cited

FOREIGN PATENT DOCUMENTS

| | | |
|---|---|---|
| JP | 2013503431 A | 1/2013 |
| JP | 2016092678 A | 5/2016 |
| KR | 20080040033 A | 5/2008 |
| KR | 1020150025231 A | 3/2015 |
| KR | 20150046786 A | 4/2015 |
| TW | 200840080 A | 10/2008 |
| WO | 2009107052 A1 | 9/2009 |
| WO | 2012014600 A1 | 2/2012 |
| WO | 2015119434 A1 | 8/2015 |

* cited by examiner

DISPLAYS WITH DIRECT-LIT BACKLIGHT UNITS AND COLOR CONVERSION LAYERS

This application claims the benefit of provisional patent application No. 62/642,539, filed Mar. 13, 2018, which is hereby incorporated by reference herein in its entirety.

BACKGROUND

This relates generally to displays, and, more particularly, to backlit displays.

Electronic devices often include displays. For example, computers and cellular telephones are sometimes provided with backlit liquid crystal displays. Edge-lit backlight units have light-emitting diodes that emit light into an edge surface of a light guide plate. The light guide plate then distributes the emitted light laterally across the display to serve as backlight illumination.

Direct-lit backlight units have arrays of light-emitting diodes that emit light vertically through the display. If care is not taken, however, a direct-lit backlight may be bulky or may produce non-uniform backlight illumination.

SUMMARY

A display may have a pixel array such as a liquid crystal pixel array. The pixel array may be illuminated with backlight illumination from a backlight unit. The backlight unit may include an array of light-emitting diodes and a light reflector that helps reflect light from the light-emitting diodes through the pixel array. Each light-emitting diode may be placed in a respective cell.

The backlight unit may include a printed circuit board, a plurality of light-emitting diodes mounted on the printed circuit board, at least one light spreading layer formed over the printed circuit board that spreads light received from the plurality of light-emitting diodes, a partially reflective layer formed over the at least one light spreading layer, a color conversion layer formed over the partially reflective layer, a collimating layer formed over the color conversion layer, a brightness enhancement film formed over the collimating layer, and a diffuser formed over the brightness enhancement film.

DETAILED DESCRIPTION

Figure 1:
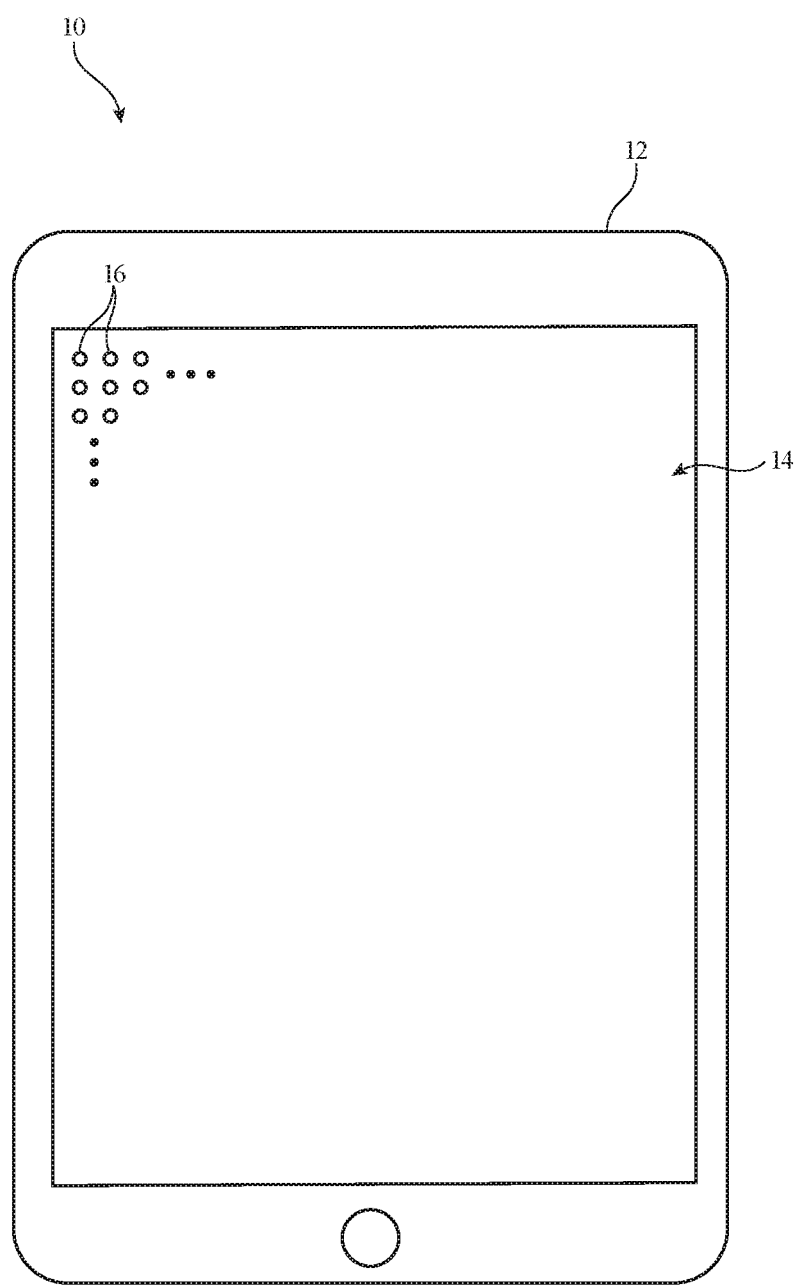
FIG. 1 is a diagram of an illustrative electronic device having a display in accordance with an embodiment.

Electronic devices may be provided with backlit displays. The backlit displays may include liquid crystal pixel arrays or other display structures that are backlit by light from a direct-lit backlight unit. A perspective view of an illustrative electronic device of the type that may be provided with a display having a direct-lit backlight unit is shown in FIG. 1. Electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, device 10 may have a display such as display 14. Display 14 may be mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Housing 12 may have a stand, may have multiple parts (e.g., housing portions that move relative to each other to form a laptop computer or other device with movable parts), may have the shape of a cellular telephone or tablet computer, and/or may have other suitable configurations. The arrangement for housing 12 that is shown in FIG. 1 is illustrative.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels 16 formed from liquid crystal display (LCD) components or may have an array of pixels based on other display technologies. A cross-sectional side view of display 14 is shown in FIG. 2.

Figure 2:
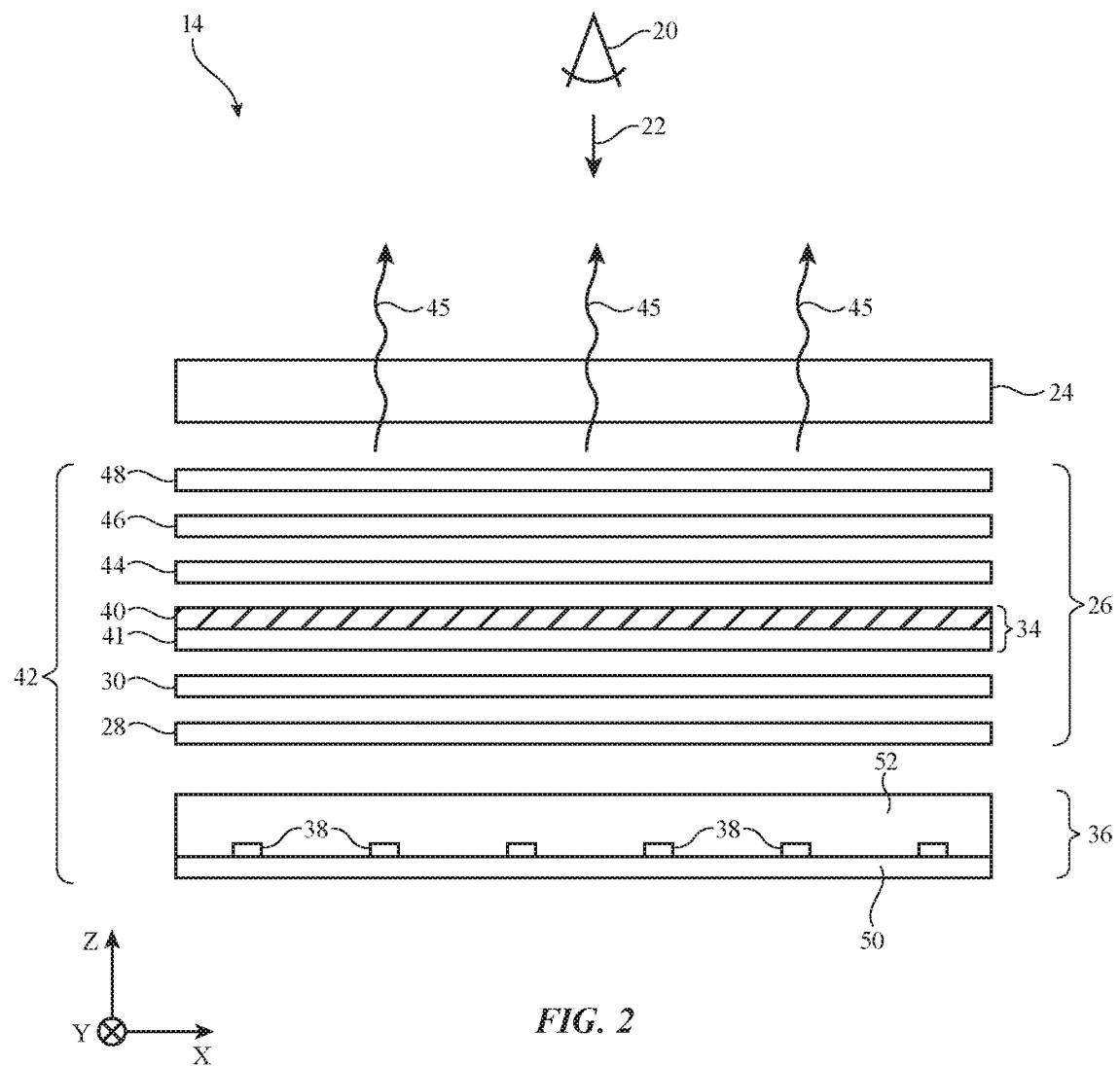
FIG. 2 is a cross-sectional side view of an illustrative display in accordance with an embodiment.

As shown in FIG. 2, display 14 may include a pixel array such as pixel array 24. Pixel array 24 may include an array of pixels such as pixels 16 of FIG. 1 (e.g., an array of pixels having rows and columns of pixels 16). Pixel array 24 may be formed from a liquid crystal display module (sometimes referred to as a liquid crystal display or liquid crystal layers) or other suitable pixel array structures. A liquid crystal display for forming pixel array 24 may, as an example, include upper and lower polarizers, a color filter layer and a thin-film transistor layer interposed between the upper and lower polarizers, and a layer of liquid crystal material interposed between the color filter layer and the thin-film transistor layer. Liquid crystal display structures of other types may be used in forming pixel array 24, if desired.

During operation of display 14, images may be displayed on pixel array 24. Backlight unit 42 (which may sometimes be referred to as a backlight, backlight layers, backlight structures, a backlight module, a backlight system, etc.) may be used in producing backlight illumination 45 that passes through pixel array 24. This illuminates any images on pixel array 24 for viewing by a viewer such as viewer 20 who is viewing display 14 in direction 22.

Backlight unit 42 may include a plurality of optical films 26 formed over light-emitting diode array 36. Light-emitting diode array 36 may contain a two-dimensional array of light sources such as light-emitting diodes 38 that produce backlight illumination 45. Light-emitting diodes 38 may, as an example, be arranged in rows and columns and may lie in the X-Y plane of FIG. 2. Light-emitting diodes 38 may be mounted on printed circuit board 50 (sometimes referred to as substrate 50) and may be encapsulated by encapsulant 52 (sometimes referred to as transparent encapsulant 52).

Light-emitting diodes 38 may be controlled in unison by control circuitry in device 10 or may be individually controlled (e.g., to implement a local dimming scheme that helps improve the dynamic range of images displayed on pixel array 24). The light produced by each light-emitting diode 38 may travel upwardly along dimension Z through optical films 26 before passing through pixel array 24.

Optical films 26 may include films such as light spreading layer 28, partially reflective layer 30, color conversion layer 34 (which may include phosphor layer 40 and partially reflective layer 41), collimating layer 44, brightness enhancement film 46, diffuser layer 48, and/or other optical films.

Light-emitting diodes 38 may emit light of any suitable color (e.g., blue, red, green, white, etc.). With one illustrative configuration described herein, light-emitting diodes 38 emit blue light. To help provide uniform backlight across backlight unit 42, light from light-emitting diodes 38 may be spread by light spreading layer 28. After passing through light spreading layer 28, light from light-emitting diodes 38 may pass through partially reflective layer 30. Partially reflective layer 30 (sometimes referred to as dichroic layer 30 or dichroic filter layer 30) may be configured to reflect some light from the LEDs and transmit some light from the LEDs. Partially reflective layer may include a multi-Bragg reflector and a diffuser layer in one possible embodiment. Light that is reflected off of partially reflective layer 30 may be recycled (e.g., the reflected light will reflect off of other layers such as substrate 50 before reaching partially reflective layer 30 again). Light that is transmitted through partially reflective layer 30 then passes through color conversion layer 34 (which may sometimes be referred to as a photoluminescent layer).

The transmission of partially reflective layer 30 may be selected to maximize the efficiency of display 14. Lowering the transmission of blue light (e.g., from the light-emitting diodes) through the partially reflective layer increases the amount of blue light that is recycled. However, recycling more light may cause more light to be absorbed by printed circuit board 50 (or other layers below partially reflective layer 30). Increasing the transmission of blue light may cause more visible artifacts, however. Therefore, the transmission of the partially reflective layer may be selected to optimize efficiency and uniformity of the display. The reflectance of printed circuit board 50 may influence the optimum transmission level of partially reflective layer 30. In one illustrative embodiment, printed circuit board 50 may have a reflectance of about 90% and partially reflective layer 30 may reflect 50% of blue light from light-emitting diodes 38. Increasing the reflectance of printed circuit board 50 would increase the optimum reflectance of partially reflective layer 30.

Color conversion layer 34 may convert the light from LEDs 38 from a first color to a different color. For example, when the LEDs emit blue light, color conversion layer 34 may include a phosphor layer 40 (e.g., a layer of white phosphor material or other photoluminescent material) that converts blue light into white light. If desired, other photoluminescent materials may be used to convert blue light to light of different colors (e.g., red light, green light, white light, etc.). For example, one layer 34 may have a phosphor layer 40 that includes quantum dots that convert blue light into red and green light (e.g., to produce white backlight illumination that includes, red, green, and blue components, etc.). Configurations in which light-emitting diodes 38 emit white light (e.g., so that layer 34 may be omitted, if desired) may also be used. In addition to phosphor layer 40, color conversion layer 34 may include a partially reflective layer 41. Partially reflective layer 41 (sometimes referred to as a dichroic layer or dichroic filter layer) may reflect all red and green light and partially reflect blue light, for example.

If desired, color conversion layer 34 and partially reflective layer 30 may be formed as a single integral layer. This may reduce the thickness of the optical film stack-up.

By the time light from light-emitting diodes 38 reaches collimating layer 44, the light has been converted from blue to white and has been homogenized (e.g., by the light spreading layer). Collimating layer 44 (sometimes referred to as microlens layer 44 or microlens array diffuser 44) may collimate off-axis light. One or more brightness enhancement films 46 may be included to further help collimate light 45 and thereby increase the brightness of display 14 for user 20. Finally, backlight unit 42 may include diffuser layer 48 to homogenize light from the array of light-emitting diodes.

Figure 3:
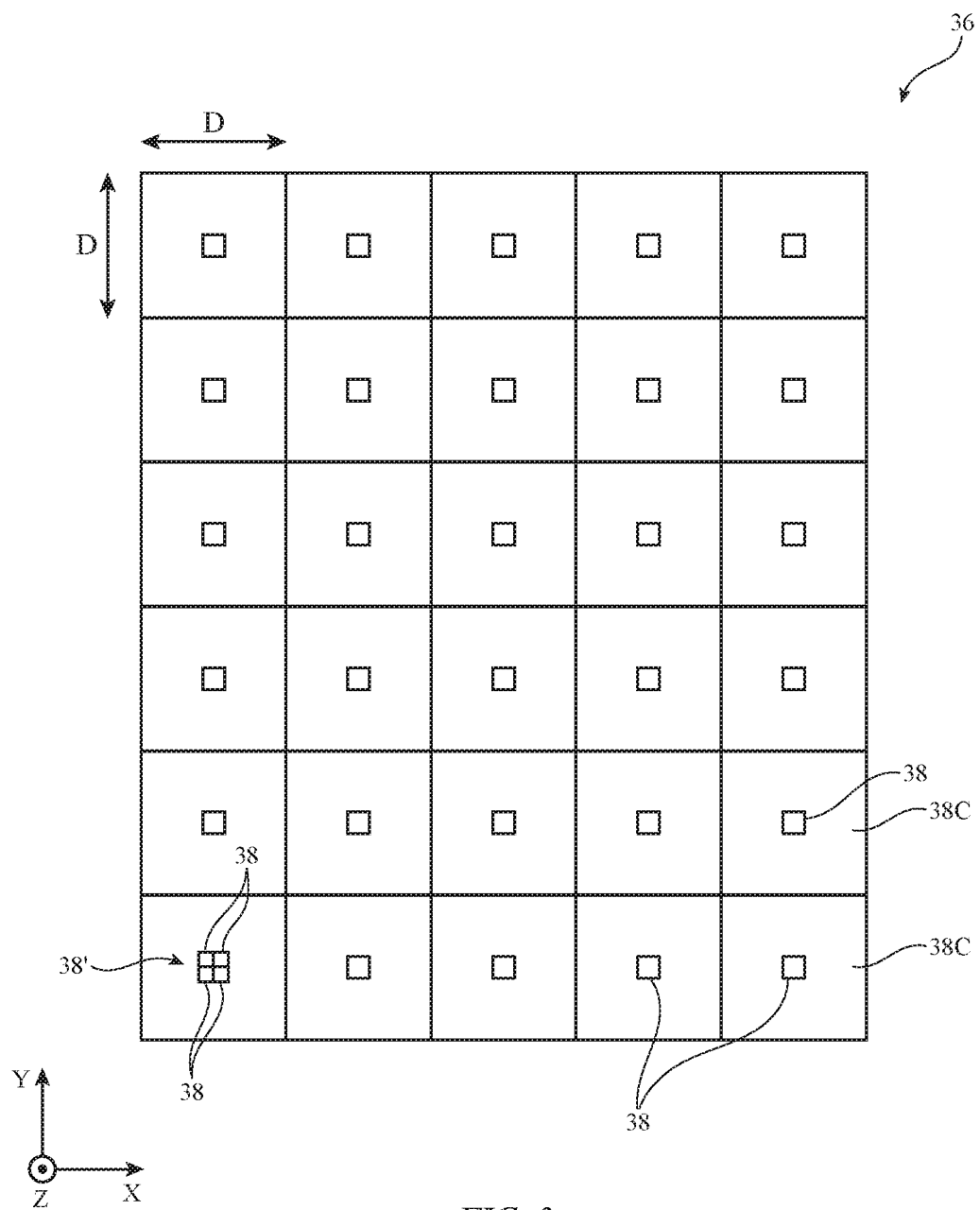
FIG. 3 is a top view of an illustrative light-emitting diode array for a direct-lit backlight unit in accordance with an embodiment.

FIG. 3 is a top view of an illustrative light-emitting diode array for backlight 42. As shown in FIG. 3, light-emitting diode array 36 may contain row and columns of light-emitting diodes 38. Each light-emitting diode 38 may be associated with a respective cell (tile area) 38C. The length D of the edges of cells 38C may be 2 mm, 18 mm, 1-10 mm, 1-4 mm, 10-30 mm, more than 5 mm, more than 10 mm, more than 15 mm, more than 20 mm, less than 25 mm, less than 20 mm, less than 15 mm, less than 10 mm, less than 1 mm, less than 0.1 mm, greater than 0.01 mm, greater than 0.1 mm, or any other desired size. If desired, hexagonally tiled arrays and arrays with light-emitting diodes 38 that are organized in other suitable array patterns may be used. In arrays with rectangular cells, each cell may have sides of equal length (e.g., each cell may have a square outline in which four equal-length cell edges surround a respective light-emitting diode) or each cell may have sides of different lengths (e.g., a non-square rectangular shape). The configuration of FIG. 3 in which light-emitting diode array 36 has rows and columns of square light-emitting diode regions such as cells 38C is merely illustrative.

If desired, each cell 38C may have a light source that is formed form an array of light-emitting diode dies (e.g., multiple individual light-emitting diodes 38 arranged in an array such as a 2×2 cluster of light-emitting diodes at the center of each cell 38C). For example, light source 38' in the leftmost and lowermost cell 38C of FIG. 3 has been formed from a 2×2 array of light-emitting diodes 38 (e.g., four separate light-emitting diode dies). In general, each cell 38C may include a light source 38' with a single light-emitting diode 38, a pair of light-emitting diodes 38, 2-10 light-emitting diodes 38, at least two light-emitting diodes 38, at least 4 light-emitting diodes 38, at least eight light-emitting diodes 38, fewer than five light-emitting diodes 38, or other suitable number of light-emitting diodes. Illustrative configurations in which each cell 38C has a single light-emitting diode 38 may sometimes be described herein as an example. This is, however, merely illustrative. Each cell 38C may have a light source 38 with any suitable number of one or more light-emitting diodes 38. The diodes 38 in light-emitting diode array 36 may be mounted on a printed circuit board substrate that extends across array 36 or may be mounted in array 36 using other suitable arrangements.

Light-emitting diodes 38 in light-emitting diode array 36 may generate heat. If care is not taken, the resulting heat gradient (e.g., with areas of the array closer to the light-emitting diodes being hotter than areas of the array between the light-emitting diodes) may cause a heat gradient in pixel array 24. The color of light emitted by pixel array 24 may be dependent on temperature. Therefore, a high thermal gradient in the pixel array can negatively affect display performance.

Figure 4:
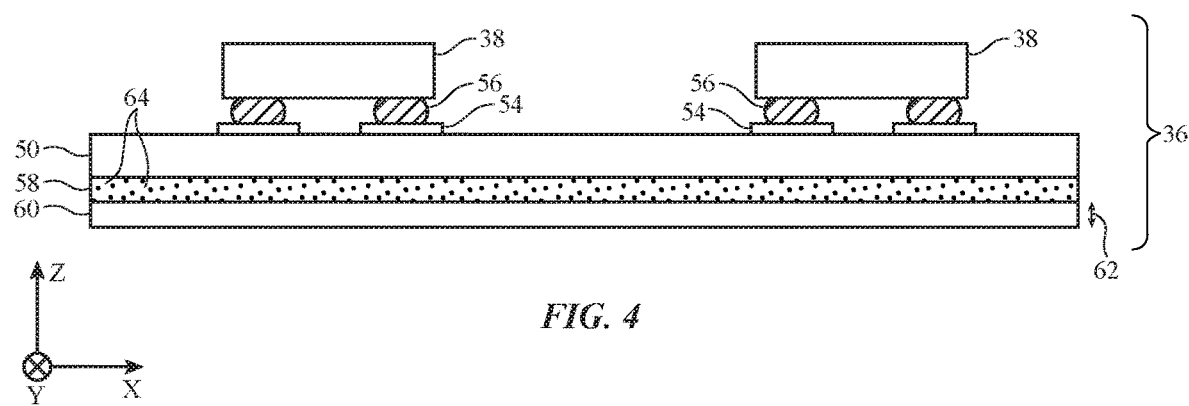
FIG. 4 is a cross-sectional side view of an illustrative light-emitting diode array with a thermally conductive layer adhered to a printed circuit board with light-emitting diodes in accordance with an embodiment.
Figure 5:
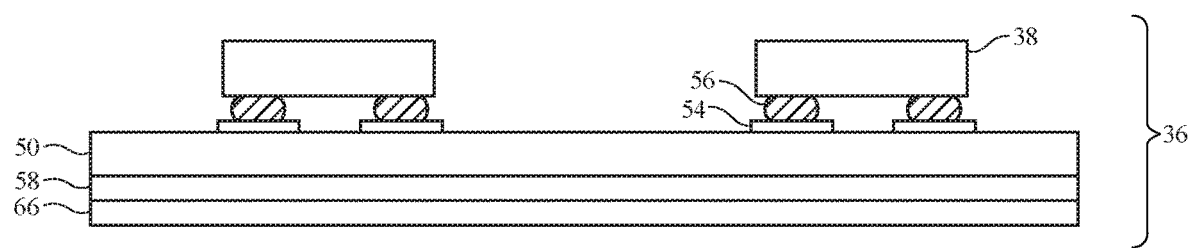
FIG. 5 is a cross-sectional side view of an illustrative light-emitting diode array with a radiative cooling coating on a printed circuit board with light-emitting diodes in accordance with an embodiment.

FIGS. 4 and 5 are cross-sectional side views of illustrative light-emitting diode arrays with layers that help distribute heat from light-emitting diodes 38 (and prevent a thermal gradient in pixel array 24). As shown in FIG. 4, light-emitting diodes 38 may be attached to conductive pads 54 (e.g., solder pads) of printed circuit board 50 using conductive material (e.g., solder) 56. A thermally conductive layer 60 may be attached to the bottom surface of printed circuit board 50 using adhesive layer 58. Adhesive layer 58 may conduct heat in the negative Z-direction (e.g., from printed circuit board 50) to thermally conductive layer 60. Thermally conductive layer 60 may then distribute heat within the XY-plane.

Thermally conductive layer 60 may be formed from any desired material. For example, thermally conductive layer 60 may be formed from aluminum, graphite, a carbon-fiber reinforced sheet, carbon nanotubes, or metal particles. Thermally conductive layer 60 may have a thermal conductivity of greater than 200 W/mK, greater than 300 W/mK, greater than 400 W/mK, between 200 W/mK and 400 W/mK, or another desired thermal conductivity. Thermally conductive layer 60 may have a thickness 62 of less than 0.1 millimeters, less than 0.2 millimeters, about 55 microns, greater than 20 microns, or another desired thickness.

Adhesive layer 58 may be a pressure sensitive adhesive layer. If desired, adhesive layer 58 may include additive 64 (e.g., metal particles) to increase thermal conductivity of the adhesive layer.

In another embodiment, shown in FIG. 5, a radiative cooling coating may be attached to printed circuit board 50. As shown in FIG. 5, layer 66 (sometimes referred to as a coating layer, radiative cooling layer or radiative cooling coating) may be attached to a bottom surface of the printed circuit board 50 (e.g., using adhesive 58). Layer 66 may include metal particles that are embedded in a polymer sheet. The metal particles may, for example, emit infrared light, thereby cooling the adjacent layers.

As shown in FIGS. 4 and 5, light-emitting diodes 38 are attached to solder pads on printed circuit board 50 using solder. If the overlap area between the solder and the light-emitting diodes is low, the strength of the bond between the solder and the light-emitting didoes may be low. To increase the overlap area between the solder and the light-emitting diodes (and accordingly, the bonding strength and SMT yield), the light-emitting diodes may have a rectangular design, as shown in FIG. 6.

Figure 6:
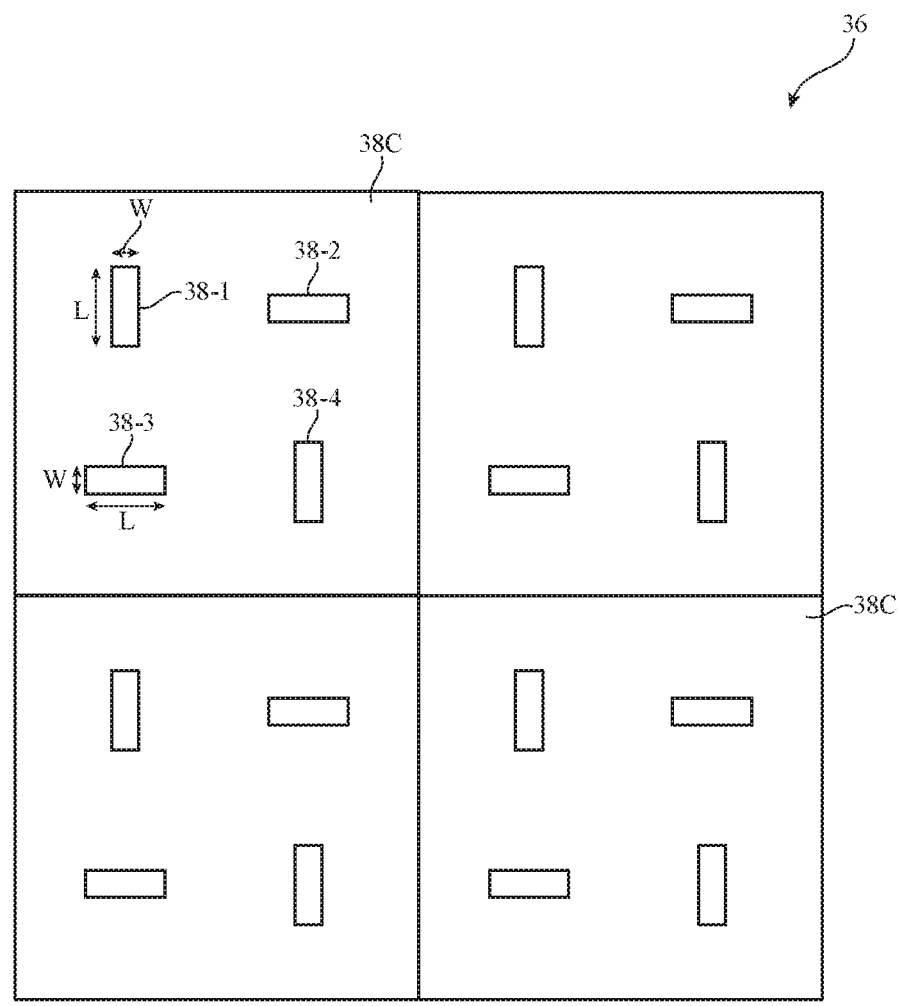
FIG. 6 is a top view of an illustrative light-emitting diode array for a direct-lit backlight unit having four rectangular light-emitting diodes in each cell in accordance with an embodiment.
Figure 6:
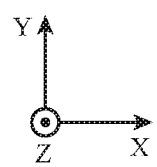

FIG. 6 is a top view of illustrative light-emitting diodes having a rectangular (non-square) shape. As shown, each light-emitting diode in light-emitting diode array 36 may have a width (W) and a length (L) that is longer than the width (e.g., greater than the width, at least twice as long as the width, at least 1.5 times as long as the width, at least 3 times as long as the width, less than 3 times long than the width, etc.). In other words, each light-emitting diode may have a non-square rectangular shape. Each cell (tile area) 38C may have an associated four light-emitting diodes 38-1, 38-2, 38-3, and 38-4. As shown in FIG. 6, light-emitting diodes 38-1, 38-2, 38-3, and 38-4 are arranged in a 2×2 grid within cell 38C. Light-emitting diode 38-1 is in the upper-left of the grid, light-emitting diode 38-2 is in the upper-right of the grid, light-emitting diode 38-3 is in the lower-left of the grid, and light-emitting diode 38-3 is in the lower-right of the grid. Light-emitting diodes 38-1 and 38-4 may have lengths that are parallel to the Y-axis, whereas light-emitting diodes 38-2 and 38-3 may have lengths that are parallel to the X-axis (and rotated 90° relative to the lengths of 38-1 and 38-4). With this arrangement, each light-emitting diode may have a non-square rectangular outline (for increased bonding strength) while ensuring uniform backlight (because the four light-emitting diodes in each tile will together emit uniform backlight). The light-emitting diodes in each tile may be controlled together. Each light-emitting diode in a given cell may have any desired positioning and orientation. Each light-emitting diode in a given cell may have any desired pattern of solder. Each light-emitting diode in a given cell may have any desired encapsulant additives of any desired particle size and distribution.

Figure 7:
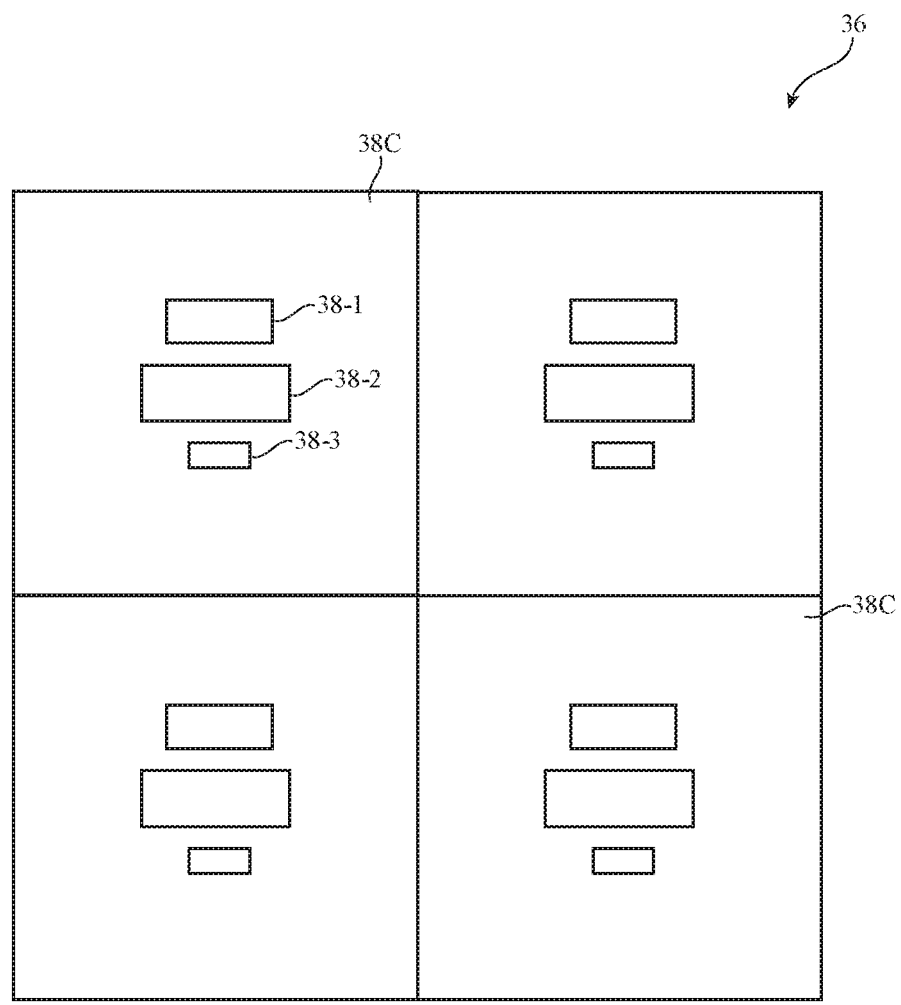
FIG. 7 is a top view of an illustrative light-emitting diode array for a direct-lit backlight unit having light-emitting diodes with different properties in each cell in accordance with an embodiment.
Figure 7:
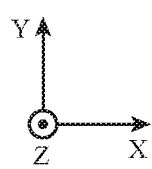

Another arrangement for light-emitting diodes in a light-emitting diode array 36 is shown in FIG. 7. As shown in FIG. 7, each tile 38C may have an associated plurality (e.g., two, three, more than three, etc.) of light-emitting diodes. In the example of FIG. 7, each tile 38C includes light-emitting diodes 38-1, 38-2, and 38-3. These light-emitting diodes may have different properties to help tune the light emitted from the cell. In the example of FIG. 7, light-emitting diode 38-2 is larger than light-emitting diode 38-1, and light-emitting diode 38-1 is larger than light-emitting diode 38-3. Each light-emitting diode may have the same or different sizes. The example of FIG. 7 in which each light-emitting diode has a non-square rectangular shape is merely illustrative, and each light-emitting diode may have any desired shape. In another possible embodiment, the light-emitting diodes may have different peak wavelength emissions. Additionally, as shown in FIG. 2 each light-emitting diode may be covered by encapsulant 52. Each light-emitting diode in tile 38C may be covered by encapsulant of different shapes or encapsulant with different dopants.

In general, multiple light-emitting diodes in a given tile may have different properties to tune the light that is emitted from that tile. These properties may include positioning, orientation, properties of the solder attached to the light-emitting diodes, particle size of encapsulant additives, and distribution of encapsulant additives. In one illustrative example, light emitting diodes 38-1, 38-2, and 38-3 may be red, blue, and green light-emitting diodes respectively (and tile 38C emits white light).

Figure 8:
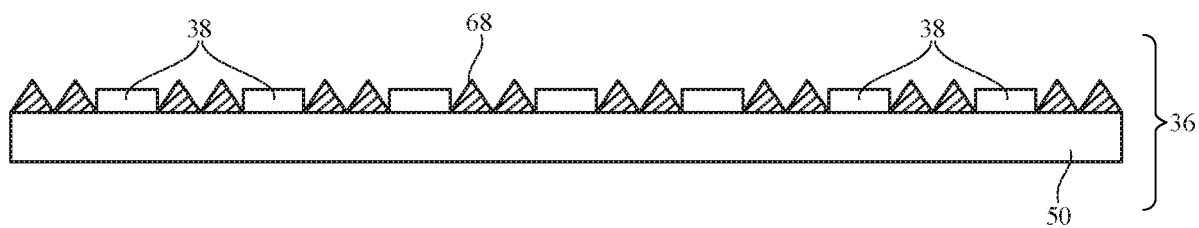
FIG. 8 is a cross-sectional side view of an illustrative light-emitting diode array having a light redirecting layer between light-emitting diodes in accordance with an embodiment.

FIG. 2 shows light spreading layer 28 that is used to spread light from light-emitting diodes 38 in light-emitting diode array 36. FIG. 8 is a cross-sectional side view of an illustrative light-emitting diode array with a light redirecting layer on the printed circuit board adjacent the light-emitting diodes. As shown in FIG. 8, light-emitting diodes 38 are mounted on an upper surface of printed circuit board 50. Light redirecting layer 68 is also mounted on the upper surface of printed circuit board 50. Light redirecting layer 68 may be a prismatic reflector that helps redirect light emitted from the edges of light-emitting diodes 38. Layer 68 may be a separate film that is laminated to printed circuit board 50 or may be embossed on a UV curable or thermal curable coating on the printed circuit board.

Layer 68 may be designed to guide light in a particular direction to improve optical uniformity and efficiency. The layer can include diffusive, refractive, and/or diffractive optical properties. Layer 68 may include a micro structure, a parabolic reflector, an embossed structure that diffracts a certain wavelength, or a prismatic structure that emits light at a defined cone angle. Layer 68 may work in combination with light spreading layer 28 or may replace light spreading layer 28. In the example of FIG. 8, layer 68 includes two protrusions between each adjacent light-emitting diode 38.

Figure 9:
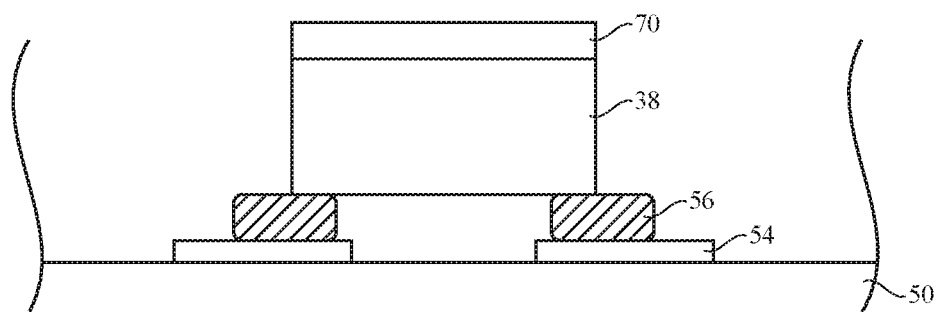
FIGS. 9 and 10 are cross-sectional side views of illustrative light-emitting diodes with and without a reflector layer such as distributed Bragg-reflector in accordance with an embodiment.
Figure 10:
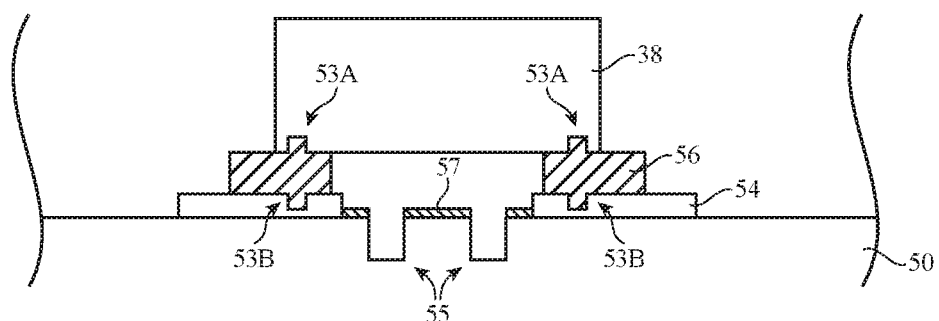

FIGS. 9 and 10 are cross-sectional side views showing how light-emitting diodes 38 in light-emitting diode array 36 may or may not include a reflector layer. As shown in FIG. 9, light-emitting diode may include a reflector layer 70 (e.g., a distributed Bragg-reflector) to help direct emitted light from light-emitting diode 38 sideways. This can reduce the on-axis intensity of light emitted by light-emitting diode 38. However, this increases the amount of light that hits the upper surface of printed circuit board 50, solder pads 54, and solder 56. Printed circuit board 50, solder pads 54, and solder 56 may not have a high reflectance. Therefore, the presence of reflector layer 70 may result in high light loss. To reduce light loss, the light-emitting diode may not include reflector layer 70 (as shown in FIG. 10).

FIG. 10 additionally shows various ways to reduce the solder thickness and corresponding height of the light-emitting diode relative to the printed circuit board and improve solder quality by reducing air enclosed under the light-emitting diode. As shown in FIG. 10, solder pads 54 may have recesses 53B (e.g., in the upper surface of the solder pads) that receive portions of solder 56. Recesses 53B allow solder 56 to better attach to solder pad 54 due to capillarity and gravity. Similarly, the lower surface of light-emitting diode 38 may have one or more recesses 53A that receive portions of solder 56. Again, recesses 53A may allow solder 56 to better attach to light-emitting diode 38. One or more of the recesses may be coated with a conductive coating if desired.

Additionally, a coating 57 may be included on printed circuit board 50 underneath light-emitting diode 38. Coating 57 may be a dielectric (e.g., non-conductive) coating. Coating 57 may be hydrophobic, allowing solder 56 to flow across the coating. When solder 56 is deposited, excess solder may flow across coating 57 into recesses 55 in printed circuit board 50. Recesses 55 may extend partially through printed circuit board 50 or may pass entirely (e.g., from an upper surface to a lower surface) through the circuit board. Vacuum suction may also be applied (e.g., during solder deposition) to align the die and remove excess air. Having excess solder flow into recesses 55 as described may improve solder quality and placement reliability, reduce die tilting, and reduce air under the die.

Figure 11:
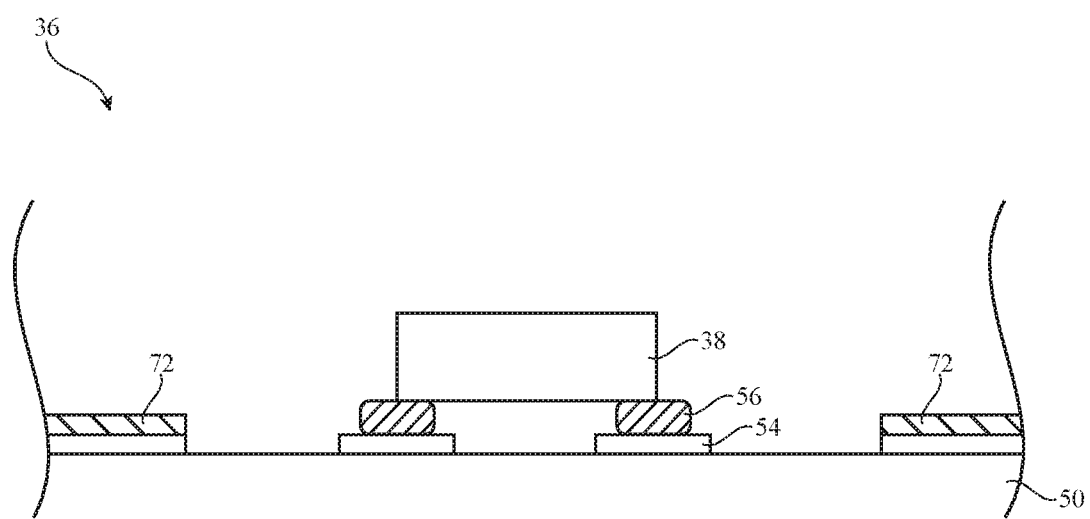
FIG. 11 is a cross-sectional side view of an illustrative light-emitting diode array having a reflective layer in accordance with an embodiment.

FIG. 11 shows ways to reduce light loss by increasing the reflectivity of the printed circuit board and other adjacent layers. As shown in FIG. 11, solder mask 72 (sometimes referred to as a solder mask reflector or a reflective layer) may be included in light-emitting diode array 36. Solder mask 72 may be formed from a highly reflective material to reduce losses when light from light-emitting diode 38 hits solder mask 72. The solder mask may include titanium dioxide ($TiO_2$) (e.g., titanium dioxide particles dispersed in a polymer) or other desired materials to increase reflectivity. The particle size of the titanium dioxide in the solder mask as well as the polymer refraction index may be tuned to optimize reflectivity. In one embodiment, the solder mask may be directly laminated onto the upper surface of the printed circuit board. In another embodiment, the solder mask may be a thermally curable coating or an ultraviolet light curable coating. The solder mask may have any desired thickness (e.g., 50 microns, greater than 50 microns, less than 100 microns, less than 50 microns, etc.).

Properties of printed circuit board 50 may also be optimized for high reflectivity. For example, glass fiber material or white polyimide polymer may form the core of printed circuit board 50. The reflectivity of the solder mask and printed circuit board may be the same or may be different (e.g., greater than 80%, greater than 50%, greater than 90%, greater than 92%, greater than 94%, between 85% and 95%, less than 90%, less than 99%, between 80% and 95%, etc.).

Thermally conductive fillers may also be added to printed circuit board 50 to tune the thermal conductivity of the printed circuit board.

Figure 12:
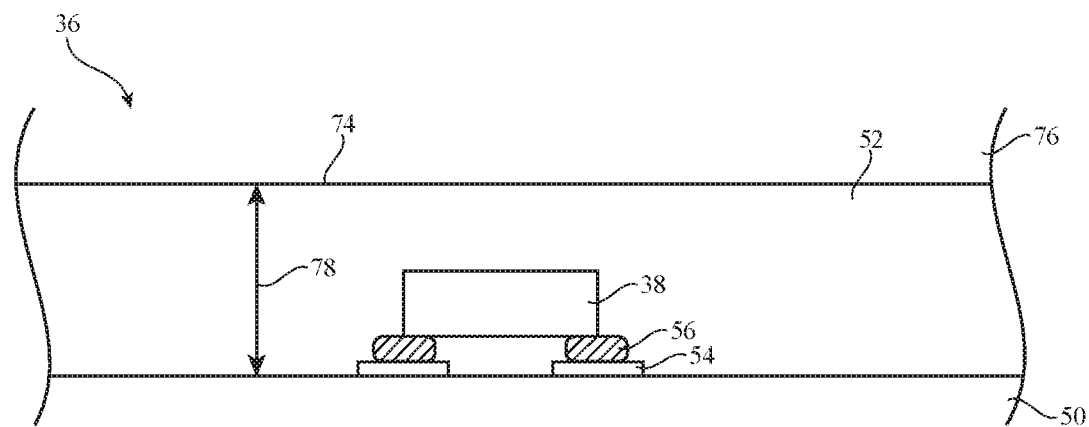
FIG. 12 is a cross-sectional side view of an illustrative light-emitting diode array having encapsulant with a planar upper surface over light-emitting diodes in accordance with an embodiment.

There are numerous possible embodiments for the encapsulant that encapsulates (e.g., conforms to) the light-emitting diodes on printed circuit board 50. FIG. 12 is a cross-sectional side view of an illustrative light-emitting diode array with encapsulant 52 that has a planar upper surface. As shown in FIG. 12, encapsulant 52 may have a planar upper surface 74 that extends over the light-emitting diode. The encapsulant 52 (sometimes referred to as a slab of encapsulant in this embodiment) provides additional structural integrity for light-emitting diode 38. Additionally, to reduce total internal reflection of light emitted from light-emitting diode 38 off of the interface between encapsulant 52 and adjacent material 76 (e.g., air), encapsulant 52 may have an index of refraction that is between the index of refraction of light-emitting diode 38 and material 76. For example, encapsulant 52 may have an index of refraction of between 1.2 and 1.5, between 1.3 and 1.4, less than 1.4, less than 1.5, greater than 1.1, greater than 1.2, greater than 1.3, about 1.35, etc. The slab of encapsulant 52 shown in FIG. 12 may cover all of the light-emitting diodes in light-emitting diode array 36. Encapsulant 52 may have any desired thickness 78 (e.g., between 0.1 and 0.4 millimeters, less than 0.5 millimeters, less than 0.3 millimeters, between 0.2 and 0.4 millimeters, between 0.15 and 0.25 millimeters, between 0.25 millimeters and 0.35 millimeters, about 0.2 millimeters, about 0.3 millimeters, etc.).

Figure 13:
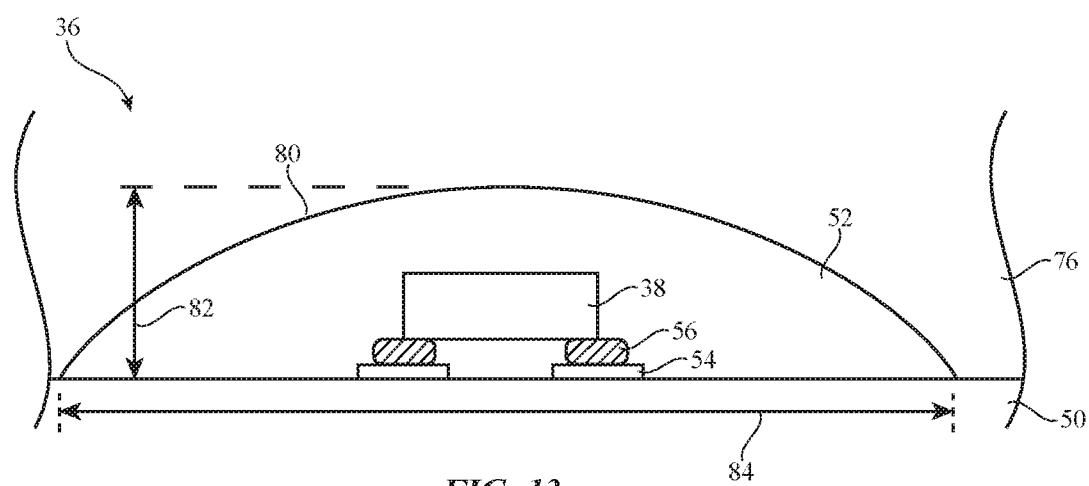
FIG. 13 is a cross-sectional side view of an illustrative light-emitting diode array having encapsulant with a curved upper surface over each light-emitting diode in accordance with an embodiment.

FIG. 13 is a cross-sectional side view of an illustrative light-emitting diode array with encapsulant 52 that has a curved upper surface. As shown in FIG. 13, encapsulant 52 may have a curved upper surface 80 (e.g., a convex upper surface). The encapsulant may form a dome shape over the light-emitting diode. In this embodiment, the encapsulant may be referred to as a droplet lens. The encapsulant 52 provides additional structural integrity for light-emitting diode 38. Additionally, to reduce total internal reflection of light emitted from light-emitting diode 38 off of the interface between encapsulant 52 and adjacent material 76 (e.g., air), encapsulant 52 may have an index of refraction that is between the index of refraction of light-emitting diode 38 and material 76. For example, encapsulant 52 may have an index of refraction of between 1.2 and 1.5, between 1.3 and 1.4, less than 1.4, less than 1.5, greater than 1.1, greater than 1.2, greater than 1.3, about 1.35, etc. Each light-emitting diode may have a corresponding encapsulant portion (e.g., one dome of encapsulant for each light-emitting diode). Encapsulant 52 may have any desired thickness 82 (e.g., between 0.1 and 0.4 millimeters, less than 0.5 millimeters, less than 0.3 millimeters, between 0.2 and 0.4 millimeters, between 0.15 and 0.25 millimeters, between 0.25 millimeters and 0.35 millimeters, about 0.2 millimeters, about 0.3 millimeters, etc.) and any desired width 84 (e.g., between 0.3 and 2.5 millimeters, between 0.3 and 0.7 millimeters, between 0.8 and 0.9 millimeters, greater than 0.5 millimeters, greater than 1.0 millimeters, greater than 2.0 millimeters, less than 2.0 millimeters etc.). The ratio of width to thickness may be greater than 5-to-1, greater than 3-to-1, between 4-to-1 and 6-to-1, less than 10-to-1, etc.

Figure 14:
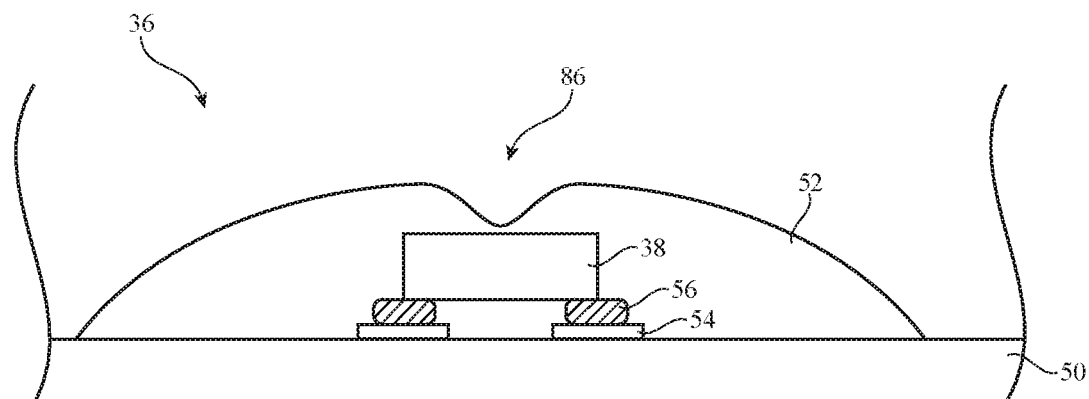
FIG. 14 is a cross-sectional side view of an illustrative light-emitting diode array having encapsulant with a curved upper surface and a recessed portion over each light-emitting diode in accordance with an embodiment.

FIG. 14 is a cross-sectional side view of an illustrative light-emitting diode array with encapsulant 52 that has a curved upper surface and a recess. The encapsulant in FIG. 14 is similar to the encapsulant of FIG. 13 (e.g., with a dome shape). However, in FIG. 14 encapsulant 52 additional has a recess 86 formed over light-emitting diode 38. Recess 86 may also be a referred to as a dip. Recess 86 may have any desired shape (e.g., a pyramid shape). Recess 86 may further increase uniformity compared to the embodiment of FIG. 13 (without the recess) by reducing the intensity of on-axis (e.g., zero order) light.

Figure 15:
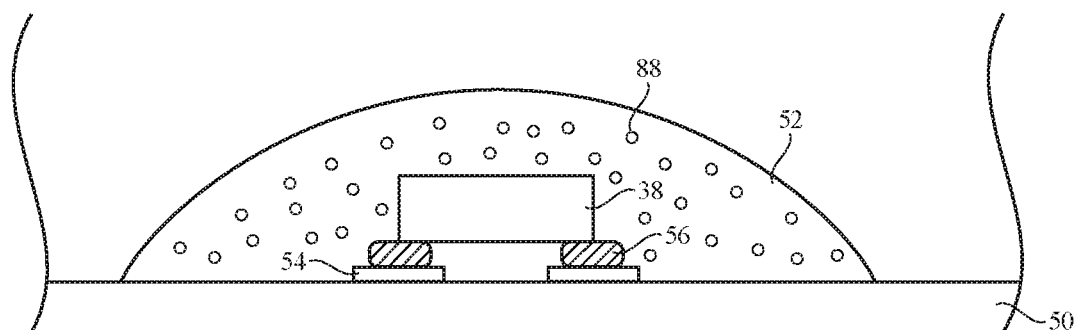
FIG. 15 is a cross-sectional side view of an illustrative light-emitting diode array having encapsulant with dopants evenly distributed throughout the encapsulant material in accordance with an embodiment.
Figure 16:
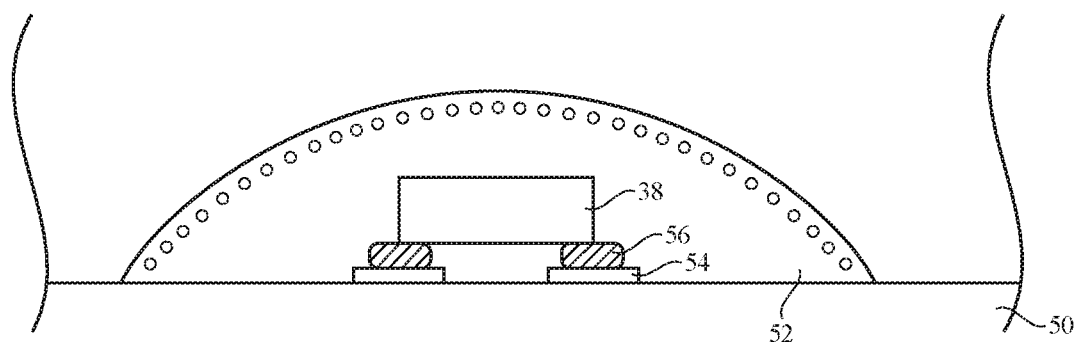
FIG. 16 is a cross-sectional side view of an illustrative light-emitting diode array having encapsulant with dopants at the upper surface of the encapsulant material in accordance with an embodiment.
Figure 17:
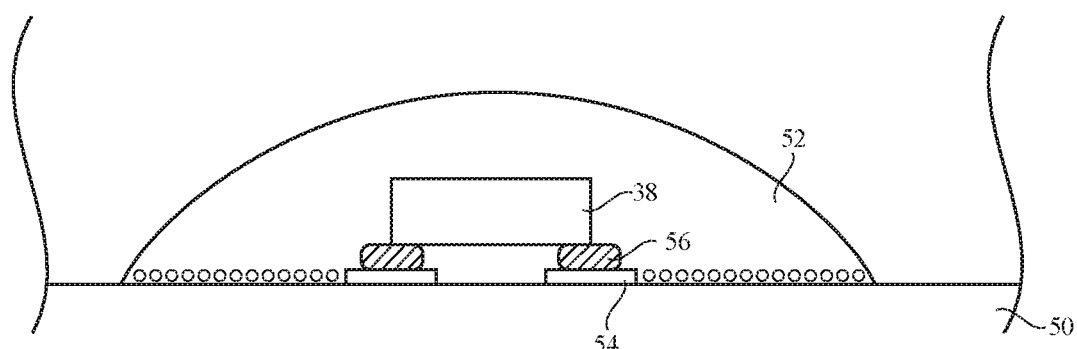
FIG. 17 is a cross-sectional side view of an illustrative light-emitting diode array having encapsulant with dopants at the lower surface of the encapsulant material in accordance with an embodiment.

FIGS. 15-17 show examples of a dopant being included in encapsulant 52. FIG. 15 is a cross-sectional side view showing a light-emitting diode 38 covered by encapsulant 52 that includes dopant 88. Dopant 88 (sometimes referred to as additive 88) may be a scattering dopant. The presence of dopant 88 may increase the light-emitting area of light-emitting diode 38. Without the scattering dopant, light emitted from light-emitting diode 38 will be concentrated directly over light-emitting diode 38. The scattering dopant, however, may cause light from light-emitting diode 38 to be spread throughout encapsulant 52. Therefore, the entire area of encapsulant 52 emits light from light-emitting diode 38. This spreading of light may work in combination with or replace light spreading layer 28 in FIG. 2, for example.

Any desired dopants may be used for dopant 88. For example, dopant 88 may include polymer nanoparticles, inorganic nanoparticles, voids (e.g., air bubbles), or any other desired dopant. Distribution of the dopants in encapsulation 52 can be controlled via buoyancy of the dopant in the encapsulation material (e.g., encapsulation resin). For example, FIG. 15 shows a neutral buoyancy example. Dopants 88 in FIG. 15 are therefore distributed evenly throughout encapsulation 52 (e.g., dopants may be suspended anywhere in the encapsulation material). FIG. 16 shows an example where dopants 88 have high buoyancy and therefore tend to be distributed along the upper surface of the encapsulant (e.g., because the dopants float to the top of the encapsulant). In contrast, FIG. 17 shows an example where dopants 88 have a low buoyancy and therefore tend to be distributed along the lower surface of the encapsulant (e.g., because the dopants sink to the bottom of the encapsulant).

Figure 18:
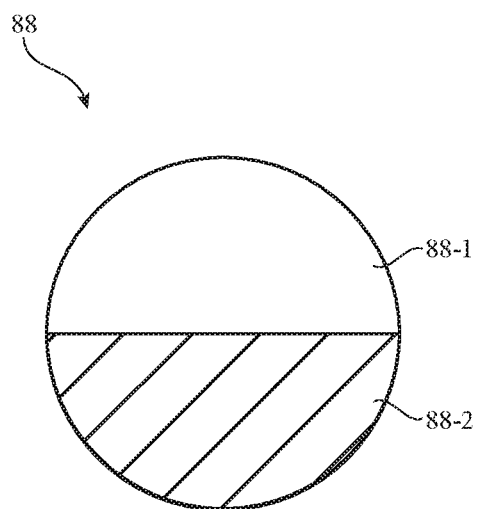
FIG. 18 is a cross-sectional side view of an illustrative dopant with portions having different densities in accordance with an embodiment.
Figure 19:
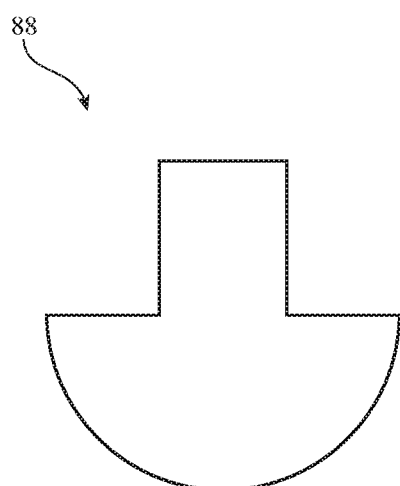
FIG. 19 is a cross-sectional side view of an illustrative dopant having a shape to control orientation of the dopant in encapsulant material in accordance with an embodiment.

The location of dopants 88 may be controlled if desired. For example, dopants may be placed directly on top of light-emitting diode 38. Dopants 88 may also be designed such that the orientation of dopants 88 in encapsulant 52 can be controlled. In one example, shown in FIG. 18, dopant 88 (e.g., a particular particle) may have two portions with two different densities. As shown in FIG. 18, dopant 88 may include portion 88-1 and portion 88-2. Portion 88-2 may have a different density (e.g., higher) than portion 88-1. In another example, shown in FIG. 19, the shape of dopant 88 may be designed to control the orientation of dopant 88. The shape shown in FIG. 19 (sometimes referred to as a mushroom shape) may allow control of the orientation of dopant 88 in encapsulant 52.

The aforementioned examples showing dopants 88 in a dome-shaped encapsulant region are merely illustrative. In general, any desired encapsulant (e.g., encapsulant with a planar upper surface as in FIG. 12 or a recessed portion as in FIG. 14) may include the dopants.

Figure 20:
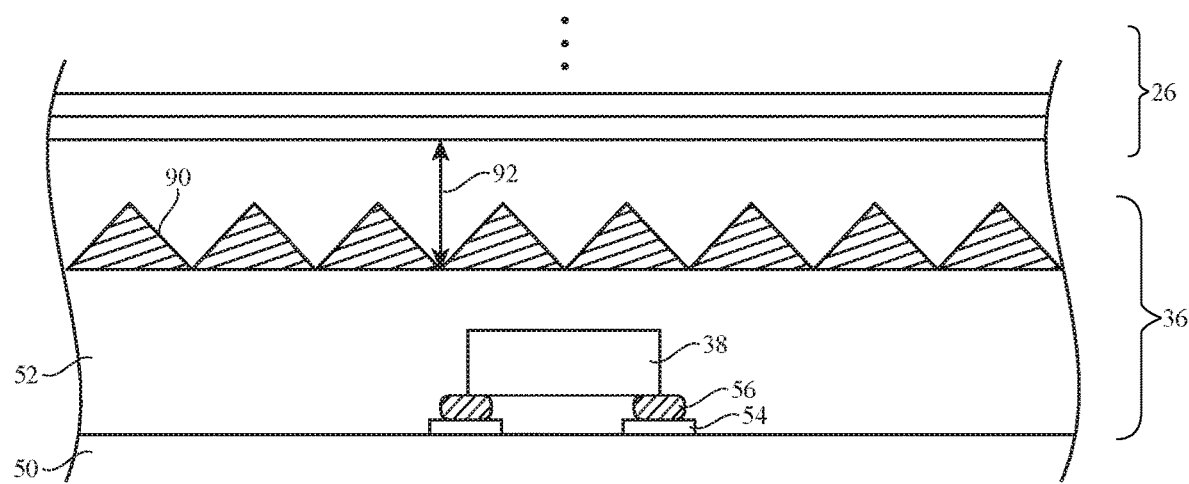
FIG. 20 is a cross-sectional side view of an illustrative backlight unit having a patterned layer formed on the encapsulant material in accordance with an embodiment.

FIG. 20 is a cross-sectional side view of an illustrative backlight unit showing how light-emitting diode array 36 may include a patterned layer 90 on encapsulation 52. Patterned layer 90 may help spread light from light-emitting diode 38 (e.g., working in combination with or replacing light spreading layer 28 in FIG. 2). Patterned layer 90 may also help maintain gap 92 (e.g., an air gap) between optical films 26 and encapsulant 52. Patterned layer 90 may be a separate film that is attached to an upper surface of encapsulant 52. Alternatively, patterned layer 90 may be formed from a patterned portion of the encapsulant material (e.g., patterned layer 90 may be part of encapsulant 52).

Figure 21:
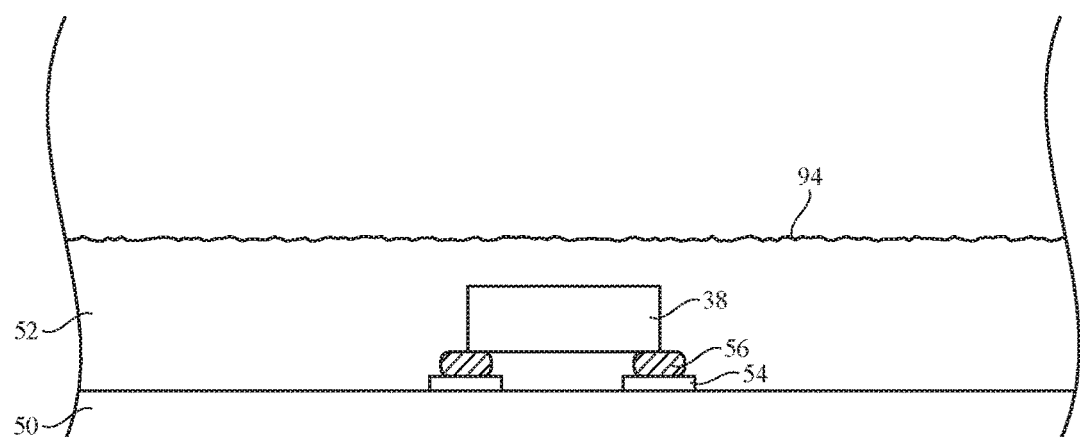
FIG. 21 is a cross-sectional side view of an illustrative light-emitting diode array having encapsulant with a textured upper surface over light-emitting diodes in accordance with an embodiment.

FIG. 21 is a cross-sectional side view of an illustrative backlight unit showing how light-emitting diode array 36 may include encapsulation 52 having a textured surface. As shown in FIG. 21, encapsulation 52 has a textured upper surface 94. Textured upper surface 94 may be generally planar (e.g., the encapsulation is formed as a slab). However, the upper surface may be rough (instead of smooth). The textured upper surface may prevent total internal reflection of light emitted from light-emitting diode 38, increasing efficiency. The texture of the upper surface may be random.

To increase the reflectivity of the printed circuit board in a backlight unit, a reflective layer may be used. For example, a reflective material may be laminated on the printed circuit board. However, care must be taken to ensure that the reflective material is not damaged during solder reflow. The reflective material may have a melting point less than or equal to that of the solder. Reflowing the solder may therefore melt (and damage) the reflective material.

To prevent damage of the reflective layer, the reflective layer may be laminated to the circuit board after solder reflow. Alternatively, the reflective layer may be attached to the printed circuit board before solder reflow. The solder mask may then be used to protect the reflective layer from damage during solder reflow. An arrangement of this type is shown in FIG. 22.

Figure 22:
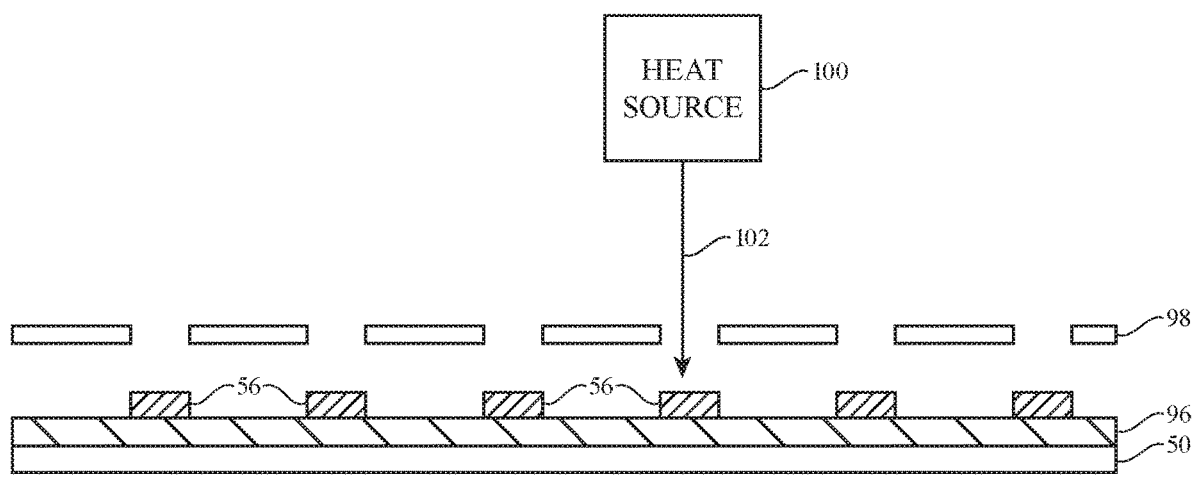
FIG. 22 is a cross-sectional side view showing a method for heating solder in a backlight unit in accordance with an embodiment.

As shown in FIG. 22, reflective layer 96 may be formed on printed circuit board 50 (e.g., on an upper surface of printed circuit board 50). The reflective layer may be formed from any desired material. The reflective layer may be formed from one or more layers. The reflective layer may have a high reflectance of light at the wavelength emitted by the light-emitting diodes. For example, if the light-emitting diodes emit blue light, reflective layer 96 may have a high reflectance (e.g., greater than 80%, greater than 90%, greater than 92%, greater than 94%, greater than 96%, less than 99%, etc.) of the blue light. Solder 56 may also be formed on printed circuit board 50 (e.g., on conductive pads on an upper surface of the printed circuit board that may not be covered by the reflective layer). Heat source 100 may be used to heat solder 56 for reflow. Heat source 100 may heat solder 56 by emitting energy (e.g., infrared light) through solder mask 98. Solder mask 98 may have openings that overlap solder 56. Portions of printed circuit board 50 that are not covered by solder 56 may be covered by solder mask 98. In this way, solder mask 98 may prevent reflective layer 96 from being damaged during heating of solder 56. Solder mask 98 may be formed from any material that is opaque or resistant to the energy (102) emitted by heat source 100. Heat source 100 may, for example, be a laser that emits infrared light.

Figure 23:
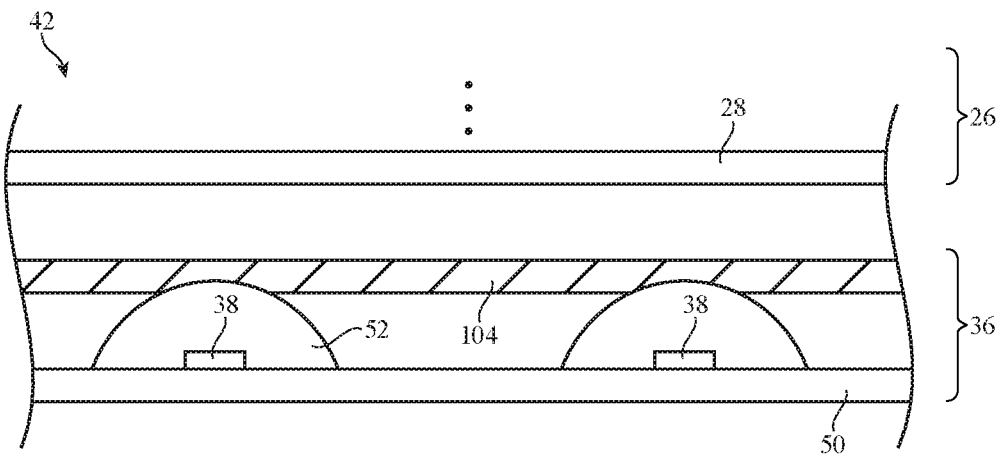
FIG. 23 is a cross-sectional side view of an illustrative backlight unit having a light spreading layer coupled to the encapsulant in accordance with an embodiment.
Figure 24:
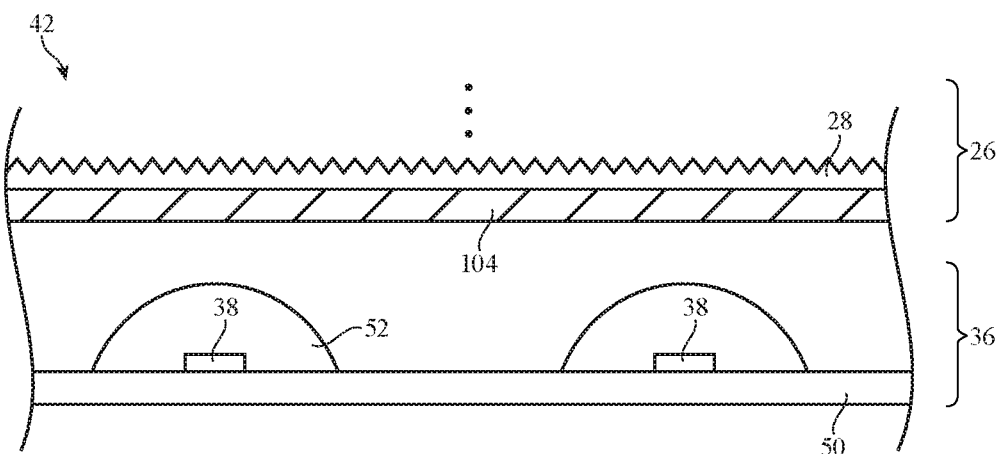
FIG. 24 is a cross-sectional side view of an illustrative backlight unit having a first light spreading layer below a second light spreading layer in accordance with an embodiment.
Figure 25:
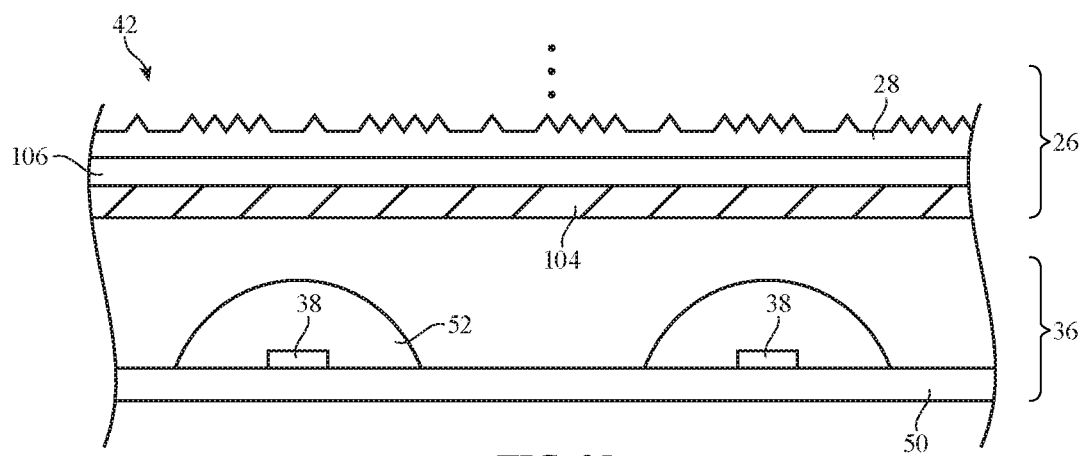
FIG. 25 is a cross-sectional side view of an illustrative backlight unit having a first light spreading layer below a second light spreading layer with an intervening wave guide layer in accordance with an embodiment.

In certain embodiments, backlight unit 42 may include a polarization grating that helps increase the point spread function (PSF) width of the light emitted by light-emitting diodes 38. Increasing the PSF width may reduce reliance on the reflectance of the printed circuit board for recycling. FIGS. 23-25 are cross-sectional side views of illustrative backlight units with a polarization grating layer (sometimes referred to as a diffractive layer, light spreading layer, polarization phase grating layer, polarization grating, or polarization phase grating). As shown in FIG. 23, backlight unit 42 includes light-emitting diodes 38 on printed circuit board 50 that are covered by encapsulation 52. The backlight unit may also have optical films 26 that include light spreading layer 28. However, the backlight unit may include additional light spreading layer 104. Polarization grating layer 104 (sometimes referred to as a diffractive layer, light spreading layer, polarization phase grating layer, polarization grating, or polarization phase grating) may split light received from light-emitting diodes 38 into two different polarizations. Light spreading layer 104 may reduce the on-axis intensity peak associated with the light-emitting diodes.

As shown in FIG. 23, light spreading layer 104 may be coupled to encapsulation 52 that covers the light-emitting diodes (e.g., light spreading layer 104 may directly contact encapsulation 52). This example is merely illustrative. In another example shown in FIG. 24, light spreading layer 104 is formed on a lower surface of light spreading layer 28. Light spreading layer 28 and light spreading layer 104 may be attached together in any desired manner. Light spreading layer 28 may have evenly patterned protrusions on an upper surface of the light spreading layer. In yet another embodiment, shown in FIG. 25, a wave guide layer 106 (sometimes referred to as a light guiding layer) may be interposed between light spreading layer 28 and light spreading layer 104. Light spreading layer 28 may have protrusions on an upper surface of the light spreading layer that are unevenly spaced (e.g., statistically spaced to control wave guide spreading) in this embodiment.

Figure 26:
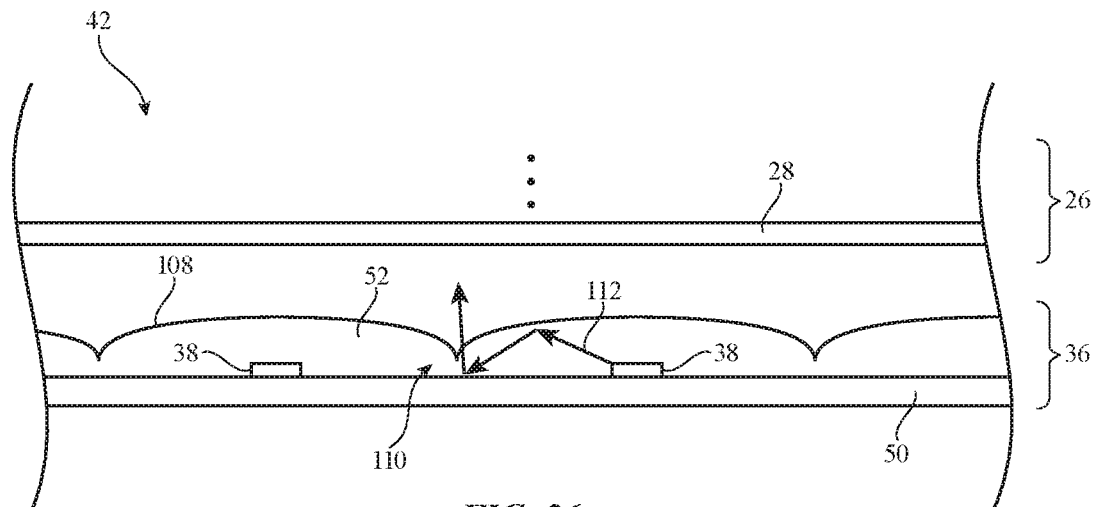
FIG. 26 is a cross-sectional side view of an illustrative backlight unit having encapsulant with respective portions having a parabolic upper surface over each light-emitting diode in accordance with an embodiment.
Figure 27:
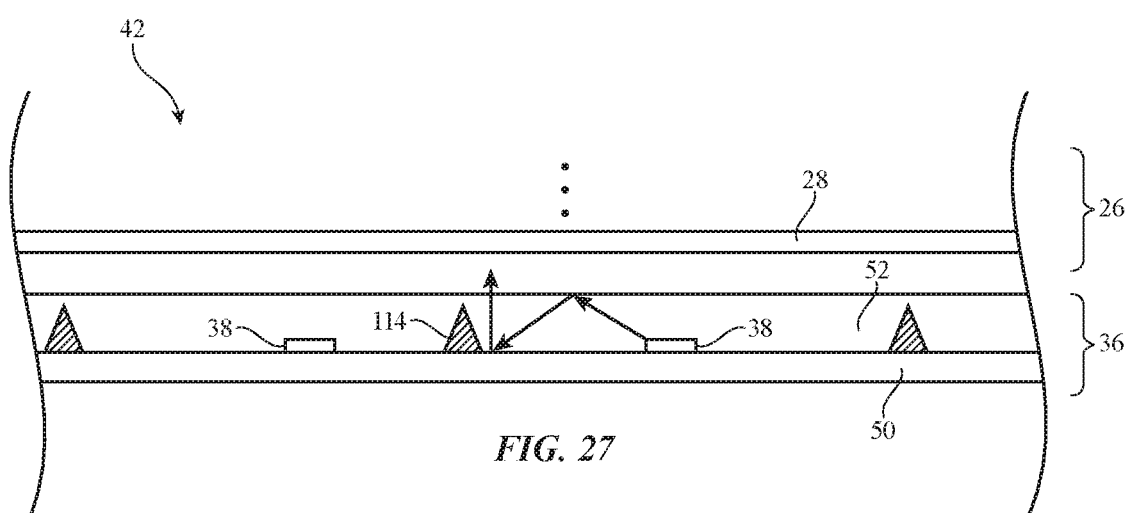
FIG. 27 is a cross-sectional side view of an illustrative backlight unit having light leakage promotion structures between each light-emitting diode in accordance with an embodiment.

Other structures may be used to increase the point spread function (PSF) width of the light emitted by light-emitting diodes 38. FIGS. 26 and 27 are cross-sectional side views of backlight units that include structures to increase the point spread function (PSF) width of the light emitted by light-emitting diodes 38 in combination with a highly reflective printed circuit board. As shown in FIG. 26, light-emitting diodes 38 may be positioned on printed circuit board 50 and may be covered by encapsulant 52. Each light-emitting diode 38 may be covered by a respective portion of encapsulant that has a respective parabolic upper surface 108. The parabolic upper surfaces of adjacent encapsulant portions may meet at vertex 110. This portion may be referred to as a dimpled or recessed portion of encapsulant 52.

Light 112 emitted from light-emitting diodes 38 may be reflected towards vertex 110 by total internal reflection (TIR). When light 112 reaches vertex 110 (sometimes referred to as light leakage promotion structure 110), the light may be more likely to exit encapsulant 52 in the direction of the viewer. In this way, light from the light-emitting diodes may be directed to and emitted from the area between adjacent light-emitting diodes (thereby increasing the PSF width). This type of arrangement relies on the light reflecting off of printed circuit board 50 (e.g., light is emitted from the light-emitting diode, reflects off of the parabolic upper surface of the encapsulant due to total internal reflection, and then reflects off of the upper surface of the printed circuit board). Therefore, if the reflectance of the printed circuit board is low, the efficiency of a backlight unit with the arrangement of FIG. 26 may be low. The arrangement of FIG. 26 may therefore be suited to embodiments where the printed circuit board has a high reflectance (e.g., greater than 90%, greater than 94%, greater than 96%, etc.).

In another embodiment, shown in FIG. 27, light-emitting diodes 38 are again positioned on printed circuit board 50 and may be covered by encapsulant 52. In this embodiment, the light-emitting diodes are covered by encapsulant with a planar upper surface (e.g., a slab of encapsulant). A light leakage promotion structure 114 may be interposed between each light-emitting diode. Light leakage promotion structure 114 in FIG. 27 may be formed from an opaque white structure. In another embodiment, light leakage promotion structure 114 may be an air gap (sometimes referred to as a void) in encapsulant 52.

Light emitted from light-emitting diodes 38 may be reflected towards light leakage promotion structure 114 by total internal reflection (TIR). When light reaches light leakage promotion structure 114, the light may be more likely to exit encapsulant 52 in the direction of the viewer. In this way, light from the light-emitting diodes may be directed to and emitted from the area between adjacent light-emitting diodes (thereby increasing the PSF width). This type of arrangement relies on the light reflecting off of printed circuit board 50 (e.g., light is emitted from the light-emitting diode, reflects off of the upper surface of the encapsulant due to total internal reflection, and then reflects off of the upper surface of the printed circuit board). The arrangement of FIG. 27 may therefore be suited to embodiments where the printed circuit board has a high reflectance (e.g., greater than 90%, greater than 94%, greater than 96%, etc.).

Figure 28:
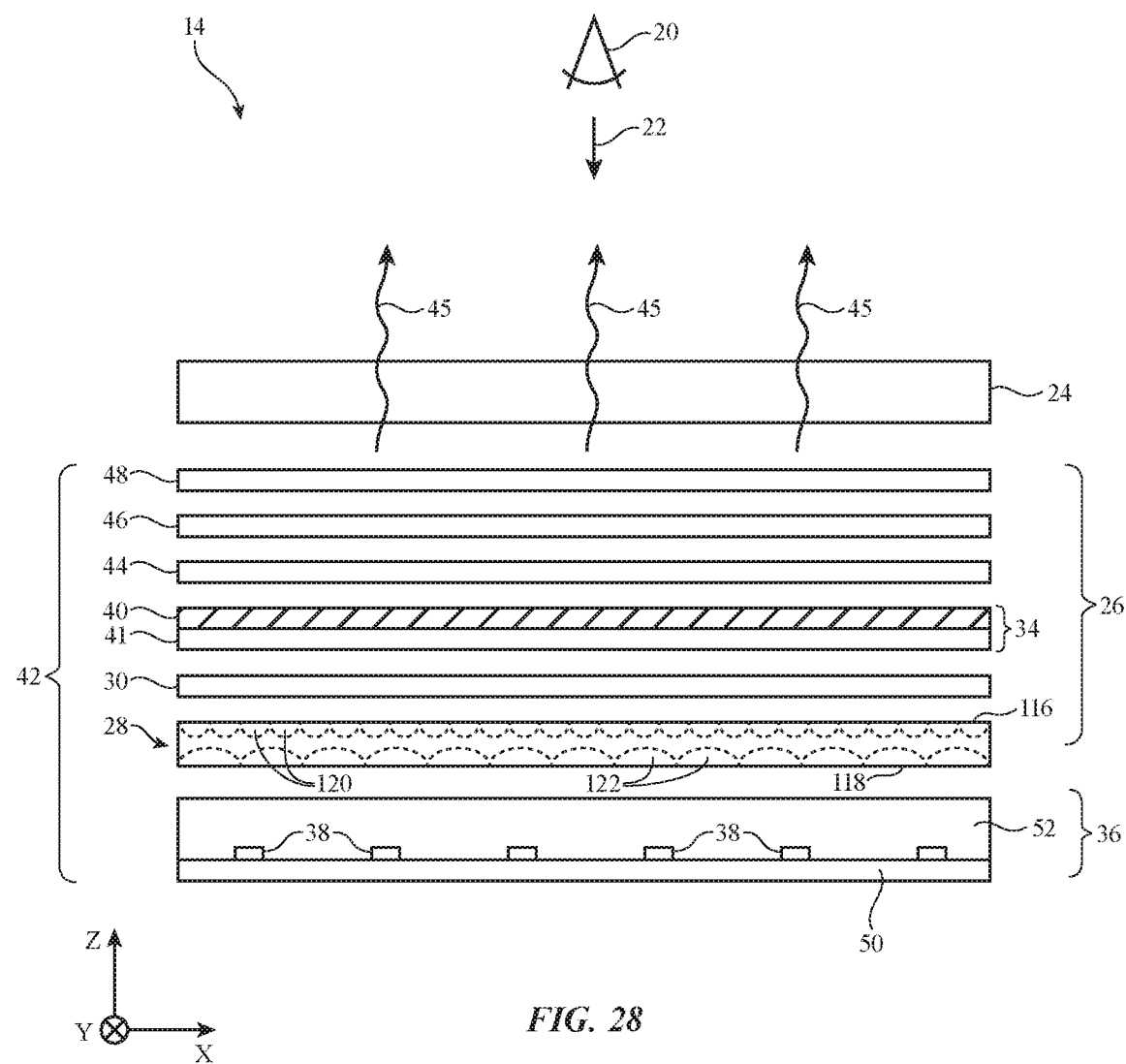
FIG. 28 is a cross-sectional side view of an illustrative display having a light spreading layer with microlenses on the upper surface and the lower surface of the light spreading layer in accordance with an embodiment.

There are many possible ways for light spreading layer 28 (shown in FIG. 2, for example) to spread light. FIG. 28 is a cross-sectional side view of an illustrative display with a light spreading layer that has microlens structures on both the upper surface and lower surface. As shown in FIG. 28, light spreading layer 28 has an upper surface 116 and a lower surface 118. Upper surface 116 has a plurality of microlenses 120 that are formed from recesses in the upper surface of the light spreading layer. Microlenses 120 may be formed from spherically shaped recesses or recesses of any other desired shape in upper surface 116. Lower surface 118 also has a plurality of microlenses 122 that are formed from recesses in the lower surface of the light spreading layer. Microlenses 122 may be formed from spherically shaped recesses or recesses of any other desired shape in lower surface 118. Microlenses 122 may be larger than microlenses 120 (as shown in FIG. 28). However, this example is merely illustrative and microlenses 122 may also be the same size or smaller than microlenses 120. Additionally, each microlens in microlens array 120 may have the same size or a different size, and each microlens in microlens array 122 may have the same size or a different size.

Figure 29:
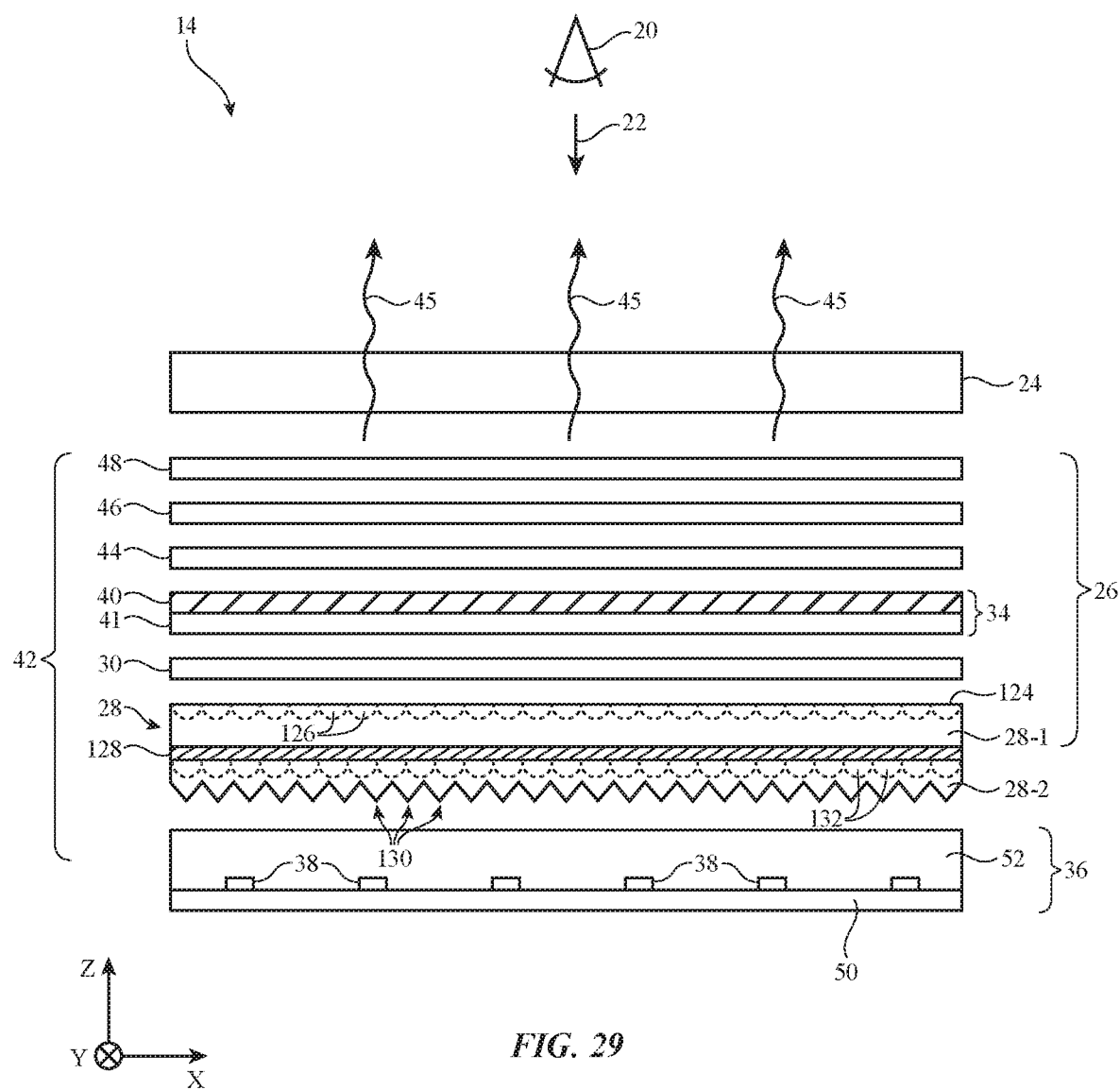
FIG. 29 is a cross-sectional side view of an illustrative display having two light spreading layers that are rotated relative to each other in accordance with an embodiment.

Another arrangement for light spreading layer 28 is shown in FIG. 29. As shown in FIG. 29, the light spreading layer may include two films (layers). In the example of FIG. 29, light spreading layer 28-1 is positioned above light spreading layer 28-2. Light spreading layer 28-1 and light spreading layer 28-2 may be attached using adhesive 128 (e.g., pressure sensitive adhesive), for example. Adhesive 128 may have diffusive properties if desired. Alternatively, light spreading layers 28-1 and 28-2 may be laminated together to form an integral film.

As shown in FIG. 29, light spreading layer 28-2 has an upper surface with microlenses 132. Microlenses 132 may be formed from a plurality of recesses in the upper surface of light spreading layer 28-2. Light spreading layer 28-2 may also include a plurality of protrusions 130. Protrusions 130 may protrude towards the light-emitting diodes. Protrusions 130 may be elongated protrusions (sometimes referred to as ridges) that extend along a longitudinal axis across the layer (e.g., parallel to the Y-axis in FIG. 29). Light spreading layer 28-1 may be the same as light spreading layer 28-2, except for being rotated 90° relative to light spreading layer 28-2. For example, light spreading layer 28-1 also has a plurality of protrusions that extend along a longitudinal axis across the layer. However, the protrusions of light spreading layer 28-1 may extend parallel to the X-axis (perpendicular to the protrusions of light spreading layer 28-2). Light spreading layer 28-1 also includes microlenses 126. Microlenses 126 may be formed from a plurality of recesses in the upper surface 124 of light spreading layer 28-1.

Light emitted from light-emitting diodes 38 will be spread relative to a first axis (e.g., from a point source to two points) upon reaching light-spreading layer 28-2. Microlenses 132 may reduce total internal reflection to promote light passing to light spreading layer 28-1. Light spreading layer 28-1 will spread the incoming light relative to a second axis (e.g., from the two points to four points) that is perpendicular to the first axis (because the protrusions of layer 28-1 are perpendicular to the protrusions of layer 28-2). Microlenses 126 may reduce total internal reflection to promote leakage of light out of layer 28-1 towards layer 30. Layers 28-1 and 28-2 may each have any desired thickness (e.g., between 20 and 30 microns, between 20 and 25 microns, less than 50 microns, less than 25 microns, about 22 microns, greater than 15 microns, less than 100 microns, etc.). The thickness of layers 28-1 and 28-2 may be the same.

Figure 30:
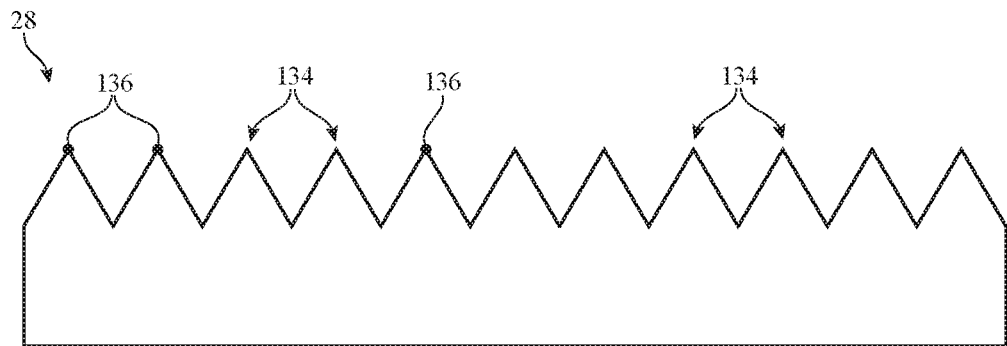
FIG. 30 is a cross-sectional side view of an illustrative light spreading layer having protrusions in accordance with an embodiment.
Figure 31:
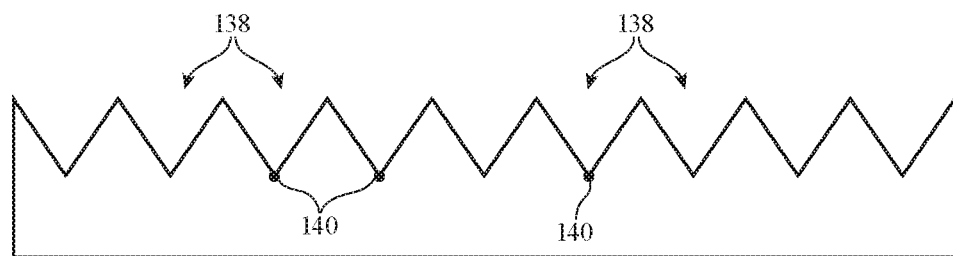
FIG. 31 is a cross-sectional side view of an illustrative light spreading layer having recesses in accordance with an embodiment.
Figure 32:
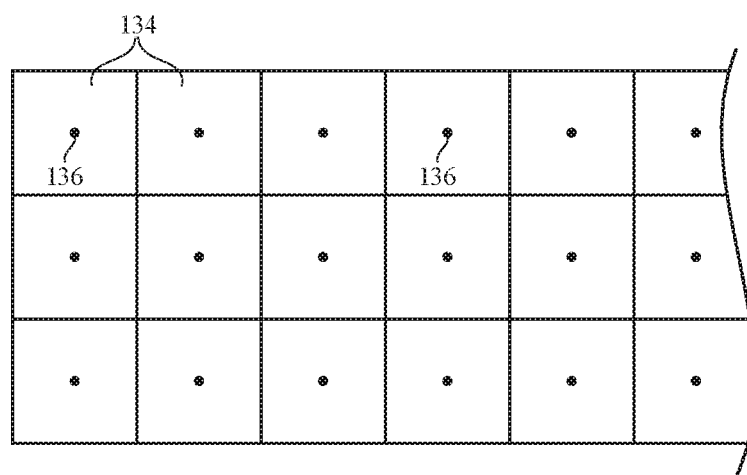
FIG. 32 is a top view of an illustrative light spreading layer having protrusions or recesses in accordance with an embodiment.

The example of light spreading layer 28 having elongated protrusions that extend along a longitudinal axis (and that split an incoming point light source into two points) is merely illustrative. If desired, light spreading layer 28 may instead include an array of protrusions or recesses. Each protrusion may split an incoming point light source into three or more points. FIG. 30 is a cross-sectional side view of a light spreading layer 28 that includes protrusions 134. Protrusions 134 may have any desired shape. For example, the protrusions may have a pyramidal shape (e.g., with a square base and four triangular faces that meet at vertex 136) or a triangular pyramidal shape (e.g., with a triangular base and three triangular faces that meet at vertex 136). The pyramidal protrusions may split a point light source into four points, whereas the triangular pyramidal protrusions may split a point light source into three points. In another embodiment, shown in FIG. 31, light spreading layer 28 may include a plurality of recesses 138. Recesses 138 may have any desired shape. For example, the recesses may have a pyramidal shape (e.g., with a square base and four triangular faces that meet at vertex 140) or a triangular pyramidal shape (e.g., with a triangular base and three triangular faces that meet at vertex 140). The pyramidal recesses may split a point light source into four points, whereas the triangular pyramidal recesses may split a point light source into three points. FIG. 32 is a top view of light spreading layer 28 showing how protrusions 134 (or recesses 138) may be arranged in an array. The protrusions and/or recesses may have any desired shapes and may be arranged in any desired type of array.

Figure 33:
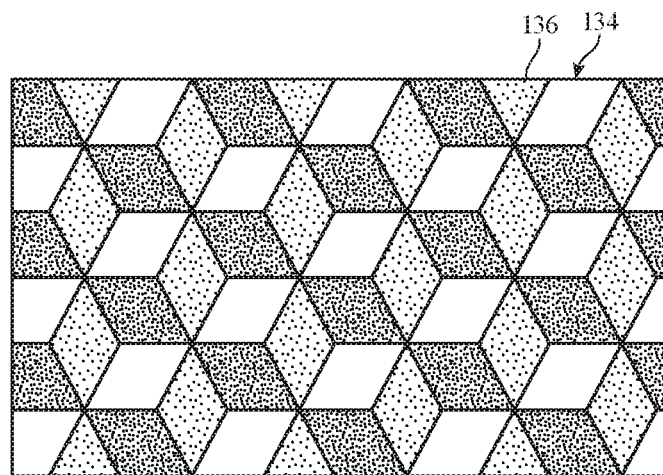
FIGS. 33 and 34 are top views of illustrative light spreading layers having protrusions formed by partial-cube structures in accordance with an embodiment.
Figure 34:
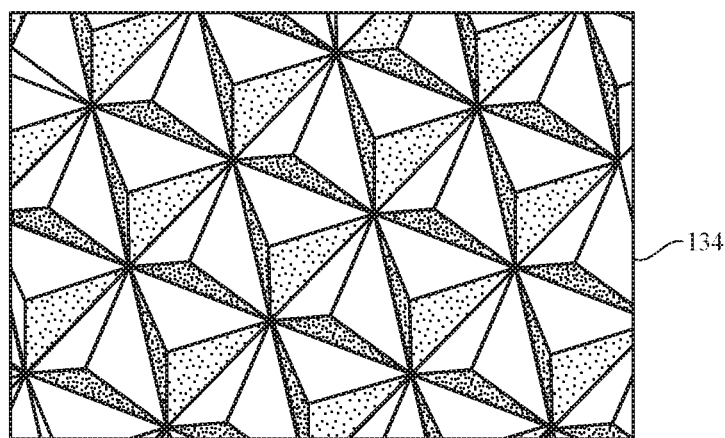

FIG. 33 is a top view of a light spreading layer with protrusions 134 formed from partial-cube structures (sometimes referred to as corner-cubes). As shown, each protrusion (or recess) may be formed by three square faces (e.g., a corner cube) that meet at a vertex 136. In FIG. 34, each protrusion 134 is formed from two partial-cube structures that are off-set from each other. Each protrusion 134 in FIG. 34 therefore has six faces (and splits an incoming point light source into six points).

Figure 35:
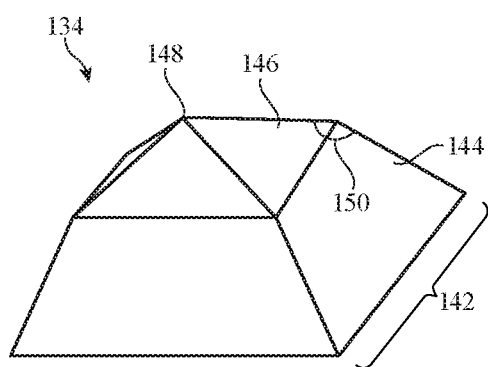
FIG. 35 is a perspective view of an illustrative protrusion for a light spreading layer that is in the shape of a tapered pyramid in accordance with an embodiment.

In yet another embodiment shown in FIG. 35, protrusion 134 may be formed from a tapered pyramid structure. As shown in FIG. 35, the protrusion may have four faces 142 that meet at vertex 148. Each face may have a lower portion 144 and an upper portion 146 that are at an angle 150 relative to each other. Angle 150 may be selected to optimize the light spreading functionality of the light spreading layer. Two films with any of the light spreading features shown in FIGS. 30-35 may be laminated together if desired (e.g., a first film with protrusions on an upper surface may be laminated to a second film with protrusions on a lower surface).

Figure 36:
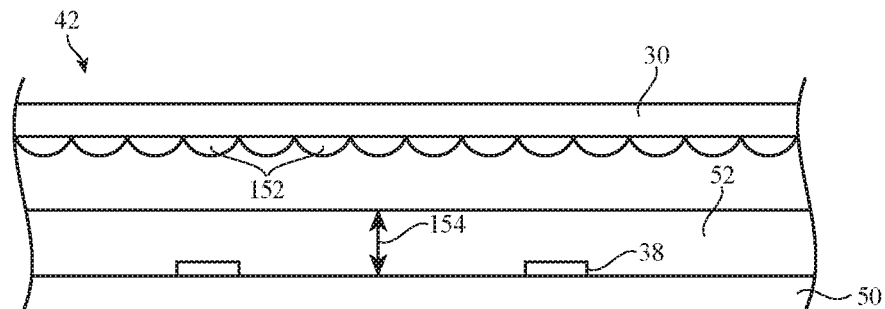
FIG. 36 is a cross-sectional side view of an illustrative backlight unit having microlenses on a lower surface of a partial reflective layer and an encapsulant with a planar upper surface over the light-emitting diodes in accordance with an embodiment.

Additional embodiments for spreading light from light-emitting diodes 38 are shown in FIG. 36-39. FIG. 36 is a cross-sectional side view of an illustrative backlight unit with a microlens array formed on a lower surface of partially reflective layer 30. Microlenses 152 may protrude from the lower surface of partially reflective layer 30. The microlenses may help spread light received from light-emitting diodes 38. Microlenses 152 may have an associated focal length (f). The thickness 154 of encapsulant 52 may be a function of the focal length (e.g., $t=n \times f$ where t is thickness 154 and n is the refractive index of the encapsulant material).

Figure 37:
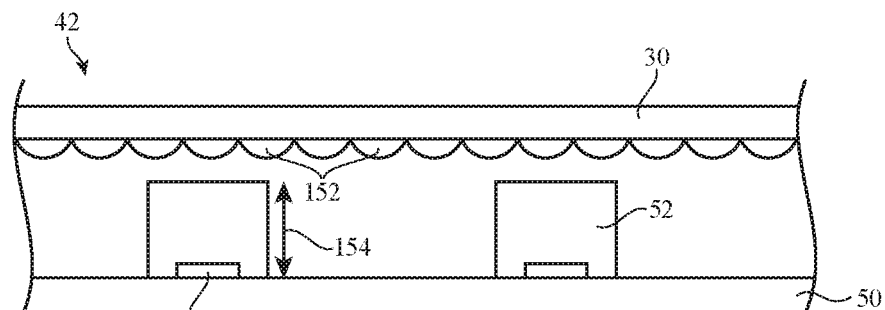
FIG. 37 is a cross-sectional side view of an illustrative backlight unit having microlenses on a lower surface of a partial reflective layer and encapsulant portions with planar upper surfaces over each light-emitting diode in accordance with an embodiment.

FIG. 37 shows an arrangement similar to that of FIG. 36. However, in FIG. 36 encapsulant 52 is formed across all of the light-emitting diodes in the array (e.g., encapsulant slab). In FIG. 37, each light-emitting diode has a respective portion of encapsulant 52. In FIG. 37, the thickness 154 of each encapsulant portion may still be selected based on the focal length of microlenses 152 and the refractive index of the encapsulant material.

Figure 38:
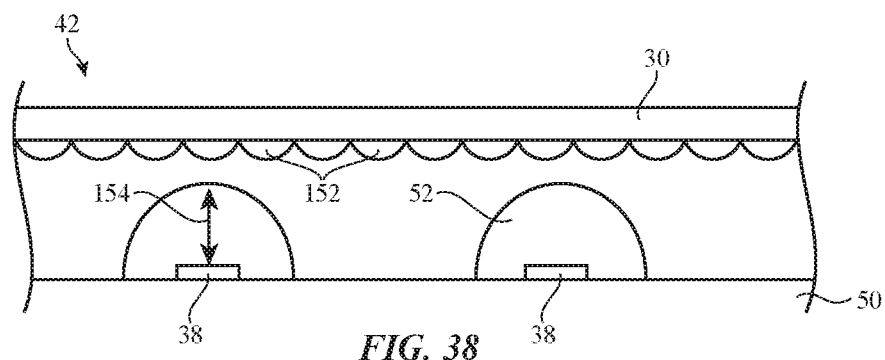
FIG. 38 is a cross-sectional side view of an illustrative backlight unit having microlenses on a lower surface of a partial reflective layer and encapsulant portions with curved upper surfaces over each light-emitting diode in accordance with an embodiment.

FIG. 38 shows yet another embodiment with microlenses 152 on the lower surface of partially reflective layer 30. In FIG. 38, each light-emitting diode may be covered by an encapsulant portion 52 having a curved upper surface (instead of a planar upper surface as in FIG. 37). In FIG. 38, the thickness 154 of each encapsulant portion may be selected based on the focal length of microlenses 152 (e.g., $t=f$ where t is thickness 154 and f is the focal length of microlenses 152).

Figure 39:
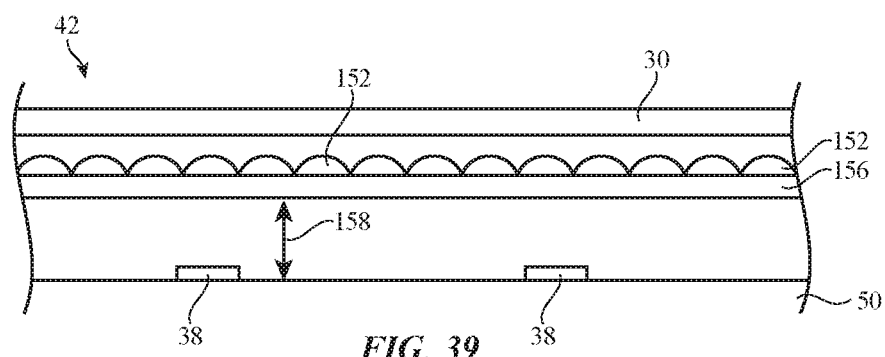
FIG. 39 is a cross-sectional side view of an illustrative backlight unit having microlenses on a substrate that is separated from the light-emitting diodes by an air-gap in accordance with an embodiment.

The example in FIGS. 36-38 of microlenses 152 being formed on a lower surface of partially reflective layer 30 is merely illustrative. Microlenses 152 may be formed in other locations in the display if desired. FIG. 39 shows an embodiment where microlenses 152 are formed on substrate 156 (separate from partially reflective layer 30). There may be an air gap 158 between light-emitting diodes 38 and the substrate 156 for microlenses 152.

In the embodiments shown in FIGS. 36-39, light spreading layer 28 is omitted (because microlenses 152 spread the light from the light-emitting diodes). However, this is merely illustrative. If desired, light spreading layer 28 may be included in any of the embodiments of FIGS. 36-39 (and spread light in combination with microlenses 152).

Figure 40:
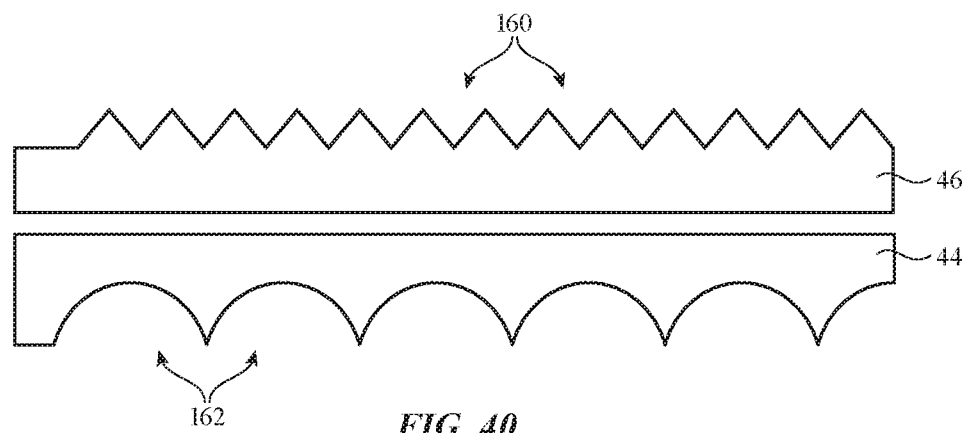
FIG. 40 is a cross-sectional side view of an illustrative separately formed backlight enhancement film and collimating layer in accordance with an embodiment.
Figure 41:
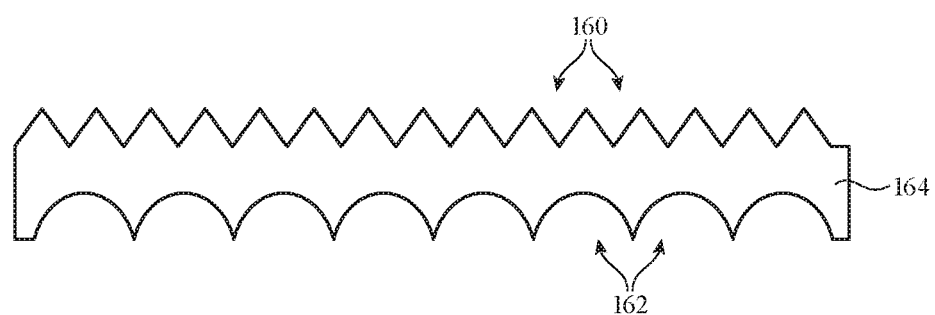
FIG. 41 is a cross-sectional side view of an illustrative optical film that serves as both a backlight enhancement film and a collimating layer in accordance with an embodiment.

FIG. 2 showed an example where backlight unit 42 includes a brightness enhancement film 46 and a collimating layer 44. Examples of these layers are again shown in FIG. 40. As shown in FIG. 40, brightness enhancement film 46 may include protrusions 160 on an upper surface of the film. Collimating layer 44 may include an array of microlenses 162 on a lower surface of the film. To reduce the number of layers in backlight unit 42, brightness enhancement film 46 and collimating layer 44 may be combined into a single film. FIG. 41 is a cross-sectional side view of an illustrative optical layer 164 having protrusions 160 on an upper surface (serving the function of the brightness enhancement film) and microlenses 162 on a lower surface (serving the function of the collimating layer).

Figure 42:
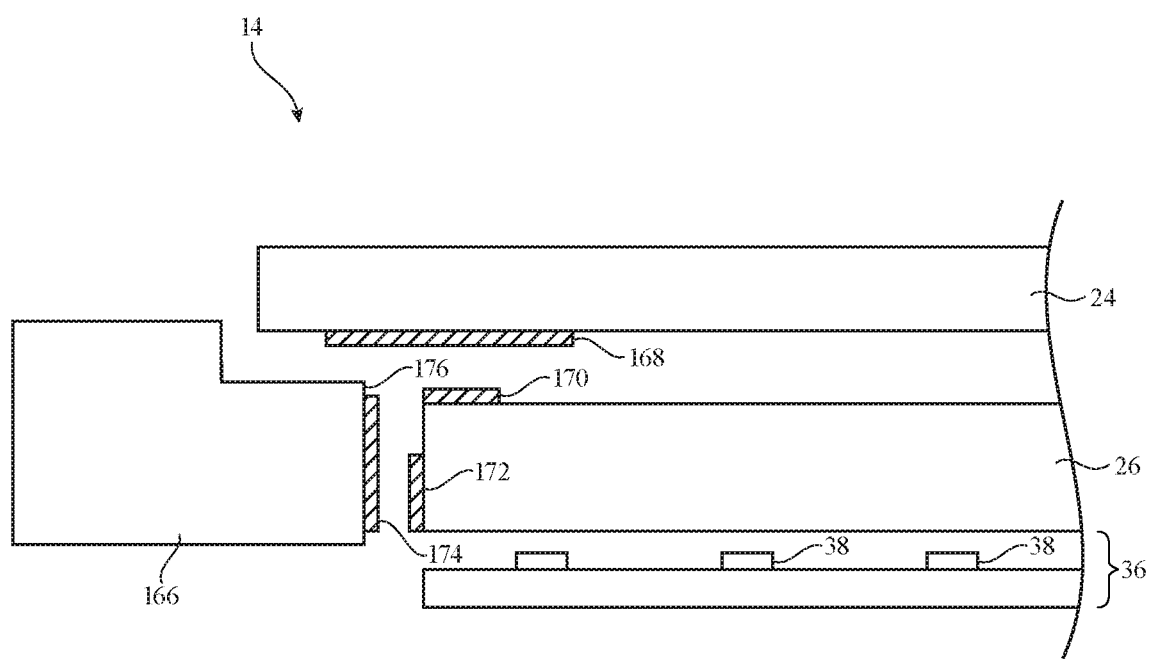
FIG. 42 is a cross-sectional side view of an illustrative display having edge coatings in accordance with an embodiment.

Light leaking from the edge of optical films 26 may cause the edge of the display to have an undesirable blue tint (due to the pixel array 24 receiving an excess of blue light from light-emitting diodes 38). To mitigate this problem, one or more coatings may be included in the edge of the display. As shown in FIG. 42, display 14 may include a coating 168 on a lower layer of pixel array 24. The display may include a chassis 166 (e.g., a plastic chassis sometimes referred to as a p-chassis) that supports one or more other layers in display 14. One or more surfaces of the chassis (e.g., an edge surface 176) is coated by coating 174. An upper surface of the optical layers is coated with coating 170. An edge surface of the optical layers is coated with coating 172. Coatings 168, 170, 172, and 174 (which are all in the edge of the display) may be formed from a black material, a gray material, a yellow material, or a phosphor material. The black material, gray material, and yellow material may adjust or eliminate reflectance of blue light (thereby reducing the excess blue light in the edge of the display). The phosphor material may convert blue light to white light (thereby reducing the excess blue light in the edge of the display).

In some displays (e.g., as shown in FIG. 3), the light-emitting diodes for the display may be arranged in a grid. The light-emitting diodes may be arranged in evenly spaced rows and columns that extend along the entire display. This type of arrangement may be referred to as a square grid or a rectangular grid. However, having the light-emitting diodes arranged in a rectangular grid may result in visible artifacts (sometimes referred to as grid mura) when operating the display. To mitigate visible artifacts associated with the positioning of the light-emitting diodes in a grid, the positions of the light-emitting diodes may be dithered. In other words, the actual position of each light-emitting diode may be adjusted relative to the rectangular-grid position for that light-emitting diode.

Figure 43:
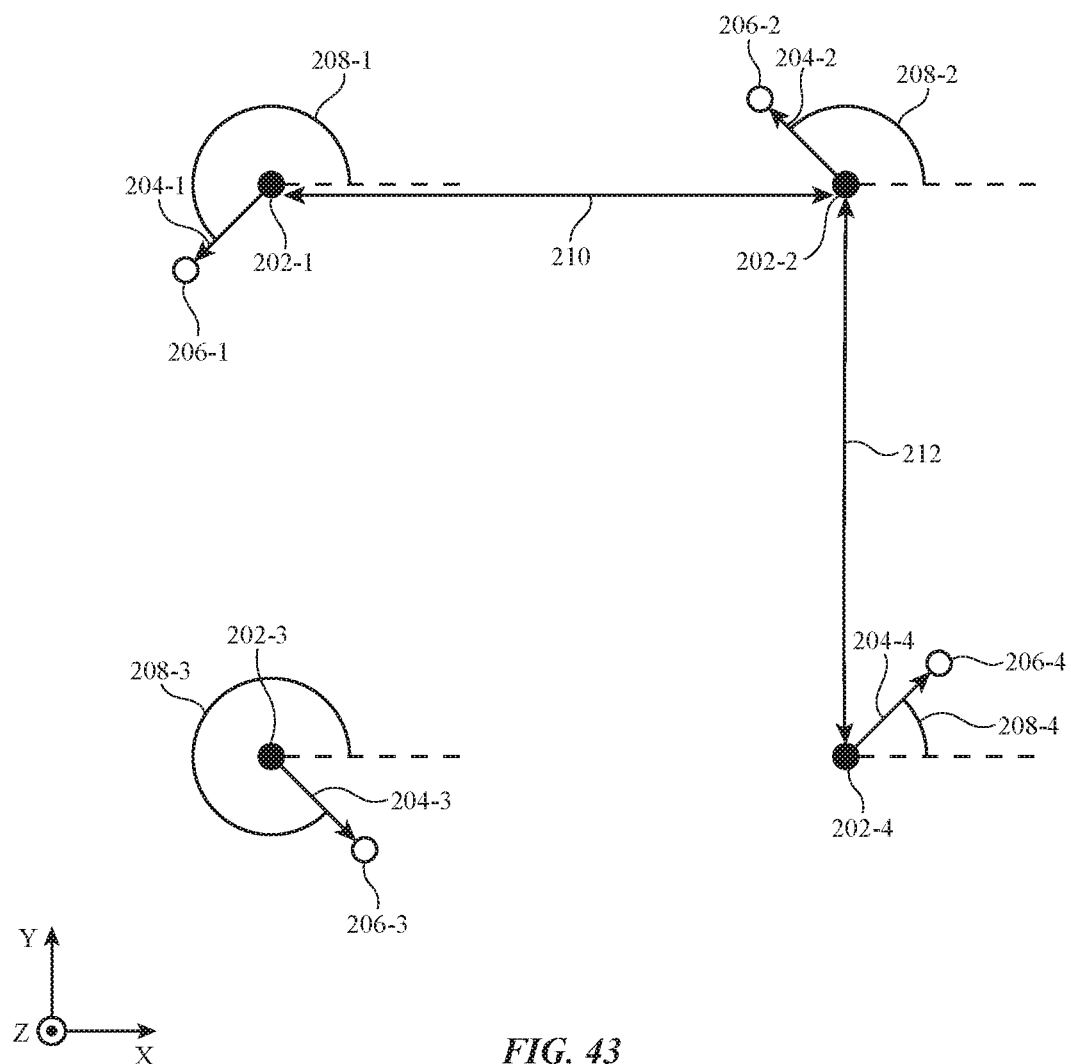
FIG. 43 is a diagram showing how the positions of light-emitting diodes may be dithered to improve performance of the display in accordance with an embodiment.

FIG. 43 is a diagram showing how the positions of light-emitting diodes may be dithered to improve performance of the display. FIG. 43 shows rectangular grid positions 202-1, 202-2, 202-3, and 202-4. The rectangular grid positions may be positions associated with a regularly spaced grid that extends across the entire display (e.g., each rectangular grid position is part of a row of rectangular grid positions that extends across the entire display and each rectangular grid position is part of a column of rectangular grid positions that extends across the entire display). Light-emitting diodes may optionally be mounted at each rectangular grid position (similar to as in FIG. 3). Alternatively, to mitigate visible artifacts caused by this arrangement the light-emitting diodes may be offset from the rectangular grid positions as shown in FIG. 43.

In FIG. 43, each light-emitting diode may be positioned at a position that is offset relative to its corresponding rectangular grid position. For example, a light-emitting diode may be located at position 206-1 that is moved by offset distance 204-1 away from rectangular grid position 202-1. Offset distance 204-1 is at an angle 208-1 relative to the X-axis. Similarly, a light-emitting diode may be located at position 206-2 that is moved by offset distance 204-2 away from rectangular grid position 202-2. Offset distance 204-2 is at an angle 208-2 relative to the X-axis. A light-emitting diode may be located at position 206-3 that is moved by offset distance 204-3 away from rectangular grid position 202-3. Offset distance 204-3 is at an angle 208-3 relative to the X-axis. A light-emitting diode may be located at position 206-4 that is moved by offset distance 204-4 away from rectangular grid position 202-4. Offset distance 204-4 is at an angle 208-4 relative to the X-axis.

Each offset distance may have any desired magnitude. In one example, the offset distance may be greater than 0, may be shorter than a distance between adjacent rectangular grid positions in the same row (e.g., distance 210), and may be shorter than a distance between adjacent rectangular grid positions in the same column (e.g., distance 212). Each offset distance may be the same (e.g., offset distances 204-1, 204-2, 204-3, and 204-4 may all have the same magnitude) or one or more of the offset distances may be different (e.g., offset distances 204-1, 204-2, 204-3, and 204-4 may all have different magnitudes). In some cases, the offset distances may be random or pseudo-random.

Similarly, each offset distance may be moved away from its corresponding rectangular grid position by any desired angle. In one illustrative example, each angle is 90 degrees offset from the angle associated with the light-emitting diode in an adjacent row or column. As shown in FIG. 43, angle 204-4 may be a given angle (e.g., θ) between 0 degrees and 90 degrees, angle 204-2 may be offset by 90 degrees relative to the given angle (e.g., angle 204-2=θ+90 degrees), angle 204-1 may be offset by 180 degrees relative to the given angle (e.g., angle 204-1=θ+180 degrees), and angle 204-3 may be offset by 270 degrees relative to the given angle (e.g., angle 204-3=θ+270 degrees). Effectively, the 2×2 group of light-emitting diodes is rotated relative to the rectangular grid positions. Each 2×2 group of light-emitting diodes within the display may be independently rotated. The example of using a 2×2 group is merely illustrative. Light-emitting diode groups of any desired size may be rotated across the display.

Each light-emitting diode position 206 may be offset from its rectangular grid position 202 by an angle that is 180 degrees different than the light-emitting diode position of a diagonally adjacent light-emitting diode. Each light-emitting diode position 206 may be offset from its rectangular grid position 202 by an angle that is 90 degrees different than the light-emitting diode position of a horizontally adjacent light-emitting diode (e.g., a light-emitting diode in the same row). Each light-emitting diode position 206 may be offset from its rectangular grid position 202 by an angle that is 90 degrees different than the light-emitting diode position of a vertically adjacent light-emitting diode (e.g., a light-emitting diode in the same column).

This example is merely illustrative. In general, the location of each light-emitting diode and the rectangular grid position associated with that light-emitting diode may be offset by any desired angle. In some cases, the angles may be random or pseudo-random.

Figure 44:
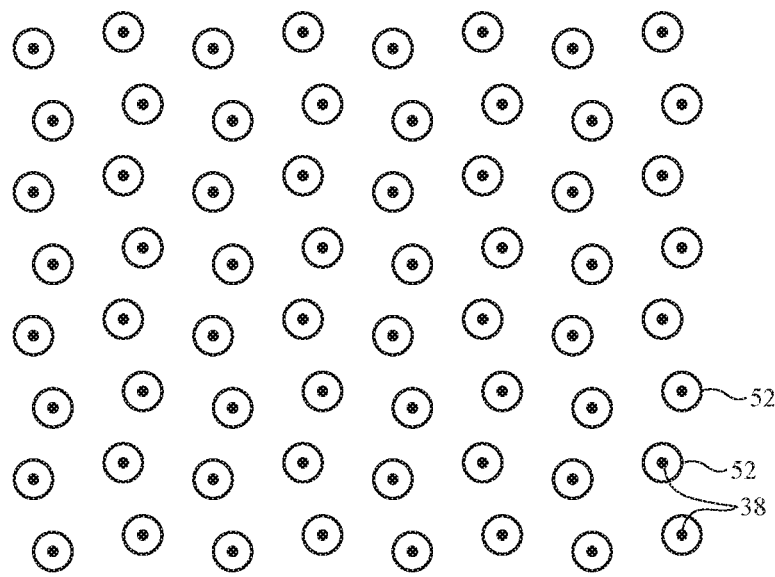
FIG. 44 is a top view of an illustrative display having light-emitting diodes arranged in positions that are dithered in accordance with an embodiment.

FIG. 44 is a top view of an illustrative display with illustrative light-emitting diodes that are dithered. As shown, each light-emitting diode 38 is dithered with respect to a rectangular grid position (as shown in FIG. 43). In particular, each 2×2 group of light-emitting diodes are rotated relative to their rectangular grid positions. Therefore, the light-emitting diodes are not arranged in uniform rows and columns that extend across the entire display. Dithering the location of the light-emitting diodes in this way mitigates grid mura associated with the light-emitting diodes in a uniform rectangular grid.

Each light-emitting diode is covered by a respective encapsulant 52 (e.g., a slab or dome of encapsulant). In FIG. 44, each light-emitting diode is centered underneath its respective encapsulant layer 52. However, this example is merely illustrative. If desired, each light-emitting diode may be offset relative to the center of the overlying encapsulant layer.

Figure 45:
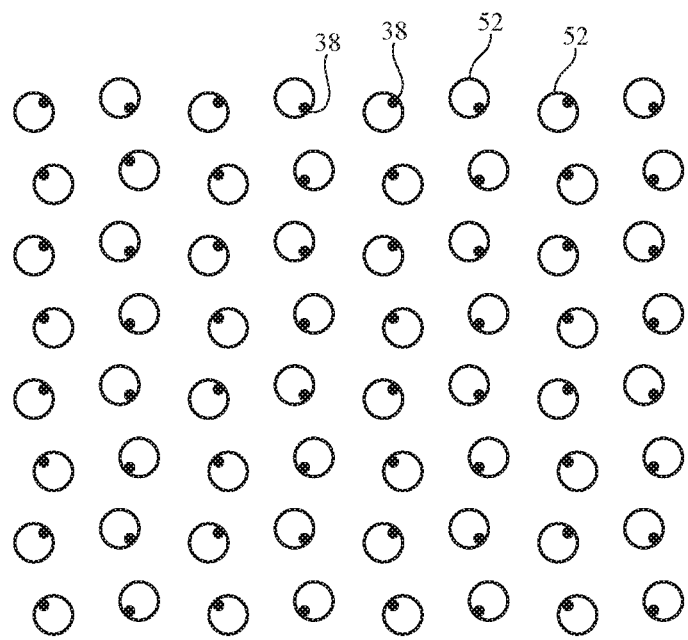
FIG. 45 is a top view of an illustrative display where each light-emitting diode is covered by encapsulant that is offset relative to the light-emitting diode in accordance with an embodiment.

FIG. 45 is a top view of an illustrative display with light-emitting diodes that are offset relative to the center of the overlying encapsulant layer. Similar to how the positions of the light-emitting diodes are shifted relative to the rectangular grid positions in FIG. 43, the positions of the encapsulant are shifted relative to the positions of the light-emitting diodes in FIG. 45. As shown, each encapsulant layer 52 has a center that is shifted relative to the light-emitting diode 38. The shifting of the center of the encapsulant layer in FIG. 45 may follow the same offset scheme as shown in FIGS. 43 and 44 in connection with the position of the light-emitting diodes.

When the encapsulant layers are shifted relative to the light-emitting diodes, the light-emitting diodes may be arranged in a rectangular grid (as shown in FIG. 45). Alternatively, the positions of the light-emitting diodes may be dithered (as in FIG. 44) and the encapsulant layers may be offset relative to the light-emitting diode positions.

Figure 46:
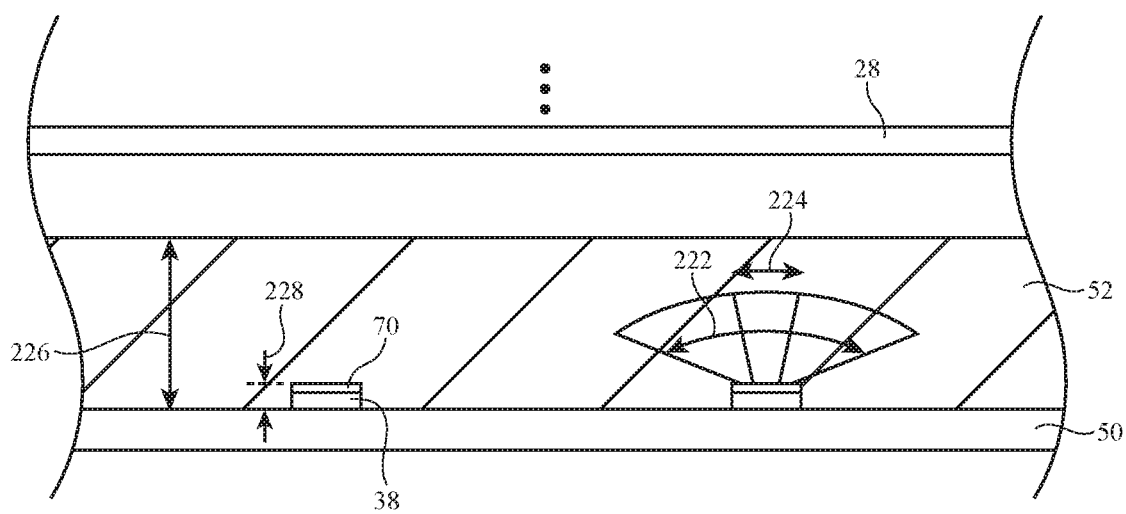
FIG. 46 is a cross-sectional side view of an illustrative display showing how a slab of encapsulant with a tuned thickness may be formed over light-emitting diodes in accordance with an embodiment.

In another embodiment, shown in FIG. 46, light-emitting diodes 38 are positioned on printed circuit board 50 and may be covered by encapsulant 52. In this embodiment, the light-emitting diodes include a reflector layer 70 (e.g., a distributed Bragg-reflector) to help direct emitted light from light-emitting diode 38 sideways. This can reduce the on-axis intensity of light emitted by light-emitting diode 38. As shown in FIG. 46, due to the presence of reflector layer 70, the cone of light emitted by each light-emitting diode 38 may have a width 222. The width of the cone of high intensity light may be relatively narrow (e.g., width 224), which helps promote uniform light distribution across the display.

FIG. 46 also shows how each light-emitting diode is covered by encapsulant with a planar upper surface (e.g., a slab of encapsulant). In one arrangement, the thickness 226 of the encapsulant may be selected based on the thickness 228 of the light-emitting diode 38. In other words, a ratio between the thickness of the encapsulant and the thickness of the light-emitting diode may be selected to optimize display performance. The ratio between the thickness of the encapsulant and the thickness of the light-emitting diode may be used to help spread light evenly across the display. For example, if thickness 226 of encapsulant 52 is larger, the emission area associated with light-emitting diode 38 will tend be larger. If thickness 226 of encapsulant 52 is smaller, the emission area associated with light-emitting diode 38 will tend to be smaller. The thickness may therefore be selected such that the emission areas of adjacent light-emitting diodes meet at an interface without overlapping and without having an emission-free gap between them. The ratio of thickness 226 to thickness 228 may be between 3:1 and 10:1, between 2:1 and 20:1, between 5:1 and 15:1, less than 10:1, more than 10:1, less than 5:1, more than 5:1, more than 20:1, less than 8:1, etc.

In cases where encapsulant is formed as a slab over the light-emitting diodes (as in FIG. 46), the slab may be susceptible to warping. The light-emitting diodes generate heat that may heat the encapsulant slab. The encapsulant slab may expand and contract with temperature variations associated with operation of the light-emitting diodes due to thermal expansion. To maintain the structural integrity of the encapsulant slab, a support structure may be incorporated into the display.

Figure 47:
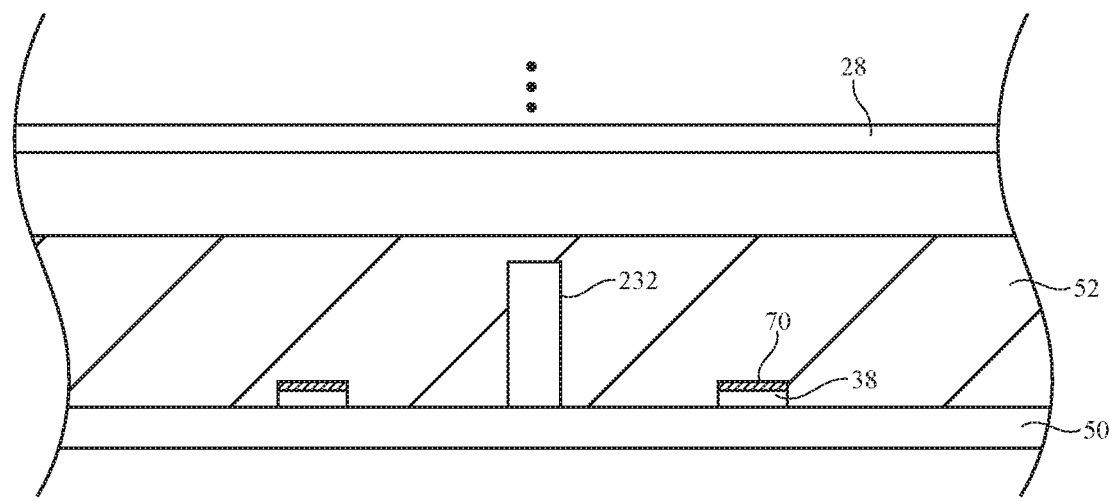
FIG. 47 is a cross-sectional side view of an illustrative display showing how support structures may be included to preserve the structural integrity of a slab of encapsulant in accordance with an embodiment.

FIG. 47 is a cross-sectional side view of an illustrative display that includes a support structure 232 to maintain the structural integrity of encapsulant slab 52. Support structure 232 may have a low coefficient of thermal expansion (e.g., lower than the encapsulant) to ensure it is not adversely affected by temperature changes associated with operation of the light-emitting diodes. Support structure 232 may not affect the light emitted from the light-emitting diodes. In other words, support structure 232 may be formed from a transparent material that has the same index-of-refraction as the surrounding encapsulant slab 52 (e.g., support structure 232 is index-matched to slab 52). Support structure 232 will therefore not influence the path or intensity of the light emitted from light-emitting diodes 38. Support structure 232 may therefore have any desired shape (since the shape will not affect the optical performance of the display).

Figure 48:
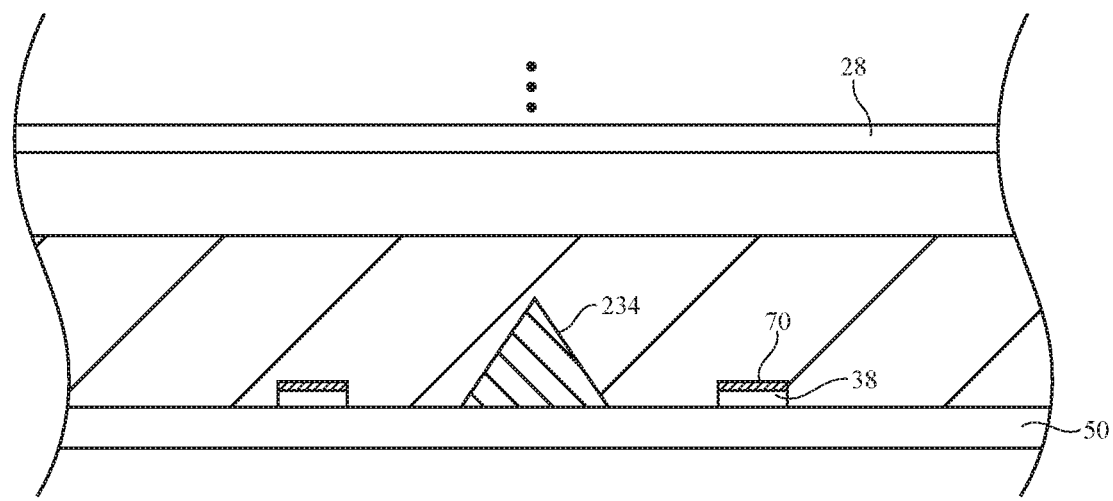
FIG. 48 is a cross-sectional side view of an illustrative display having support structures that both preserve the structural integrity of a slab of encapsulant and serve as light-leakage promotion structures in accordance with an embodiment.

FIG. 48 is a cross-sectional side view of an illustrative display with a support structure that also serves as a light-leakage promotion structure. Similar to as in FIG. 47, support structure 234 in FIG. 48 may be used to maintain the structural integrity of encapsulant slab 52. Support structure 234 may have a low coefficient of thermal expansion (e.g., lower than the encapsulant) to ensure it is not adversely affected by temperature changes associated with operation of the light-emitting diodes. However, unlike in FIG. 47, the support structure 234 in FIG. 48 may reflect light from light-emitting diodes 38. Support structure 234 may be formed from a reflective material (e.g., a white structure, metal structure, etc.). Alternatively, support structure 234 may be formed from a transparent material that has an index-of-refraction that is different than the index-of-refraction of encapsulant layer 52. The index-of-refraction difference may be sufficient for total internal reflection (TIR) to occur when light from light-emitting diodes 238 reaches support structure 234. Support structure 234 may have a shape that is selected to redirect light upwards towards the viewer. The example of FIG. 48 of support structure 234 having a triangular cross-sectional shape is merely illustrative. Support structure 234 may have a pyramidal shape, cone shape, dome shape, etc.

Figure 49:
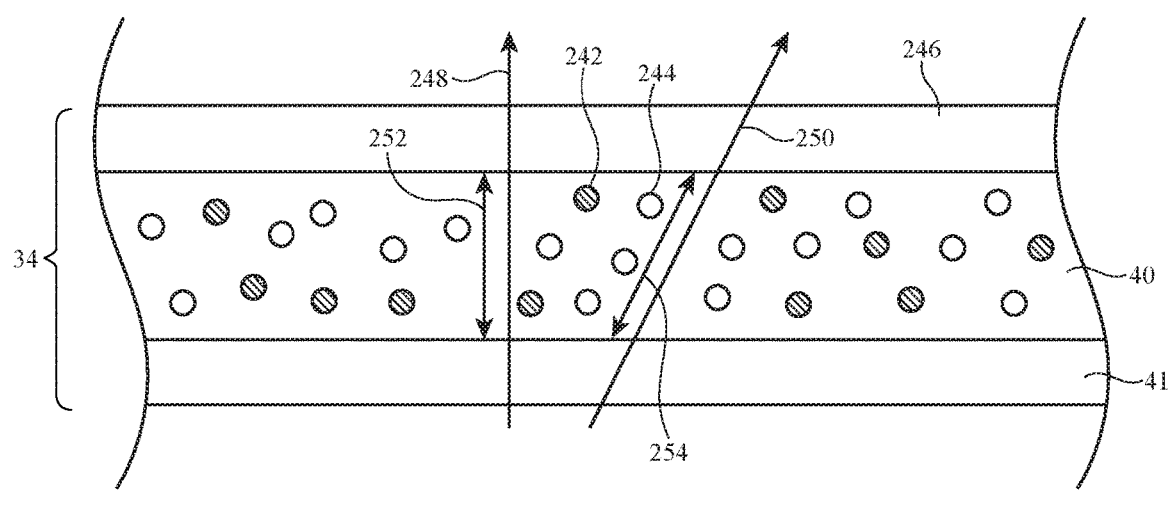
FIG. 49 is a cross-sectional side view of an illustrative color conversion layer having a phosphor layer in accordance with an embodiment.

As previously mentioned, display 14 may include a color conversion layer 34. Color conversion layer 34 may convert the light from LEDs 38 from a first color to a different color. For example, when the LEDs emit blue light, color conversion layer 34 may include a phosphor layer 40 (e.g., a layer of white phosphor material or other photoluminescent material) that converts blue light into white light. If desired, other photoluminescent materials may be used to convert blue light to light of different colors (e.g., red light, green light, white light, etc.). For example, one layer 34 may have a phosphor layer 40 that includes quantum dots that convert blue light into red and green light (e.g., to produce white backlight illumination that includes, red, green, and blue components). FIG. 49 is a cross-sectional side view of an illustrative color conversion layer.

As shown in FIG. 49, color conversion layer 34 includes phosphor layer 40 with red quantum dots 242 and green quantum dots 244. The red quantum dots may convert blue light from the light-emitting diodes of the display into red light whereas the green quantum dots may convert blue light from the light-emitting diodes of the display into green light. A partially reflective layer 41 (sometimes referred to as a dichroic layer or dichroic filter layer) may optionally be included in the color conversion layer. The dichroic filter 41 may reflect all red and green light and partially reflect blue light, for example. An additional film such as film 246 may also be included in the color conversion layer. The additional film 246 (sometimes referred to as an optical film) may be formed from a polymer material (e.g., polyethylene terephthalate).

As blue light from the light-emitting diodes passes through phosphor layer, the blue light is converted to red and green light by quantum dots 242 and 244. The longer the distance the blue light travels through phosphor layer 40, the more likely it is that the blue light will be converted to red and green light. This may result in undesirable display performance. As shown in FIG. 49, on-axis light 248 (e.g., light that is parallel or close to parallel to the Z-axis) has an optical path with a length 252 in phosphor layer 40. In contrast, off-axis light 250 (e.g., light at a relatively large angle relative to the Z-axis) has an optical path with a length 254 in phosphor layer 40. As shown, the optical path 254 is longer than optical path 252. Accordingly, the off-axis light will include more red and green light and less blue light (because more blue light is converted while in the phosphor layer for a longer time) than the on-axis light. This may lead to non-uniformity in the display.

There are numerous ways to prevent non-uniformity in the display due to a narrower angular profile of blue light than red and green light. In one illustrative embodiment, shown in FIG. 50A, reflective structures may be introduced in the phosphor layer to reduce the length of the optical path of off-axis light. Structures 256 (sometimes referred to as microstructures or path-length-reducing structures) may not include any quantum dots 242 or 244. Structures 256 may be formed from any desired reflective materials. Structures 256 may have a reflectance that is greater than 40%, may have a reflectance that is greater than 30%, may have a reflectance that is greater than 50%, or may have any other desired reflectance. Structures 256 reduce the optical pathlength of off-axis light through phosphor layer 40, making the on-axis and off-axis light more uniform. The smallest dimension of each structure 256 may be less than 100 microns, less than 10 microns, less than 5 microns, less than 2 microns, less than 1 micron, less than 0.1 micron, greater than 0.1 micron, greater than 1 micron, etc. The thickness 249 of structures 256 may be less than the thickness of phosphor layer 40 (as in FIG. 50A) or may be equal to the thickness of phosphor layer 40. A distance 247 may separate structures 256. Distance 247 may be greater than 15 microns, greater than 10 microns, greater than 5 microns, greater than 25 microns, less than 50 microns, or any other desired distance.

Figure 50A:
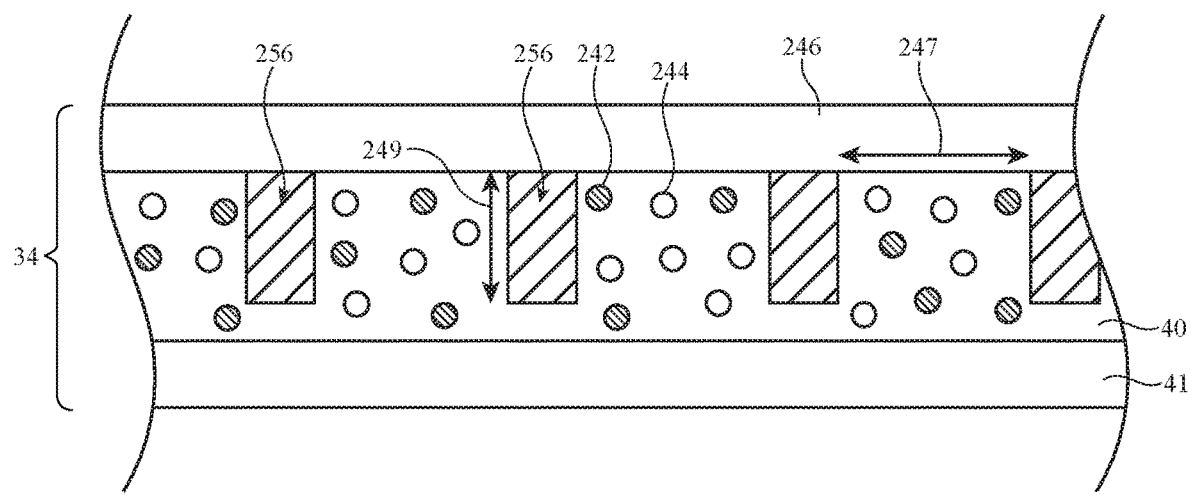
FIGS. 50A-50C are cross-sectional side views of an illustrative color conversion layer having a phosphor layer with reflective structures in accordance with an embodiment.

In FIG. 50A, reflective structures 256 are formed in phosphor layer 40. In other words, the reflective structures 256 are embedded in and in direct contact with phosphor layer 40. However, this example is merely illustrative. Reflective structures 256 may instead be immersed in a transparent coating layer and then laminated to the phosphor layer, as shown in FIG. 50B.

Figure 50B:
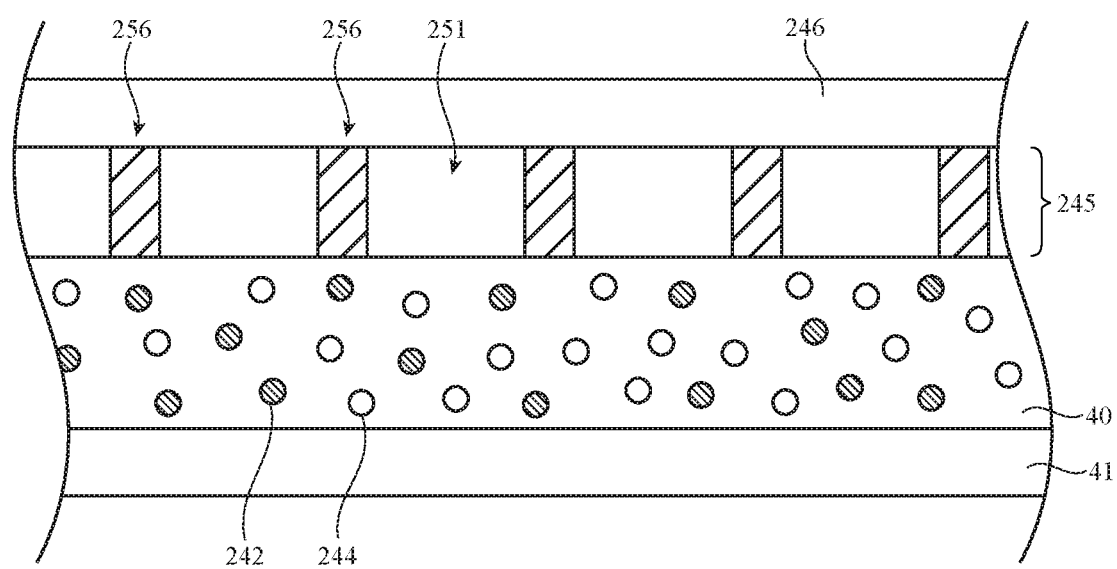
Figure 50C:
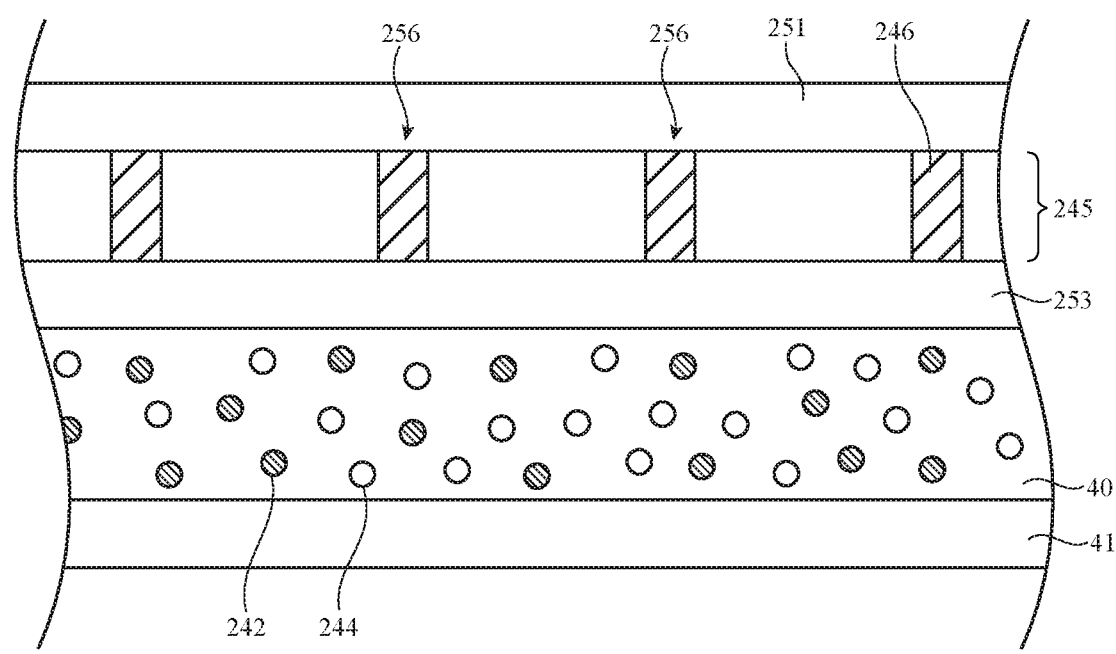

FIG. 50B shows a cross-sectional side view of color conversion layer 34 in which reflective structures 256 are formed in an additional layer 245. Additional layer 245 is interposed between phosphor layer and film 246. Additional layer 245 may include reflective structures 256 embedded in a transparent coating 251 (sometimes referred to as filler material). Alternatively, filler material 251 may be air. In embodiments where filler material 251 is air, an additional transparent coating 253 may be interposed between the reflective structures and the phosphor layer, as shown in FIG. 50C.

Figure 51A:
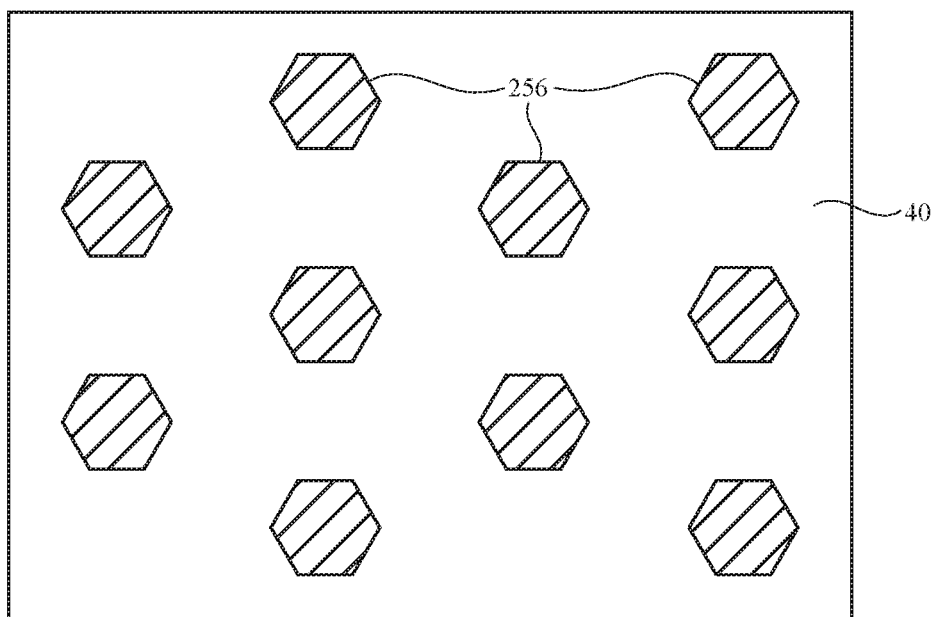
FIGS. 51A and 51B are top views of an illustrative phosphor layer with reflective structures in accordance with an embodiment.
Figure 51A:
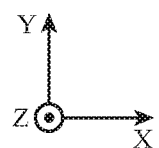

FIG. 51A is a top view of a phosphor layer with reflective structures such as the phosphor layer of FIG. 50A. As shown in FIG. 51A, structures 256 may have a hexagonal cross-sectional shape when viewed from above. This example is merely illustrative. Structures 256 may have any desired cross-sectional shape when viewed from above (e.g., circular, square, non-square rectangular, octagonal, etc.). Structures 256 may also optionally be cones, pyramids, or other shapes having a varying cross-section along the Z-axis.

Figure 51B:
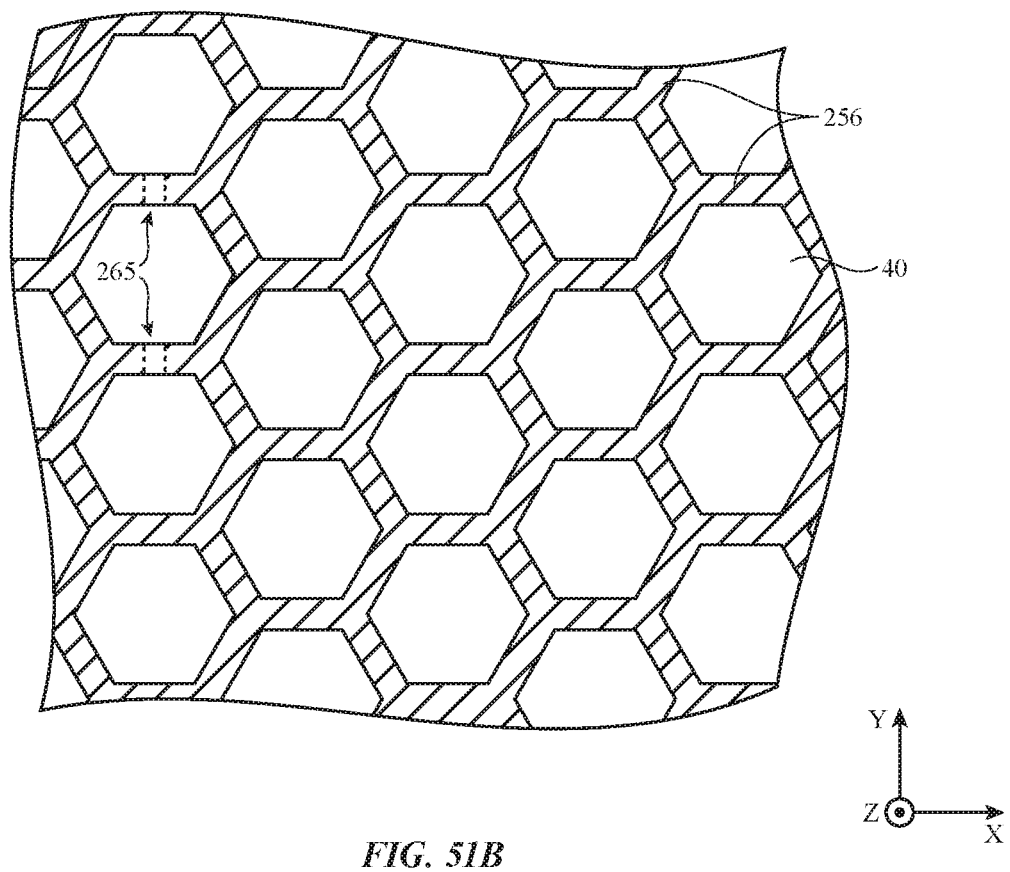

In another illustrative embodiment, shown in FIG. 51B, the reflective structures may be arranged in a honeycomb pattern. In other words, the reflective structures may be arranged in an interconnected web that defines hexagonal openings (filled by phosphor layer 40, for example). This example is merely illustrative. The reflective structures may be arranged in an interconnected web that defines a plurality of triangular openings, a plurality of circular openings, a plurality of square openings, a plurality of octagonal openings, a plurality of non-square rectangular openings, etc. In one embodiment, the reflective structures (sometimes referred to as reflective walls) may have openings to allow the phosphor layer to flow between cavities. Optional openings 265 in the reflective walls are shown in FIG. 51B. Each reflective wall portion may form one of six sides of the hexagonal shape around a respective cell of phosphor material. Each reflective wall portion may have one respective opening, each reflective wall portion may have two or more respective openings, or only some of the reflective wall portions may have openings.

Figure 52:
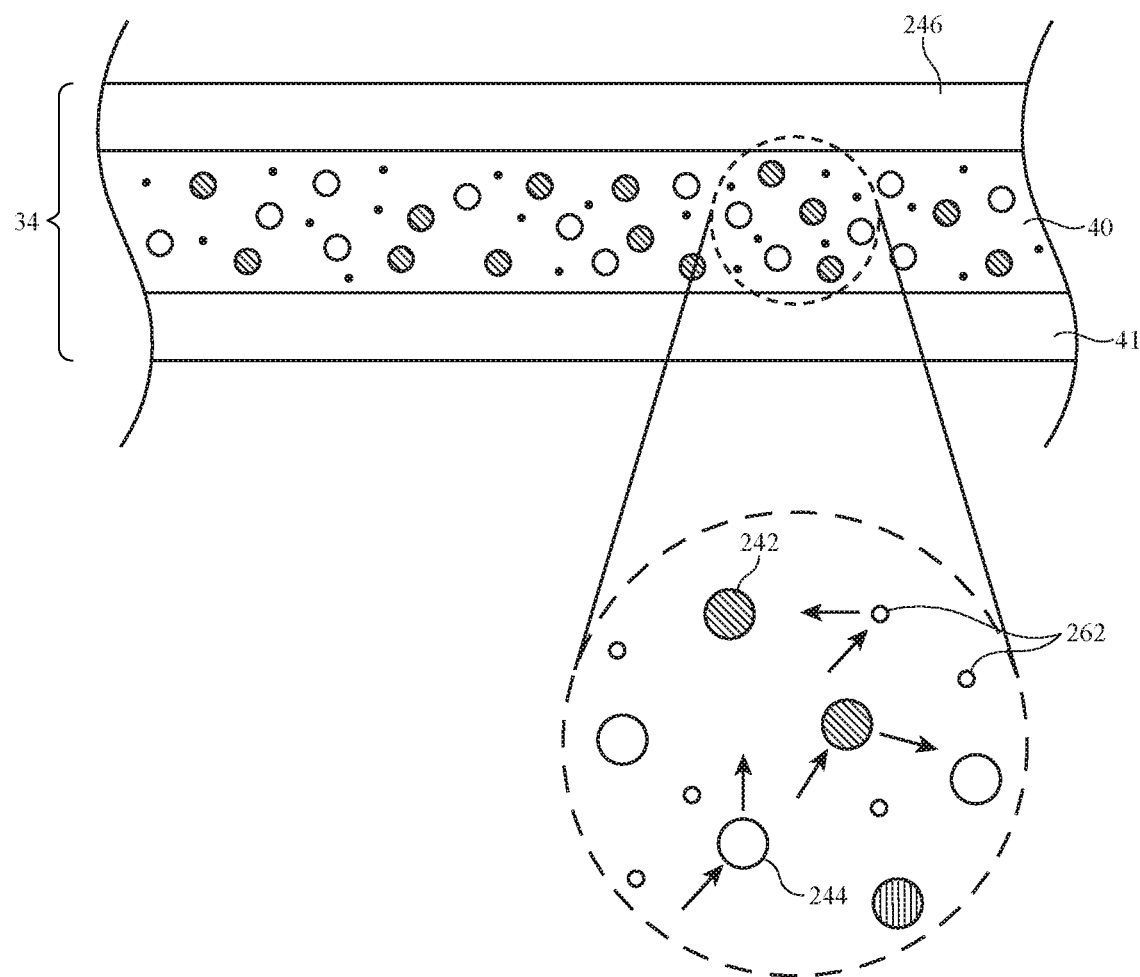
FIG. 52 is a cross-sectional side view of an illustrative color conversion layer having a phosphor layer with Rayleigh scattering dopants in accordance with an embodiment.

FIG. 52 is a cross-sectional side view of an illustrative color conversion layer with Rayleigh scattering dopants for increasing the amount of off-axis blue light. As shown in the inset portion of FIG. 52, red quantum dots 242 output light in a random direction (e.g., the direction that red light is output is not correlated to the direction that blue light is received). Similarly, green quantum dots 244 output light in a random direction (e.g., the direction that green light is output is not correlated to the direction that blue light is received). To make the emission direction of blue light more random (and therefore equalize the off-axis emission of blue light to the off-axis emission of red and green light), Rayleigh scattering dopants 262 may be included in the phosphor layer. Rayleigh scattering dopants 262 may elastically scatter blue light. This means that no energy is lost when the Rayleigh scattering dopants 262 receive blue light and that the wavelength of the light is not changed by the Rayleigh scattering dopants. However, the Rayleigh scattering dopants randomize the direction of the blue light. The blue light will be scattered by the Rayleigh scattering dopants while the red and green light will tend not to be scattered by the Rayleigh scattering dopants. Consequently, the distribution of red, blue, and green light may be equalized both on-axis and off-axis.

The average diameter of the Rayleigh scattering dopants may be between 5 and 20 nanometers, less than 100 nanometers, less than 50 nanometers, less than 20 nanometers, more than 5 nanometers, more than 1 nanometer, or any other desired diameter. The average diameter of quantum dots 242 and 244 may be more than 1 micron, more than 2 microns, between 1 and 3 microns, less than 5 microns, or any other desired diameter.

Figure 53:
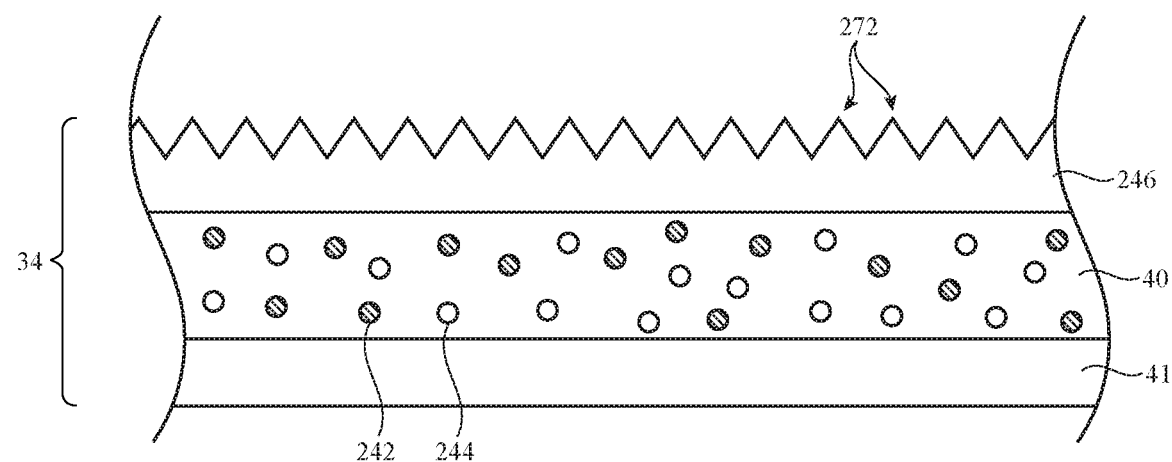
FIG. 53 is a cross-sectional side view of an illustrative color conversion layer having an optical film with prisms over a phosphor layer in accordance with an embodiment.

Uniformity of the display may also be improved by patterning the optical film over the phosphor layer in the color conversion layer. FIG. 53 is a cross-sectional side view of an illustrative color conversion layer 34 showing how film 246 may be patterned to include protrusions 272. Film 246 may be laminated directly to phosphor layer 40 or formed integrally with phosphor layer 40. The presence of protrusions 272 on the upper surface of film 246 may broaden the light that passes through color conversion layer 34. The protrusions may spread the blue light from the light-emitting diodes (e.g., by recycling more on-axis blue light thus creating a broader profile for the blue light). Protrusions 272 may be pyramidal shaped protrusions, cone shaped protrusions, hemispherical shaped protrusions, or protrusions of any other desired shape. Film 246 may sometimes be referred to as a prism film and protrusions 272 may sometimes be referred to as prisms.

Figure 54:
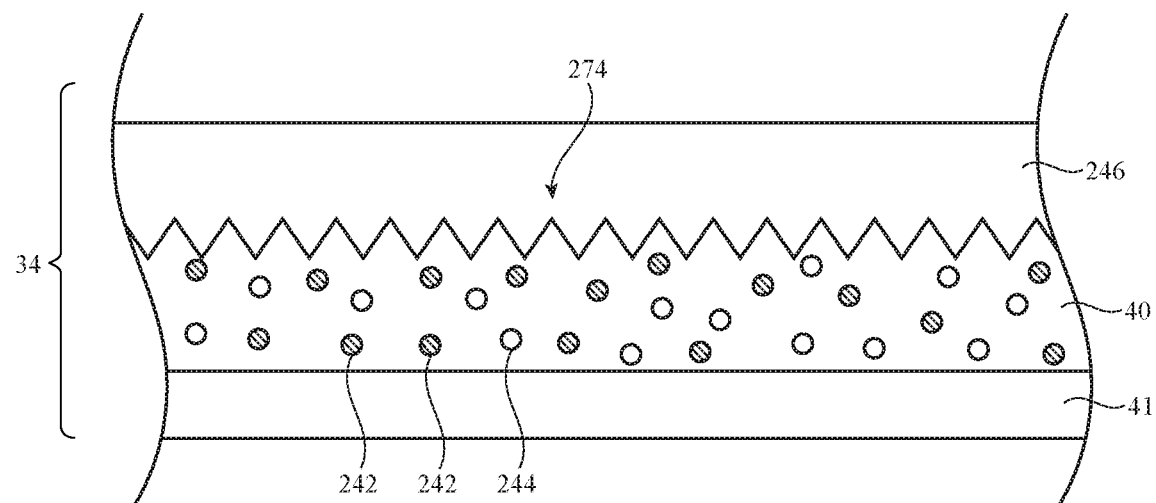
FIG. 54 is a cross-sectional side view of an illustrative color conversion layer having a phosphor layer that is patterned to reduce the path length of off-axis light in accordance with an embodiment.

FIG. 54 is a cross-sectional side view of an illustrative color conversion layer 34 showing another embodiment for improving uniformity of the display. In FIG. 54, the upper surface of phosphor layer 40 is patterned to have protrusions 274. The presence of protrusions 274 may result in on-axis light and off-axis light having a similar path length within phosphor layer 40 (similar to as shown and discussed in connection with FIGS. 49 and 50). Protrusions 274 may be pyramidal shaped protrusions, cone shaped protrusions, hemispherical shaped protrusions, or protrusions of any other desired shape. The lower surface of film 246 may conform to the upper surface of phosphor layer 40 (e.g., film 246 has recesses that receive the protrusions 274).

Figure 55:
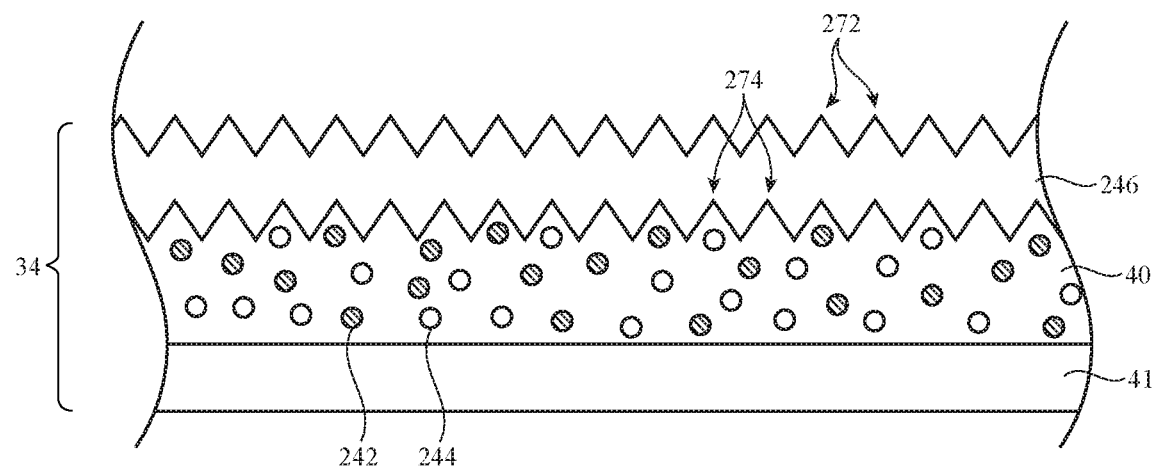
FIG. 55 is a cross-sectional side view of an illustrative color conversion layer having an optical film with prisms over a phosphor layer that is patterned to reduce the path length of off-axis light in accordance with an embodiment.

If desired, the concepts from FIGS. 53 and 54 may be combined into a single color conversion layer. FIG. 55 shows a cross-sectional side view of a color conversion layer of this type. As shown, film 246 may be patterned to include protrusions 272. Film 246 may be laminated directly to phosphor layer 40 or formed integrally with phosphor layer 40. The presence of protrusions 272 on the upper surface of film 246 may broaden the light that passes through color conversion layer 34 (e.g., the protrusions may spread the blue light from the light-emitting diodes). Protrusions 272 may be pyramidal shaped protrusions, cone shaped protrusions, hemispherical shaped protrusions, or protrusions of any other desired shape. The upper surface of phosphor layer 40 may also be patterned to have protrusions such as protrusions 274 in FIG. 55. The presence of protrusions 274 may result in on-axis light and off-axis light having a similar path length within phosphor layer 40. Protrusions 274 may be pyramidal shaped protrusions, cone shaped protrusions, hemispherical shaped protrusions, or protrusions of any other desired shape.

Figure 56:
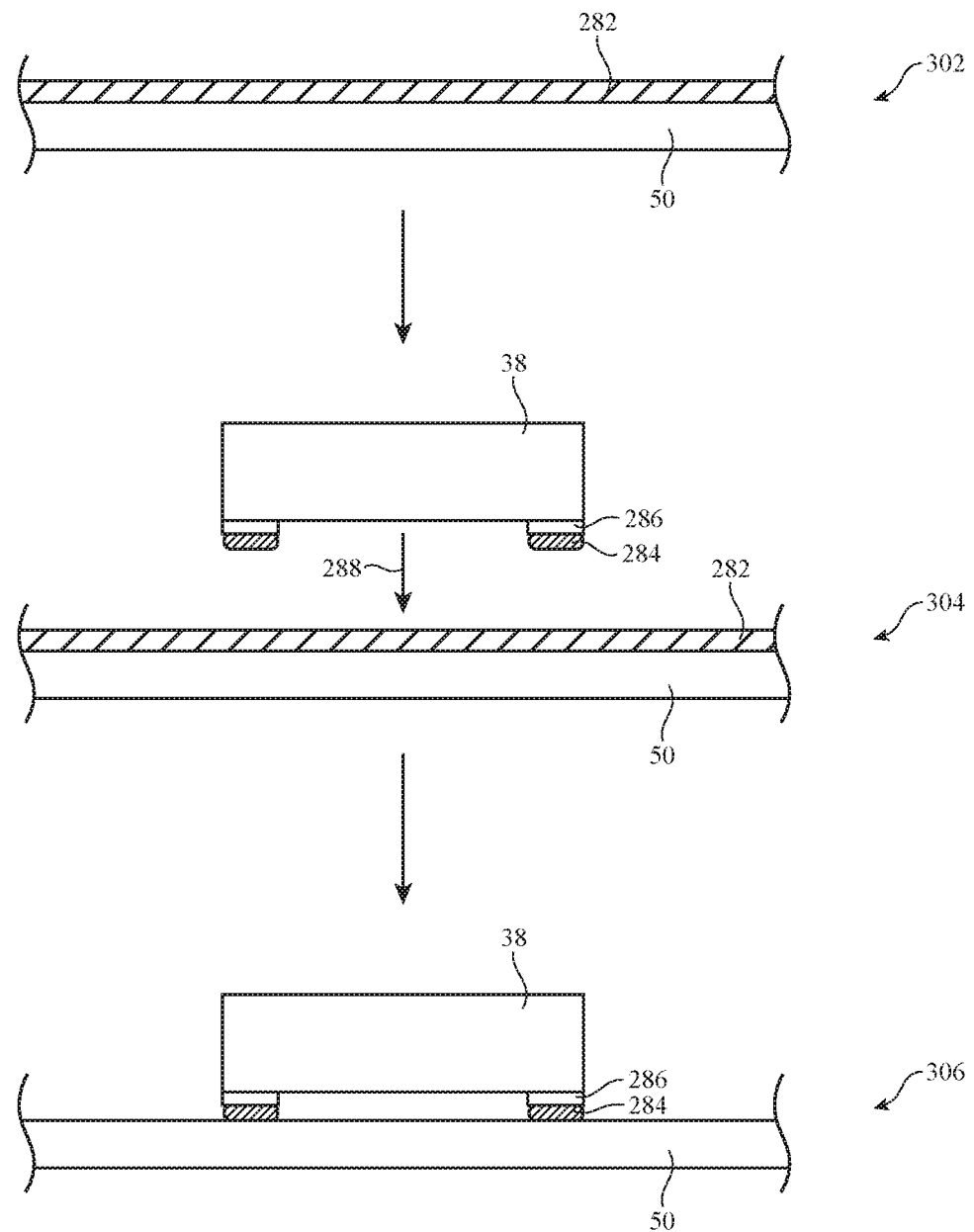
FIG. 56 is a diagram showing illustrative steps for attaching a pre-soldered light-emitting diode to a printed circuit board in accordance with an embodiment.

FIG. 56 is a diagram showing an illustrative method for attaching light-emitting diodes to a printed circuit board. One option for attaching light-emitting diodes to a printed circuit board is to deposit solder balls on the printed circuit board. Then, the light-emitting diode may be placed on the solder balls and the solder may be reflowed to attach the light-emitting diode to the printed circuit board. This method requires two placement steps (e.g., one for depositing the solder and one for placing the light-emitting diode). This may undesirably increase the possible manufacturing error and increase the time it takes to attach the light-emitting diodes to the printed circuit board.

FIG. 56 shows an alternate method for attaching light-emitting diodes to the printed circuit board in which the light-emitting diodes are pre-soldered before being placed on the printed circuit board. As shown in FIG. 56, at step 302 an adhesive layer 282 may be deposited over the printed circuit board. Adhesive layer 282 may be any desired type of adhesive. Next at step 304, a pre-soldered light-emitting diode 38 that includes solder 284 on solder pad 286 may be attached to printed circuit board 50. The light-emitting diode may be biased in direction 288 towards adhesive 282 such that adhesive 282 secures the light-emitting diode to the printed circuit board. After securing the light-emitting diode to the printed circuit board using adhesive 282, reflow may be performed at step 306. Adhesive 282 may evaporate during the reflow process (e.g., adhesive 282 may have a boiling point lower than the melting point of solder 284). Adhesive 282 may have a melting point that is lower than the melting point of solder 284. During reflow, solder 284 may form an electrical contact with printed circuit board 50. The light-emitting diode 38 is therefore attached to printed circuit board 50 using solder 284. Attaching light-emitting diodes using the method of FIG. 56 (with pre-soldered light-emitting diodes) may result in better light-emitting diode alignment and may be faster than attaching light-emitting diodes by separately depositing solder.

Figure 57:
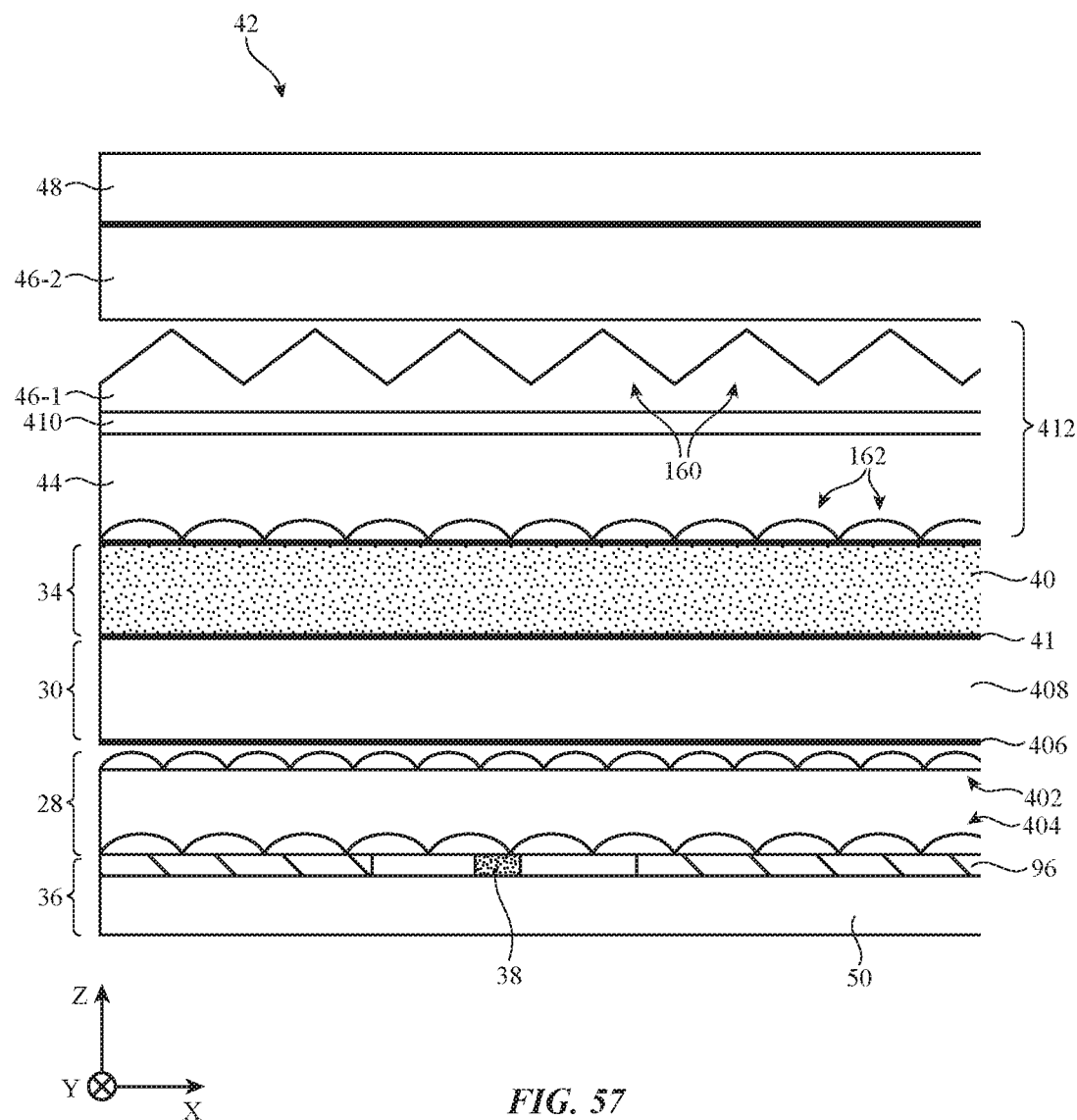
FIG. 57 is a cross-sectional side view of an illustrative backlight that includes an optical film with a low-index layer laminated between a collimating layer and brightness-enhancement film in accordance with an embodiment.

FIGS. 57-74 show cross-sectional side views of backlight units incorporating the aforementioned features. As shown in FIG. 57, backlight unit 42 may include a plurality of optical films formed over light-emitting diode array 36. Light-emitting diode array 36 may contain a two-dimensional array of light sources such as light-emitting diodes 38 that produce backlight illumination. Light-emitting diodes 38 may, as an example, be arranged in rows and columns and may lie in the X-Y plane of FIG. 57. Light-emitting diodes 38 may be mounted on printed circuit board 50 (sometimes referred to as substrate 50). A reflective layer 96 may be formed on an upper surface of printed circuit board 50 to increase efficiency of the backlight unit (similar to as shown in FIG. 22). The reflective layer may be formed from any desired material. In one possible arrangement, the reflective layer may also serve as a solder mask layer during attachment of the light-emitting diodes to the substrate (as with reflective layer 72 in FIG. 11).

Light-emitting diodes 38 may be controlled in unison by control circuitry in device 10 or may be individually controlled (e.g., to implement a local dimming scheme that helps improve the dynamic range of images displayed on pixel array 24). The light produced by each light-emitting diode 38 may travel upwardly along dimension Z through the optical films before passing through a pixel array.

Optical films within the backlight unit may include films such as light spreading layer 28, partially reflective layer 30, color conversion layer 34 (which may include phosphor layer 40 and partially reflective layer 41), collimating layer 44 (sometimes referred to as microlens array 44), brightness enhancement films 46-1 and 46-2, diffuser layer 48, and/or other optical films.

Light-emitting diodes 38 may emit light of any suitable color (e.g., blue, red, green, white, etc.). With one illustrative configuration described herein, light-emitting diodes 38 emit blue light. To help provide uniform backlight across backlight unit 42, light from light-emitting diodes 38 may be spread by light spreading layer 28. As shown in FIG. 57, light spreading layer 28 includes first light spreading features 402 on the upper surface of light spreading layer 28 and light spreading features 404 on the lower surface of light spreading layer 28. In the example of FIG. 57, light spreading features 402 (sometimes referred to as light spreading structures 402, prisms 402, lenses 402, etc.) are convex microlenses and light spreading features 404 (sometimes referred to as light spreading structures 404, prisms 404, lenses 404, etc.) are concave microlenses. This example is merely illustrative and both sets of light spreading features may have any desired shape and may be convex features (e.g., protrusions) or concave features (e.g., recesses).

After passing through light spreading layer 28, light from light-emitting diodes 38 may pass through partially reflective layer 30. Partially reflective layer 30 (sometimes referred to as dichroic layer 30 or dichroic filter layer 30) may be configured to reflect some light from the LEDs and transmit some light from the LEDs. As shown in FIG. 57, partially reflective layer 30 may include a multi-Bragg reflector 406 and a diffuser layer 408 that are laminated together. Light that is reflected off multi-Bragg reflector 406 may be recycled (e.g., the reflected light will reflect off of other layers such as substrate 50 before reaching multi-Bragg reflector 406 again). Light that is transmitted through multi-Bragg reflector 406 then passes through color conversion layer 34 (which may sometimes be referred to as a photoluminescent layer).

The transmission of multi-Bragg reflector 406 may be selected to maximize the efficiency of display 14. Lowering the transmission of blue light (e.g., from the light-emitting diodes) through the partially reflective layer increases the amount of blue light that is recycled. However, recycling more light may cause more light to be absorbed by printed circuit board 50 (or other layers below multi-Bragg reflector 406). Increasing the transmission of blue light may cause more visible artifacts. Therefore, the transmission of the partially reflective layer may be selected to optimize efficiency and uniformity of the display. The reflectance of printed circuit board 50 may influence the optimum transmission level of partially reflective layer 30. In one illustrative embodiment, printed circuit board 50 may have a reflectance of about 90% and multi-Bragg reflector 406 may reflect 50% of blue light from light-emitting diodes 38. Increasing the reflectance of printed circuit board 50 increases the optimum reflectance of partially reflective layer 30.

Color conversion layer 34 may convert the light from LEDs 38 from a first color to a different color. For example, when the LEDs emit blue light, color conversion layer 34 may include a phosphor layer 40 (e.g., a layer of white phosphor material or other photoluminescent material) that converts blue light into white light. If desired, other photoluminescent materials may be used to convert blue light to light of different colors (e.g., red light, green light, white light, etc.). For example, one layer 34 may have a phosphor layer 40 that includes quantum dots that convert blue light into red and green light (e.g., to produce white backlight illumination that includes, red, green, and blue components, etc.). Configurations in which light-emitting diodes 38 emit white light (e.g., so that layer 34 may be omitted, if desired) may also be used. In addition to phosphor layer 40, color conversion layer 34 may include a partially reflective layer 41. Partially reflective layer 41 (sometimes referred to as a dichroic layer or dichroic filter layer) may reflect all red and green light and partially reflect blue light, for example. Phosphor layer 40 and partially reflective layer 41 may be laminated together to form a single integral color conversion layer 34.

Collimating layer 44 (sometimes referred to as microlens layer 44 or microlens array diffuser 44) may collimate off-axis light. As shown in FIG. 57, collimating layer 44 may include an array of microlenses 162 on the lower surface of the film. Backlight unit 42 also includes brightness enhancement films such as brightness enhancement film 46-1 and brightness enhancement film 46-2 to further collimate the light. As shown, brightness enhancement film 46-1 may include protrusions 160 on an upper surface of the film. An additional optical layer 410 may be interposed between brightness enhancement film 46-1 and collimating layer 44. The additional optical layer 410 may be formed from a transparent material that has a low index-of-refraction. Optical layer 410 may therefore sometimes be referred to as low-index layer 410. As shown in FIG. 57, brightness enhancement film 46-1, low-index layer 410, and collimating layer 44 may be laminated together to form a combined optical layer 412.

An additional brightness enhancement film 46-2 may be included over brightness enhancement film 46-1 to further help collimate the backlight and thereby increase the brightness of the display. Brightness enhancement films 46-1 and 46-2 may optionally have protrusions that extend along longitudinal axes that are rotated 90° relative to each other if desired. Finally, backlight unit 42 may include diffuser layer 48 to homogenize light from the array of light-emitting diodes.

Figure 58:
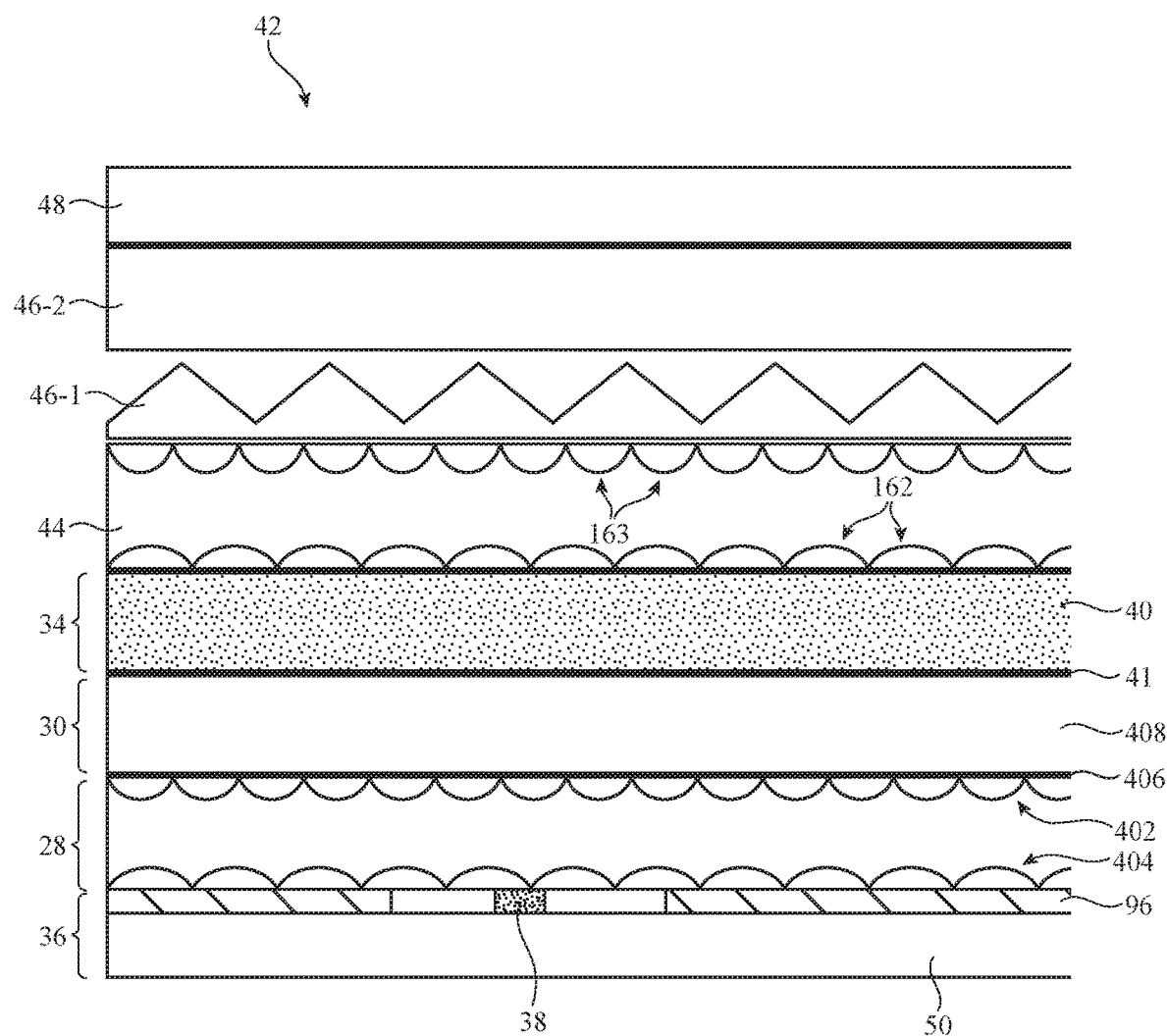
FIG. 58 is a cross-sectional side view of an illustrative backlight with a light spreading layer that has concave light spreading features on an upper surface and a lower surface in accordance with an embodiment.

The example of FIG. 57 of light spreading layer 28 including convex light spreading features on an upper surface and concave light spreading features on a lower surface is merely illustrative. In general, both sets of light spreading features may have any desired shape and may be convex or concave. FIG. 58 is a cross-sectional side view of an illustrative backlight unit with concave light spreading features 402 on an upper surface and concave light spreading features 404 on a lower surface.

Also in FIG. 58, collimating layer 44 includes microlenses 163 on the upper surface of the film in addition to microlenses 162 on the lower surface of the film. Microlenses 162 and 163 (sometimes referred to as recesses 162 and 163 or surface features 162 and 163) may have any desired shape. Collimating layer 44 and brightness enhancement film 46-1 are formed as separate films in FIG. 58 (instead of being laminated together with a low-index layer as in FIG. 57). In general, in all of the embodiments herein collimating layer 44 and brightness enhancement film 46-1 may be formed separately or may be laminated together.

Figure 59:
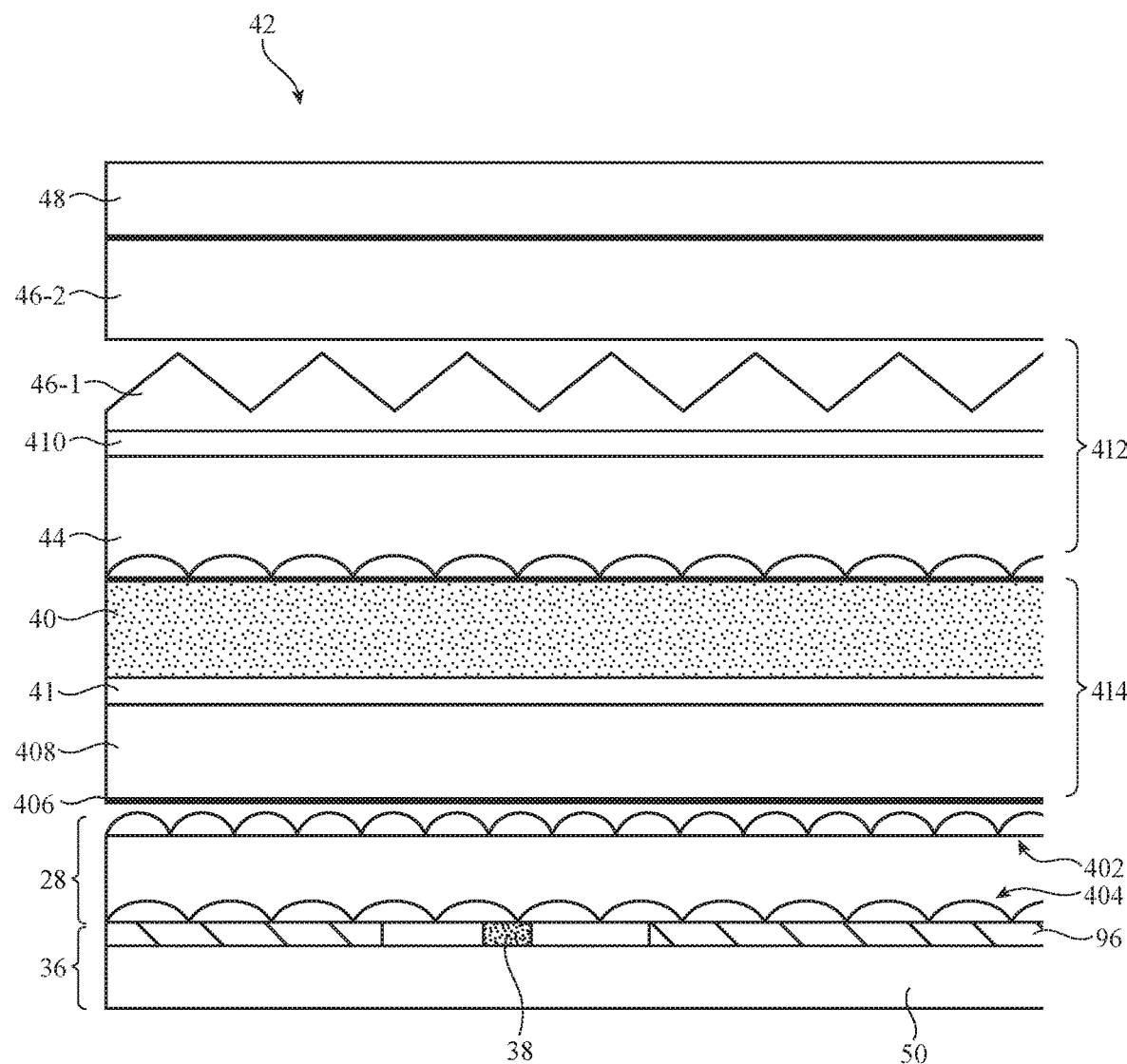
FIG. 59 is a cross-sectional side view of an illustrative backlight with a light spreading layer that has concave light spreading features on a lower surface and convex light spreading features on an upper surface in accordance with an embodiment.

Additional layers within the backlight unit may also be laminated together if desired. FIG. 59 is a cross-sectional side view of a backlight unit similar to the backlight unit of FIG. 57. However, in FIG. 59 the phosphor layer 40, partially reflective layer 41, multi-Bragg reflector 406, and diffuser layer 408 may be laminated together to form an integral conversion film 414.

Figure 60:
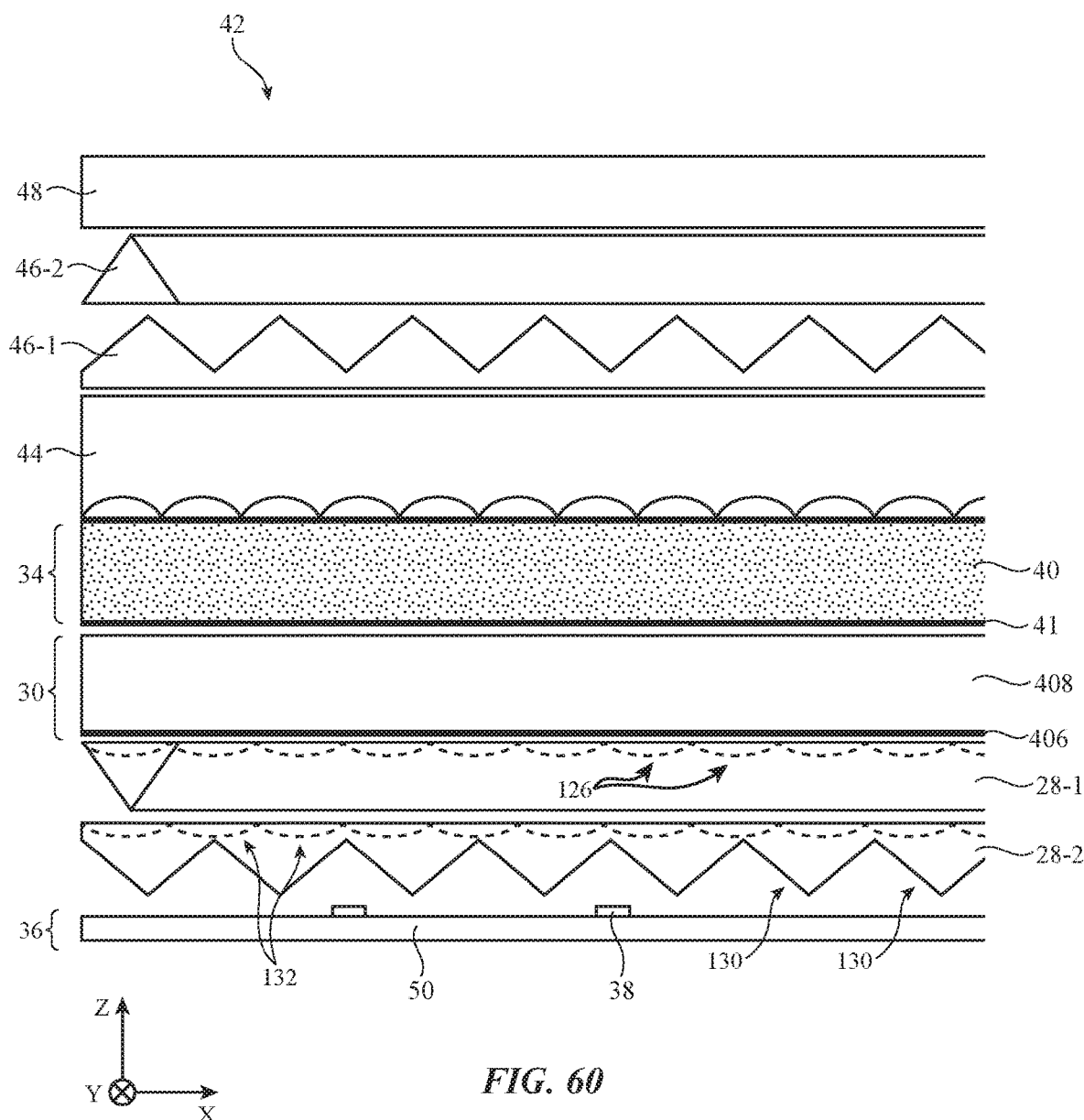
FIG. 60 is a cross-sectional side view of an illustrative backlight with a light spreading layer that has first and second layers having elongated protrusions that are rotated relative to each other in accordance with an embodiment.

FIG. 60 is a cross-sectional side view of an illustrative backlight unit with first and second light spreading layers. As shown, light spreading layer 28-1 is positioned above light spreading layer 28-2. Light spreading layer 28-1 and light spreading layer 28-2 may be attached using adhesive. Alternatively, light spreading layers 28-1 and 28-2 may be laminated together to form an integral film. As shown in FIG. 60, light spreading layer 28-2 has an upper surface with microlenses 132. Microlenses 132 may be formed from a plurality of recesses in the upper surface of light spreading layer 28-2. Light spreading layer 28-2 may also include a plurality of protrusions 130. Protrusions 130 may protrude towards the light-emitting diodes. Protrusions 130 may be elongated protrusions (sometimes referred to as ridges) that extend along a longitudinal axis across the layer (e.g., parallel to the Y-axis in FIG. 60). Light spreading layer 28-1 may be the same as light spreading layer 28-2, except for being rotated 90° relative to light spreading layer 28-2. Light spreading layer 28-1 also includes microlenses 126. Microlenses 126 may be formed from a plurality of recesses in the upper surface of light spreading layer 28-1. Microlenses 126 and 132 may optionally be protrusions instead of recesses if desired.

Light emitted from light-emitting diodes 38 will be spread relative to a first axis (e.g., from a point source to two points) upon reaching light-spreading layer 28-2. Microlenses 132 may reduce total internal reflection to promote light passing to light spreading layer 28-1. Light spreading layer 28-1 will spread the incoming light relative to a second axis (e.g., from the two points to four points) that is perpendicular to the first axis (because the protrusions of layer 28-1 are perpendicular to the protrusions of layer 28-2). Microlenses 126 may reduce total internal reflection to promote leakage of light out of layer 28-1 towards layer 30. Layers 28-1 and 28-2 may each have any desired thickness (e.g., between 20 and 30 microns, between 20 and 25 microns, less than 50 microns, less than 25 microns, about 22 microns, greater than 15 microns, less than 100 microns, etc.). The thickness of layers 28-1 and 28-2 may be the same.

Figure 61:
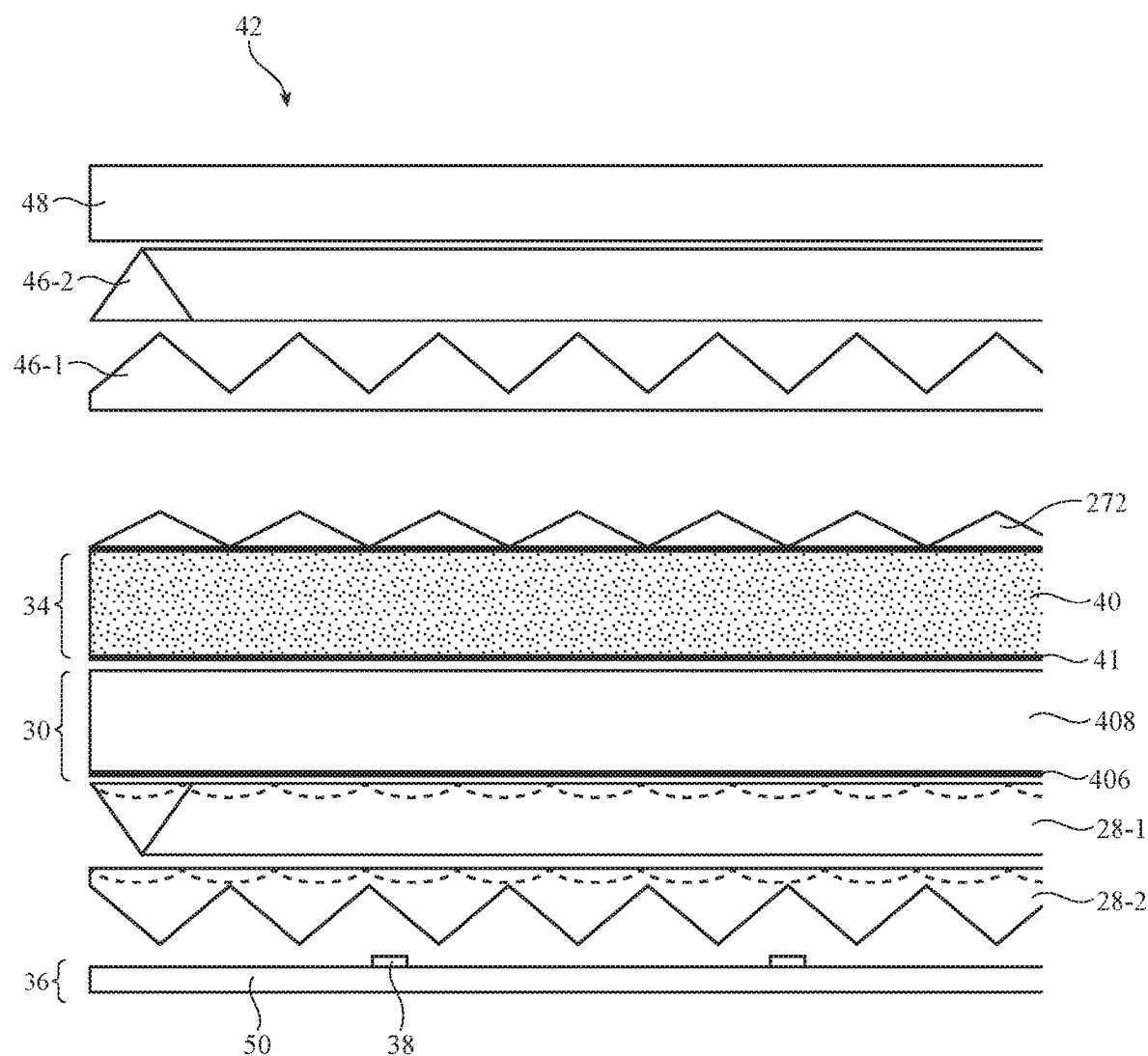
FIG. 61 is a cross-sectional side view of an illustrative backlight with a color conversion layer that includes prisms on an upper surface in accordance with an embodiment.

FIG. 61 is a cross-sectional side view of a backlight having protrusions 272 formed over phosphor layer 40 in color conversion layer 34. The presence of protrusions 272 may broaden the light that passes through color conversion layer 34 (e.g., the protrusions may spread the blue light from the light-emitting diodes). Protrusions 272 may be pyramidal shaped protrusions, cone shaped protrusions, hemispherical shaped protrusions, or protrusions of any other desired shape. Protrusions 272 may sometimes be referred to as prisms and may be formed in a film (prism film). Instead of protrusions, an optical film laminated to phosphor layer 40 may include recesses having any desired shape. Due to the presence of protrusions 272, collimating layer 44 may optionally be omitted from the backlight as shown in FIG. 61. Collimating layer 44 may optionally be omitted from any of the embodiments herein.

Any of the color conversion layers shown in FIGS. 53-55 may be used in the backlight units described herein. The example of FIG. 61 of the color conversion layer having protrusions 272 (similar to FIG. 53) is merely illustrative. The color conversion layer may instead have a patterned phosphor layer (as in FIG. 54) or may have both a patterned phosphor layer and patterned film over the phosphor layer (as in FIG. 55). The features of the patterned phosphor layer and patterned film over the phosphor layer may have any desired shapes.

Figure 62:
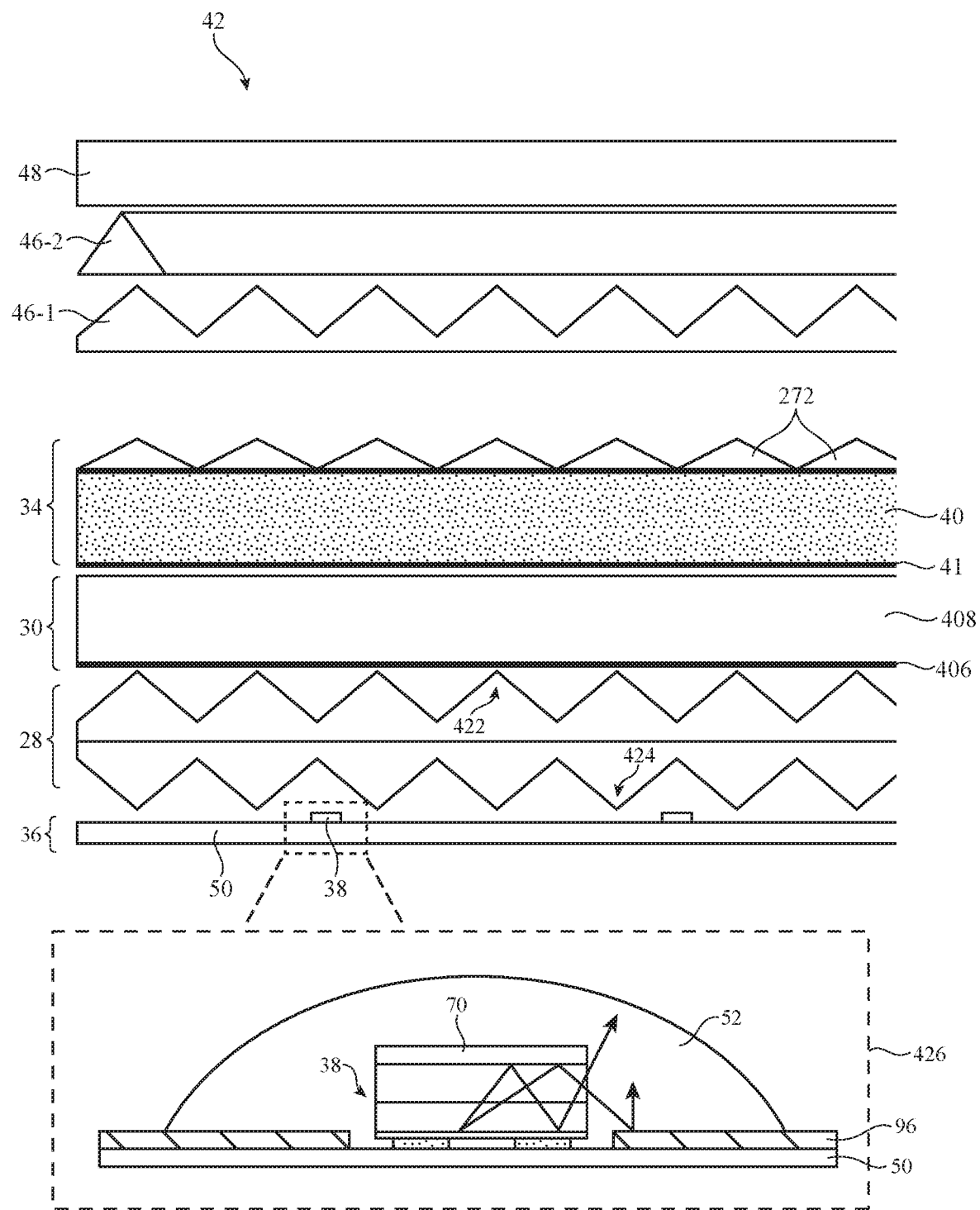
FIG. 62 is a cross-sectional side view of an illustrative backlight with light-emitting diodes covered by a dome of encapsulant in accordance with an embodiment.

The example in FIG. 61 of light spreading layer 28 including two layers (28-1 and 28-2) having elongated protrusions that extend along a longitudinal axis is merely illustrative. If desired, light spreading layer 28 may instead include an array of protrusions or recesses, as shown in FIG. 62. As shown in FIG. 62, light spreading layer 28 includes light spreading features 422 on an upper surface and light spreading features 424 on a lower surface. Light spreading features 422 and 424 may have any desired shape. For example, the light spreading features (sometimes referred to as light spreading structures 422 or light spreading structures 424) may be protrusions having a pyramidal shape (e.g., with a square base and four triangular faces that meet at a vertex) or a triangular pyramidal shape (e.g., with a triangular base and three triangular faces that meet at a vertex). The pyramidal protrusions may split a point light source into four points, whereas the triangular pyramidal protrusions may split a point light source into three points. In another embodiment, the light spreading structures may be recesses having a pyramidal shape or a triangular pyramidal shape. Any of the light spreading structures of FIGS. 33-35 may be included in the light spreading layer. The shapes of the structures on the upper surface of layer 28 may be the same or may be different than the shapes of the structures on the lower surface of layer 28. Layer 28 may be formed from a single optical film with light spreading structures patterned on the upper and lower surface. Layer 28 may also be formed from first and second optical films that are laminated together and that have respective light spreading structures.

FIG. 62 also shows an example of an encapsulant arrangement for the light-emitting diodes 38 on printed circuit board 50. As shown in inset portion 426, light-emitting diode 38 is mounted to printed circuit board 50. Reflective layer 96 is formed on printed circuit board 50 around the light-emitting diode. Each light-emitting diode 38 may include a reflector layer 70 (e.g., a distributed Bragg-reflector) formed over the light-emitting diode. The light-emitting diode is also covered by encapsulant such as dome-shaped encapsulant 52. Reflector layer 70 and reflective layer 96 may help spread the light from light-emitting diode 38 to avoid hotspots.

Figure 63:
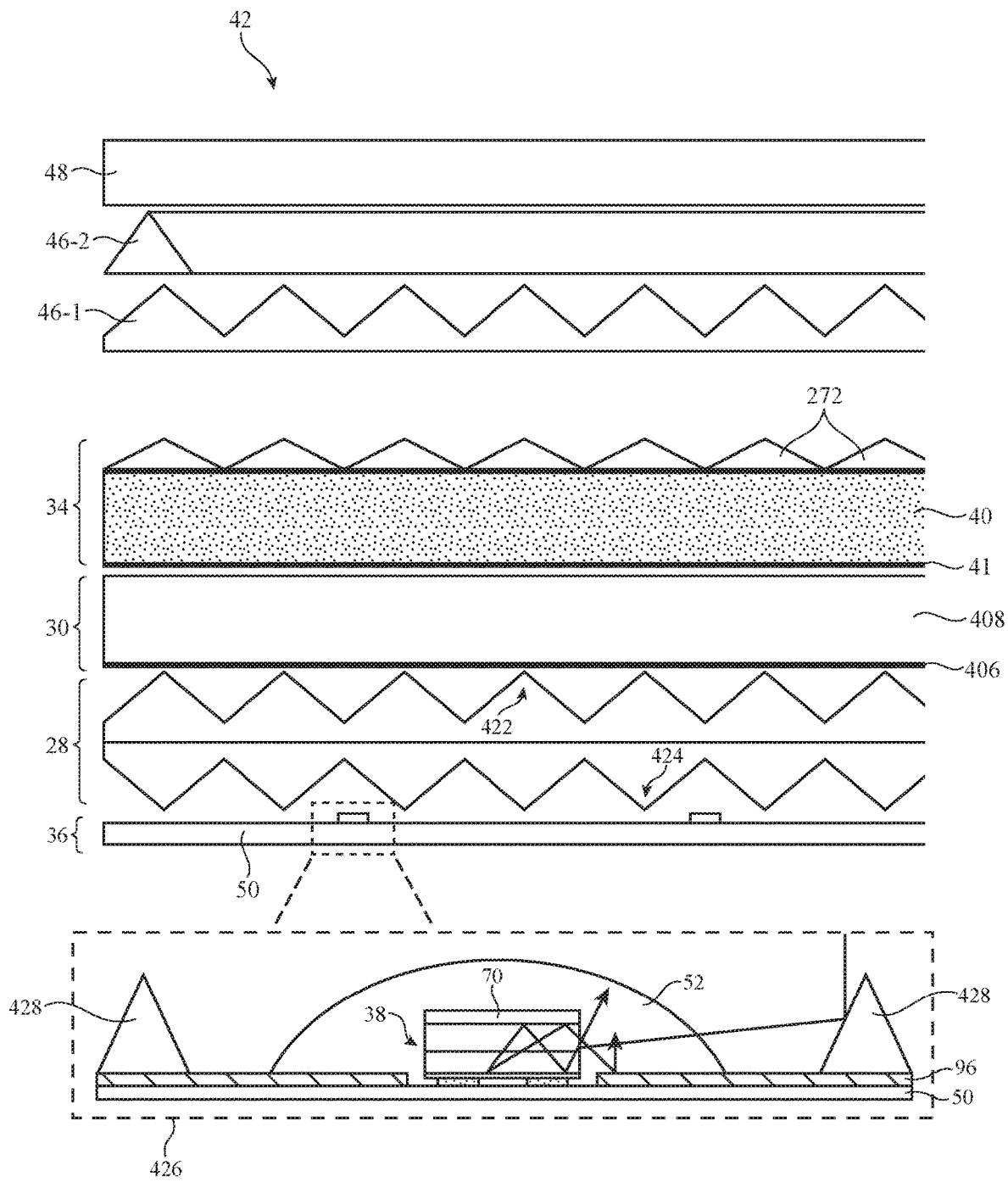
FIG. 63 is a cross-sectional side view of an illustrative backlight with light-emitting diodes covered by a dome of encapsulant and interposed between reflective structures in accordance with an embodiment.

The arrangement for the encapsulant and light-emitting diode in FIG. 62 is merely illustrative. FIG. 63 is cross-sectional side view of another backlight with a different possible LED arrangement depicted in inset portion 426. As shown in FIG. 63, structures 428 (sometimes referred to as support structures, reflective structures, or light leakage promotion structures) may be formed on substrate 50. Structures 428 may be transparent structures configured to provide mechanical support for the backlight unit (similar to structures 232 in FIG. 47). Structures 428 may alternatively be reflective structures configured to redirect light from light-emitting diode 38 towards the user (as shown in FIG. 63).

Figure 64:
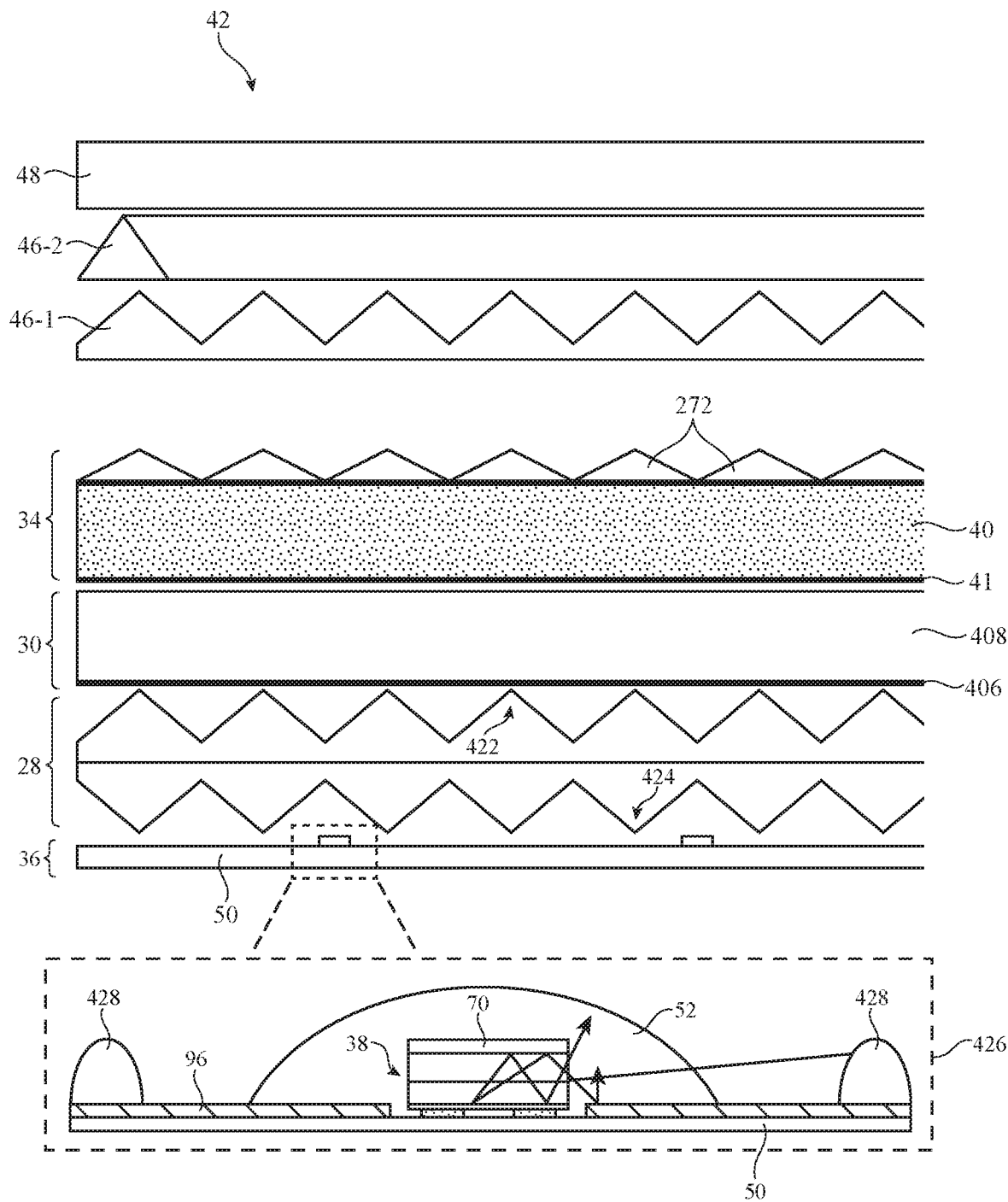
FIG. 64 is a cross-sectional side view of an illustrative backlight with light-emitting diodes covered by a dome of encapsulant and interposed between reflective structures having curved upper surfaces in accordance with an embodiment.

In FIG. 63, structures 428 are depicted as having a triangular cross-sectional shape. However, this example is merely illustrative and structures 428 may have any desired shape. Structures 428 may have a trapezoidal cross-sectional shape or a cross-sectional shape with a curved upper surface. FIG. 64 shows an example where structures 428 have a curved upper surface.

Figure 65:
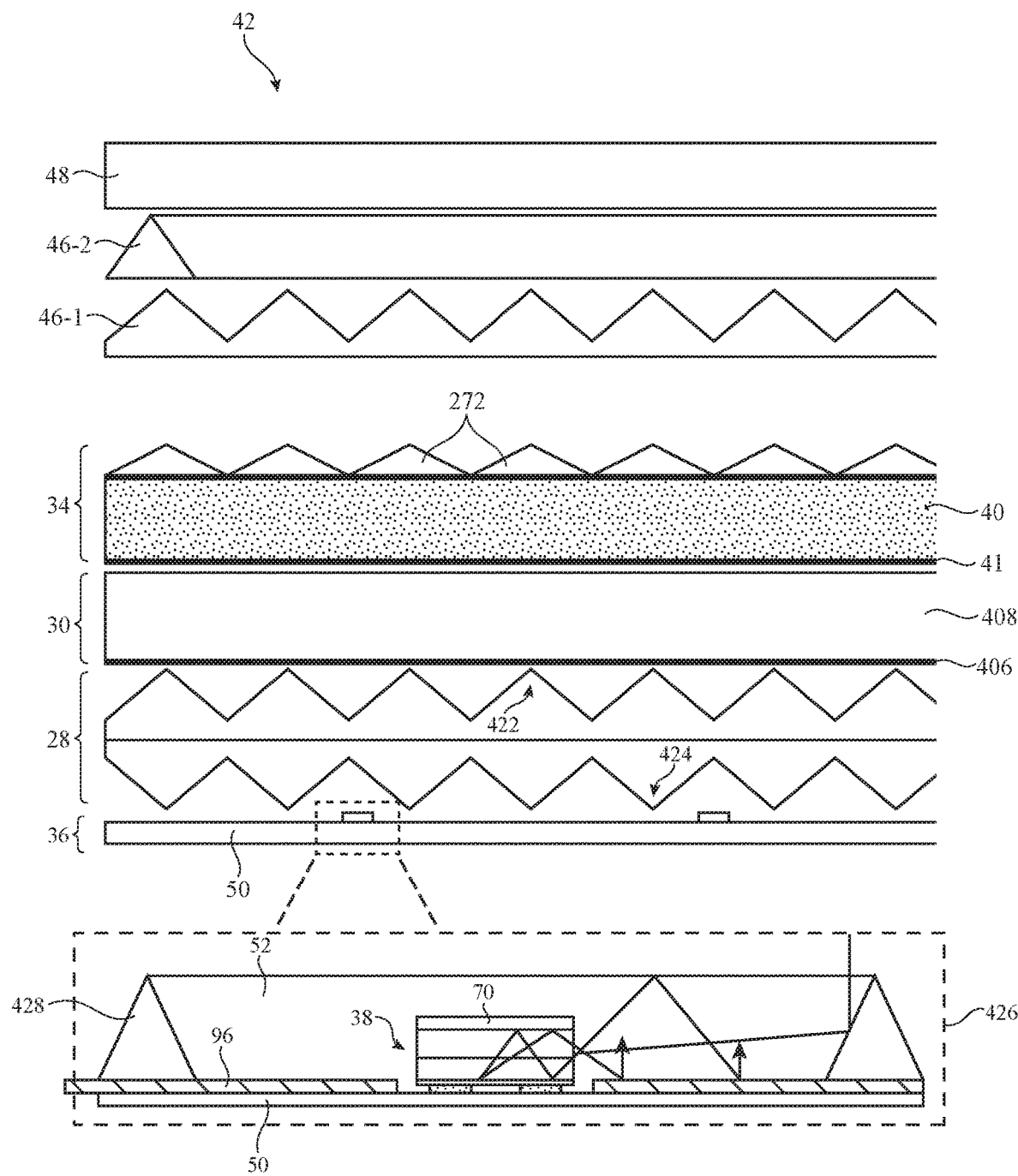
FIG. 65 is a cross-sectional side view of an illustrative backlight with light-emitting diodes interposed between reflective structures and covered by a slab of encapsulant in accordance with an embodiment.

FIG. 65 shows yet another possible arrangement for the light-emitting diodes on printed circuit board 50 in inset portion 426. As shown in FIG. 65, encapsulant 52 may be formed as a slab between structures 428 (as opposed to a dome of encapsulant as in FIG. 64). The encapsulant may have a planar upper surface or an upper surface with a slight convex curve.

Figure 66:
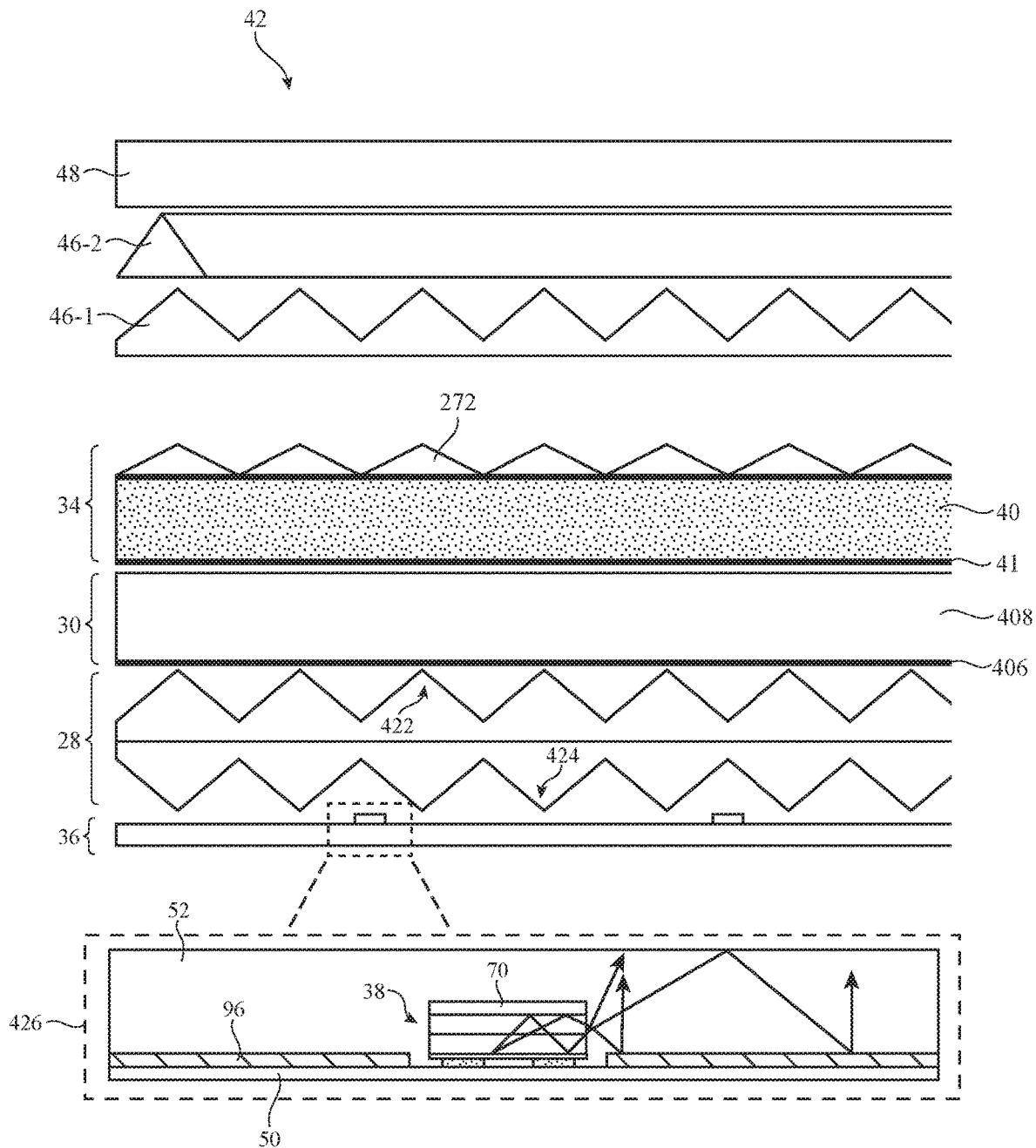
FIG. 66 is a cross-sectional side view of an illustrative backlight with light-emitting diodes covered by a slap of encapsulant in accordance with an embodiment.

Inset portion 426 of FIG. 66 shows another arrangement for light-emitting diodes 38 and encapsulant 52. In FIG. 66, structures 428 (from FIG. 65) are omitted and encapsulant 52 is formed as a slab over the light-emitting diodes. The encapsulant may have a planar upper surface and may have a thickness that is tuned for optimal spreading of light from the light-emitting diodes.

Figure 67:
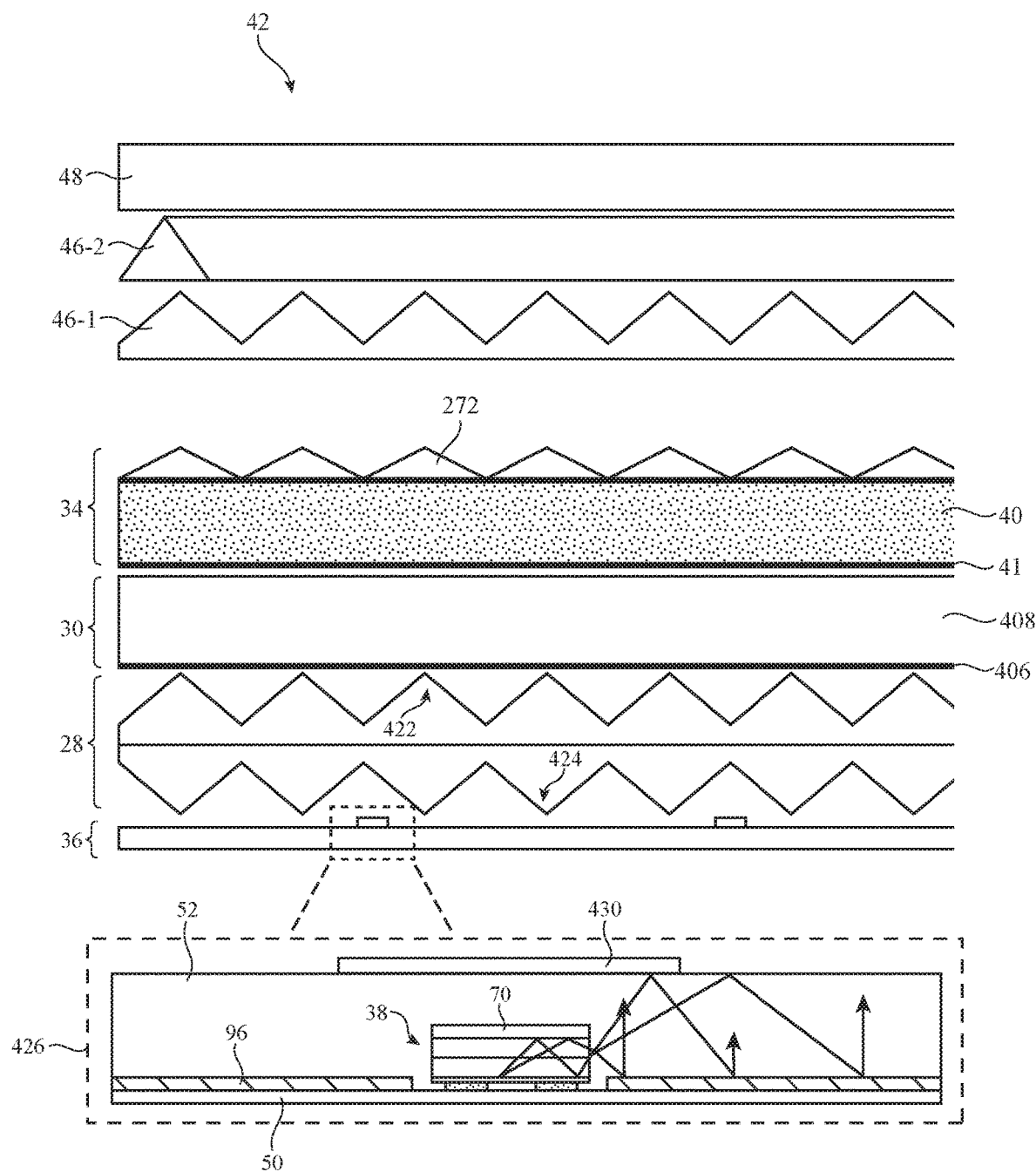
FIG. 67 is a cross-sectional side view of an illustrative backlight with light-emitting diodes covered by a slab of encapsulant and reflective material on the encapsulant in accordance with an embodiment.

In another embodiment, shown in inset portion 426 of FIG. 67, additional reflective material 430 may be incorporated on the slab of encapsulant 52. Additional reflective material 430 may be translucent and may cause specular reflection (in which the angle of incidence of a ray of light equals the angle of output of the reflected ray of light) ad/or diffusive reflection (in which an incident ray of light may be reflected in any direction). Reflective material 430 may be patterned to have portions formed directly over corresponding light-emitting diodes. The reflective material may be printed directly on encapsulant 52 or may be formed on a separate film that is aligned over the light-emitting diodes. Reflective material 430 may reflect at least 10% of light, at least 25% of light, at least 50% of light, at least 75% of light, less than 90% of light, or any other desired amount of light.

Figure 68:
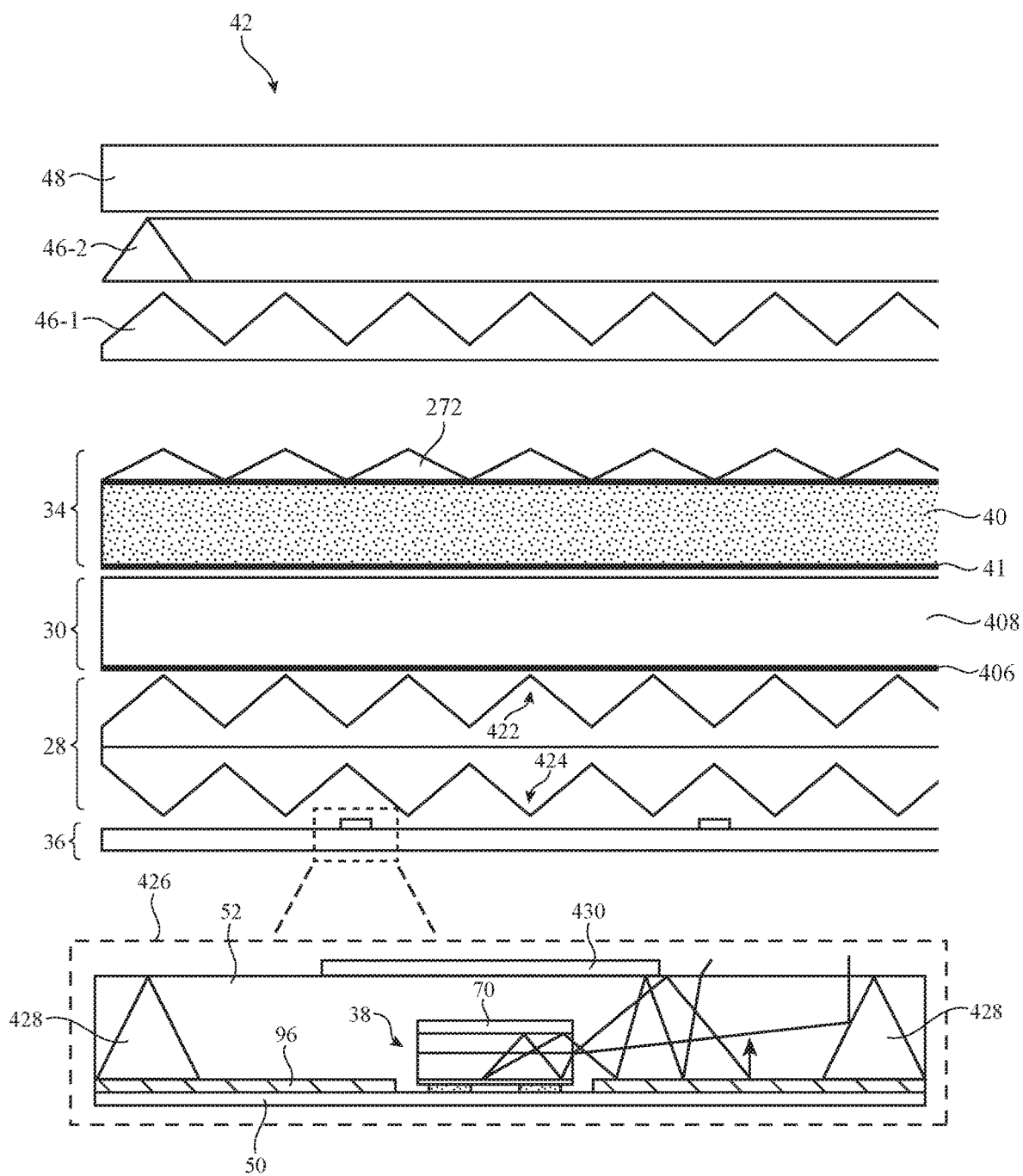
FIG. 68 is a cross-sectional side view of an illustrative backlight with light-emitting diodes that interposed between reflective structures and that are covered by a slab of encapsulant and reflective material on the encapsulant in accordance with an embodiment.

Additional reflective material 430 may be included in embodiments where additional structures 428 are present. FIG. 68 shows an embodiment of this type. As shown, encapsulant 52 is formed between reflective structures 428 and reflective material 430 is formed on the encapsulant. Reflective material 430 may reflect at least 10% of light, at least 25% of light, at least 50% of light, at least 75% of light, less than 90% of light, or any other desired amount of light.

Figure 69:
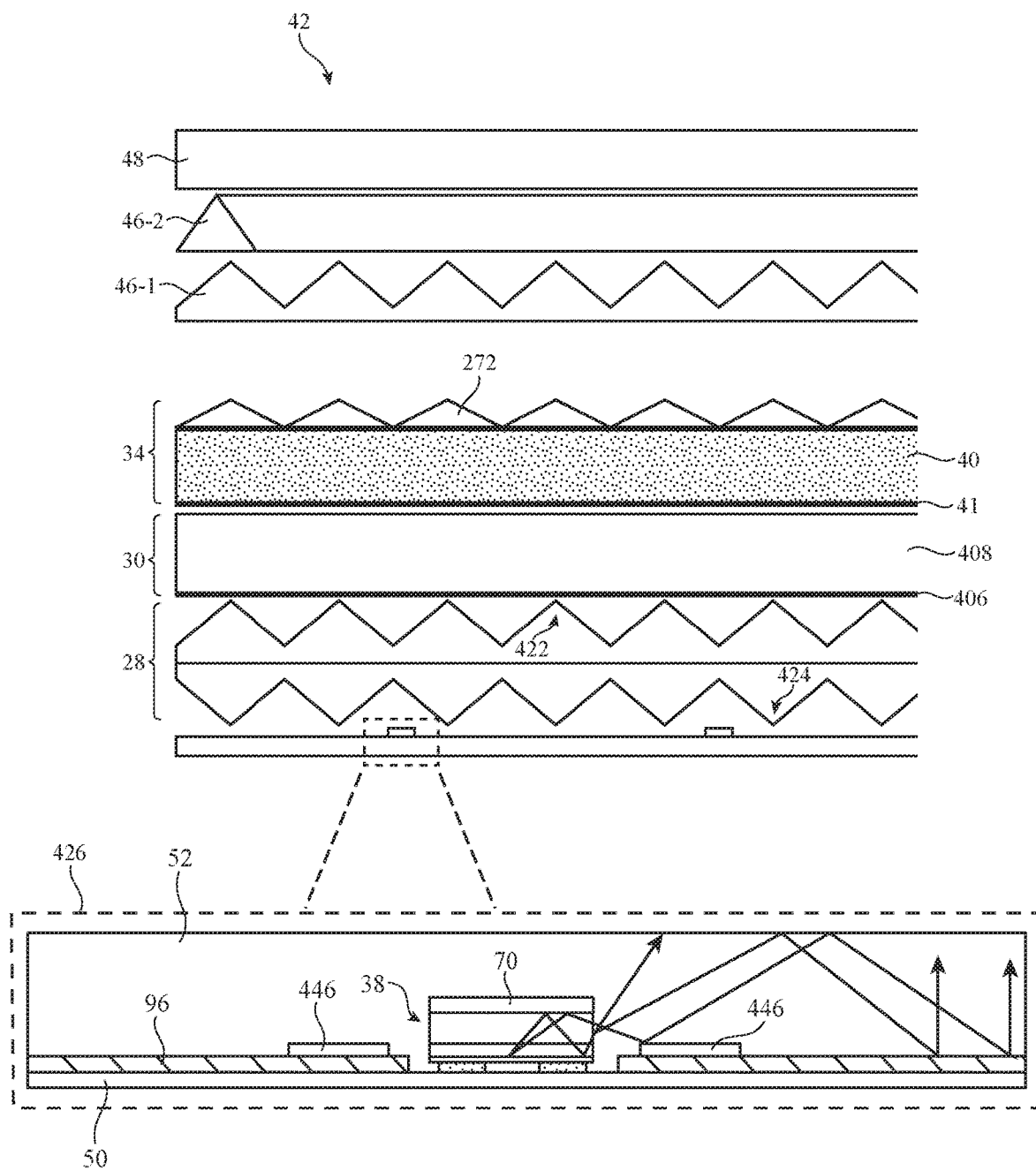
FIG. 69 is a cross-sectional side view of an illustrative backlight with light-emitting diodes surrounded by specular reflective material in accordance with an embodiment.

In FIGS. 62-68, reflective layer 96 is depicted on the upper surface of printed circuit board 50. Reflective layer 96 may cause diffusive reflection, meaning an incident ray of light may be reflected in any direction. This helps direct light towards the viewer in areas between the light-emitting diodes. However, in some embodiments, additional reflective materials may be included that cause specular reflection. FIG. 69 is a cross-sectional side view of a backlight unit that includes reflective material 446 formed in a ring around light-emitting diode 70. Reflective material 446 may cause specular reflection, meaning an incident ray of light will be reflected at the same angle it strikes the reflective material. Reflective material 446 (sometimes referred to as specular reflective material 446) may help spread light further away from light-emitting diode 38 before the light is directed towards the viewer by reflective material 96 (sometimes referred to as diffusive reflective material 96).

FIGS. 62-69 show various arrangements for light-emitting diode 38 and encapsulant 52 on substrate 50. It should be understood that for all of the embodiments herein (e.g. in FIGS. 57-61 and FIGS. 70-73), any of the arrangements of FIGS. 62-69 may optionally be used or no encapsulant may be included.

Figure 70:
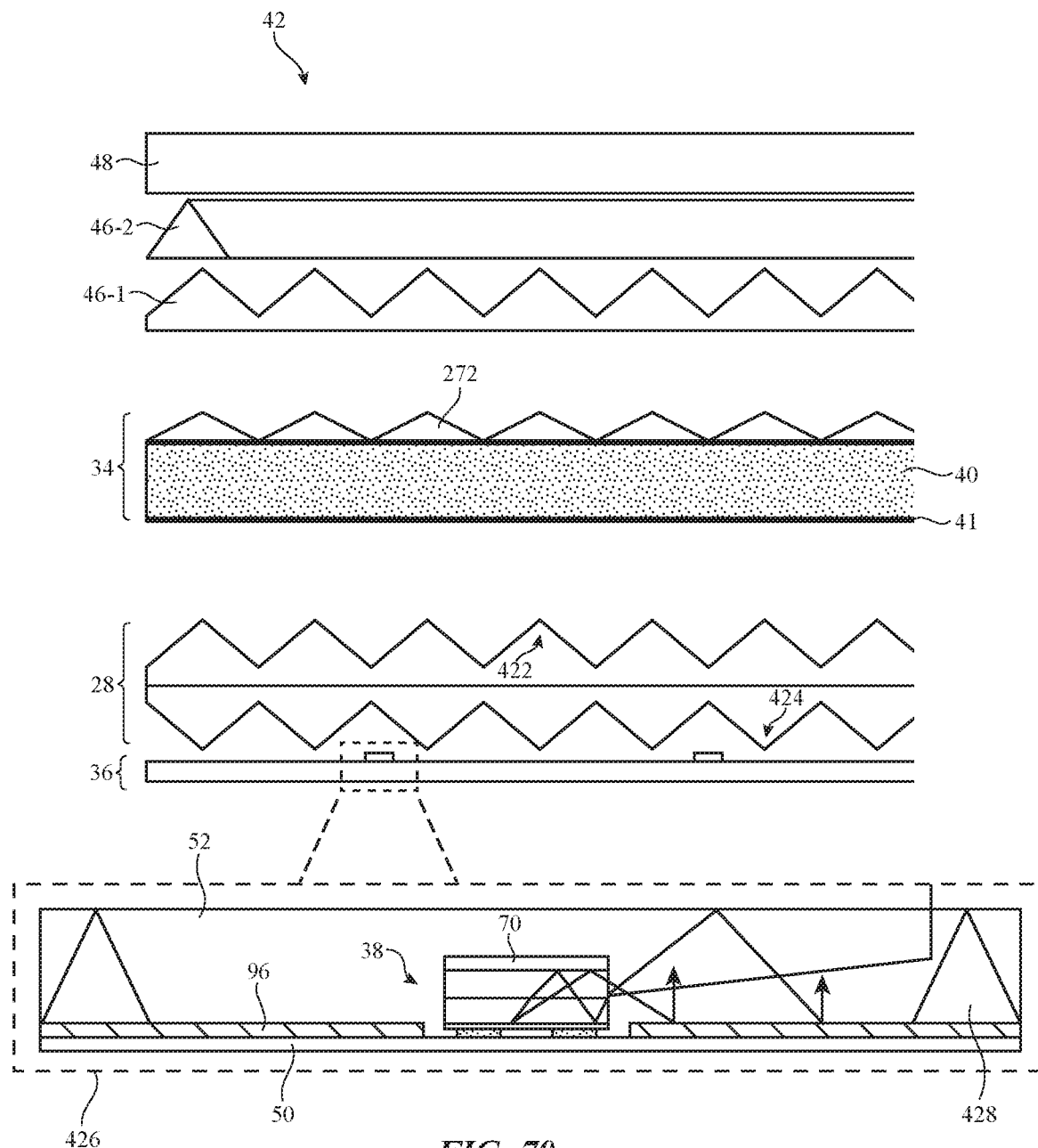
FIG. 70 is a cross-sectional side view of an illustrative backlight in which a partially reflective layer is omitted and a light spreading layer with protrusions on an upper surface and a lower surface is included in accordance with an embodiment.
Figure 71:
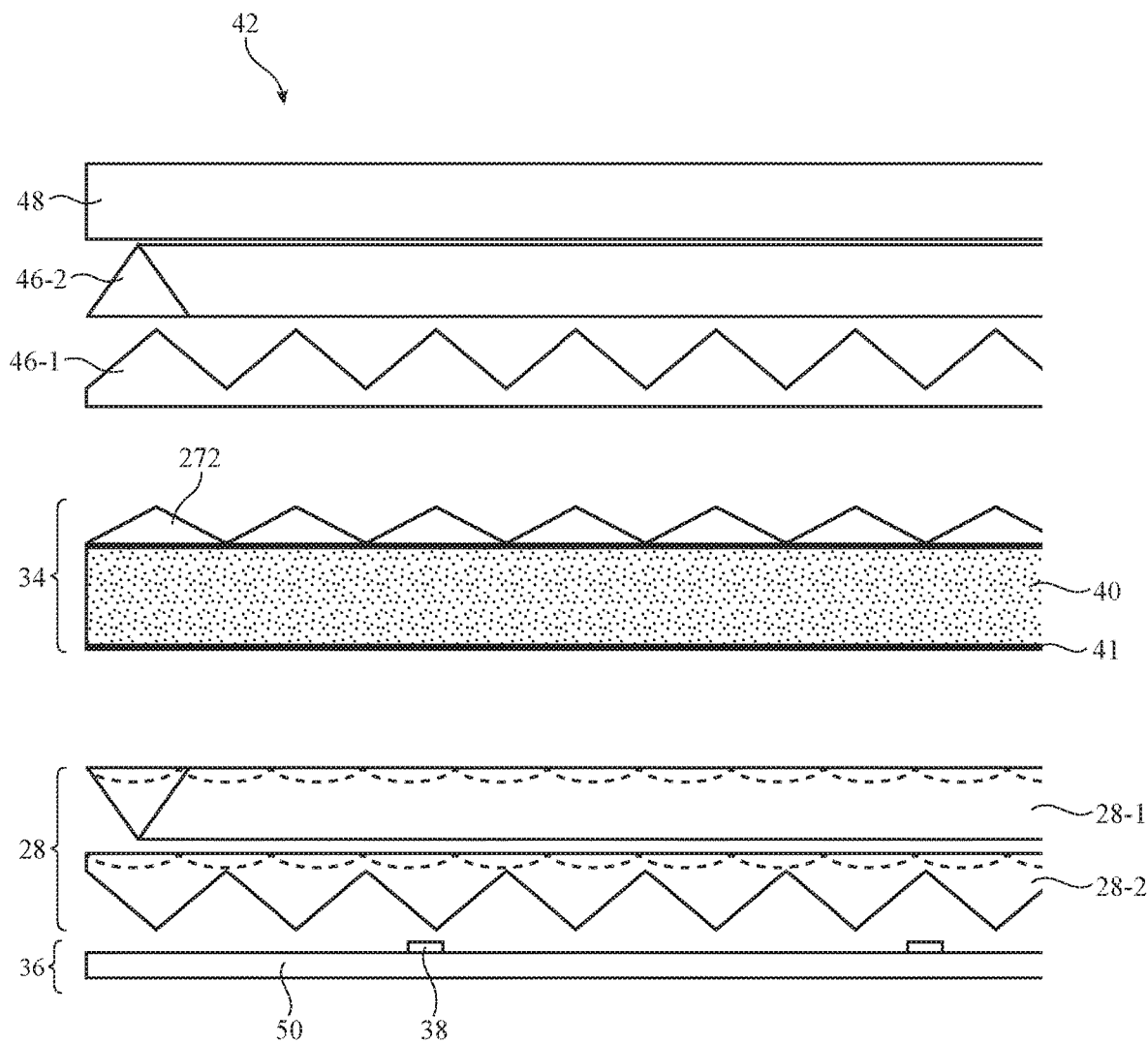
FIG. 71 is a cross-sectional side view of an illustrative backlight in which a partially reflective layer is omitted and a light spreading layer includes first and second layers that are laminated together in accordance with an embodiment.

FIGS. 70 and 71 are cross-sectional side views of an illustrative backlight unit showing how the design of light-emitting diodes 38, encapsulant 52, and structures 428 may allow partially reflective layer 30 to be omitted from the backlight unit. Omitting the partially reflective layer 30 may allow for the thickness of the backlight unit to be reduced. FIG. 70 shows an example where light spreading layer 28 includes light spreading features on the upper and lower surface and the partially reflective layer is omitted. FIG. 71 shows an example where light spreading layer 28 includes layers 28-1 and 28-2 rotated 90° relative to each other (as in FIG. 60) and the partially reflective layer is omitted. Layers 28-1 and 28-2 in FIG. 71 are laminated together.

It should be noted that, in any of the embodiments described herein, partially reflective layer 41 may optionally be omitted. The light spreading provided by the patterned film on phosphor layer 40 with protrusions 272 may provide sufficient light spreading such that the reflective properties of partially reflective layer 41 are not required for satisfactory display performance. In this case, partially reflective layer 41 may be replaced by a transparent optical layer without partially reflective properties. The transparent optical layer may still provide mechanical support for phosphor layer 40.

Figure 72:
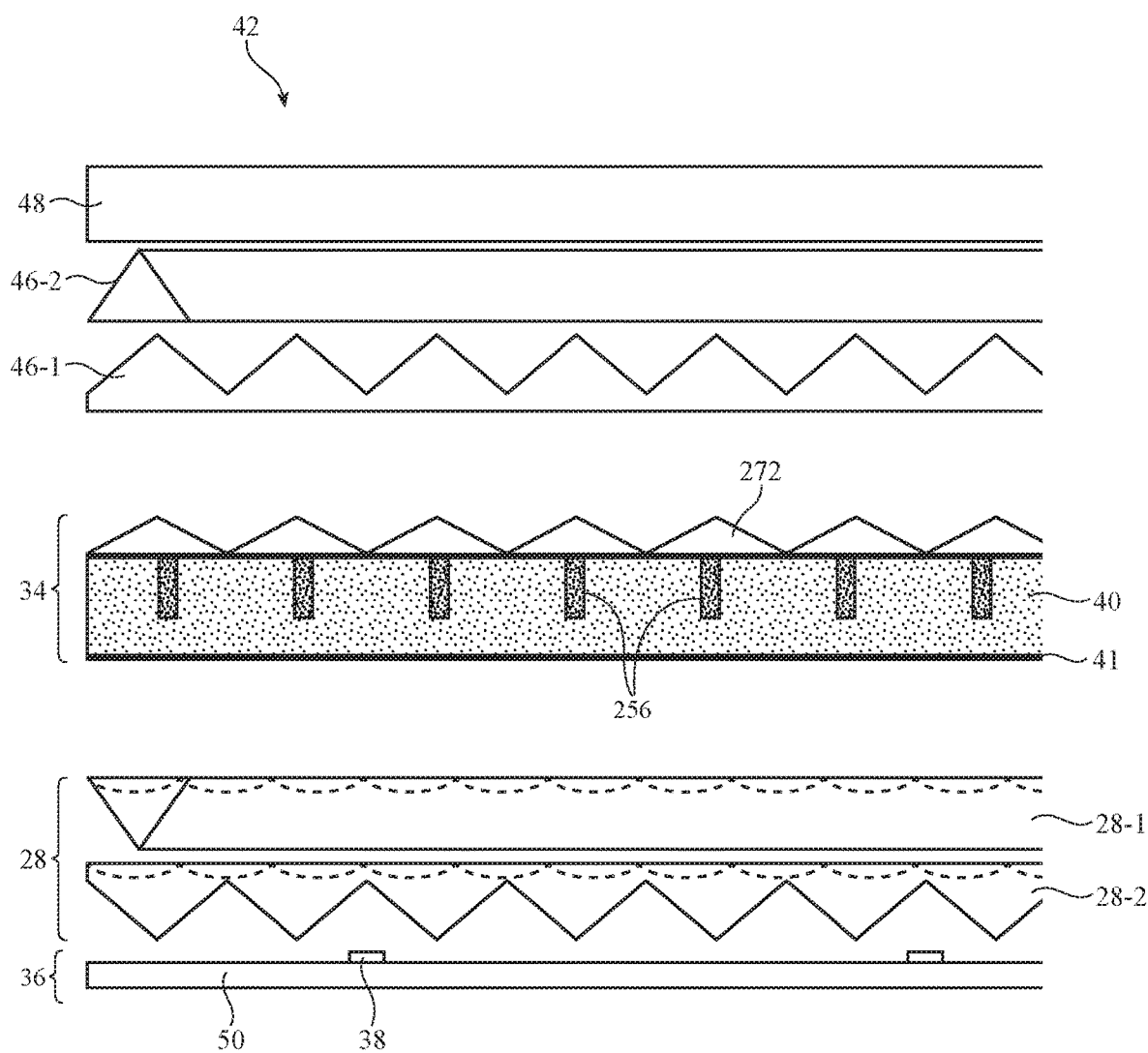
FIG. 72 is a cross-sectional side view of an illustrative backlight in which a color conversion layer includes reflective structures in accordance with an embodiment.

FIG. 72 is a cross-sectional side view of an illustrative backlight unit with a color conversion layer that includes reflective structures. As shown in FIG. 72, reflective structures 256 may be formed in phosphor layer. In other words, the color conversion layer of FIG. 50A may be used. Other color conversion layers with reflective structures may be used. For example, color conversion layers with reflective structures formed in a film over the phosphor layer (as in FIG. 50B or 50C) may also be used if desired. The reflective structures may have any desired arrangement when viewed from above. FIGS. 51A and 51B show illustrative arrangements for the reflective structures that may be used in FIG. 72. Structures 256 may optionally be cylinders, cones, pyramids, or other shapes. The reflective structures may be arranged in an interconnected web that defines a plurality of triangular openings, a plurality of circular openings, a plurality of square openings, a plurality of hexagonal openings, a plurality of octagonal openings, a plurality of non-square rectangular openings, etc. In one embodiment, the reflective structures (sometimes referred to as reflective walls) may have openings to allow the phosphor material to flow between cavities.

Figure 73:
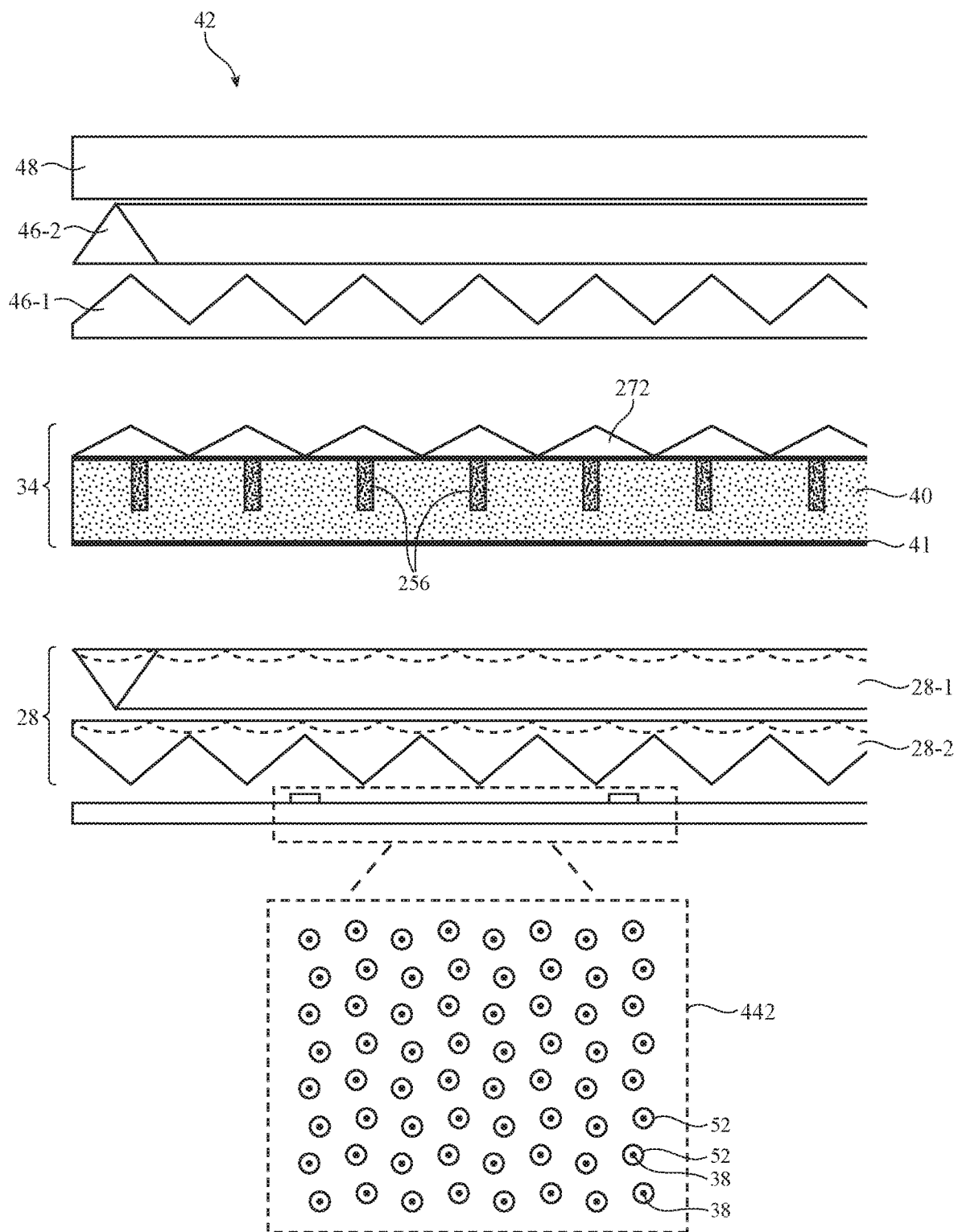
FIG. 73 is a cross-sectional side view of an illustrative backlight with light-emitting diodes that are dithered in accordance with an embodiment.

FIG. 73 is a cross-sectional side view of an illustrative backlight similar to the backlight of FIG. 72. However, in FIG. 73 light-emitting diodes 38 have been dithered, as shown by inset portion 442. The light-emitting diodes may be dithered similar to as shown in connection with FIGS. 43-45. Any of the embodiments herein may optionally include dithered light-emitting diodes of the type shown in FIG. 73.

The foregoing is merely illustrative and various modifications can be made to the described embodiments. The foregoing embodiments may be implemented individually or in any combination.

What is claimed is:

1. A display, comprising:
a plurality of pixels; and
a backlight configured to produce backlight illumination for the plurality of pixels, wherein the backlight comprises:
 a printed circuit board;
 a plurality of light-emitting diodes mounted on the printed circuit board;
 at least one light spreading layer formed over the printed circuit board that spreads light received from the plurality of light-emitting diodes; and
 a color conversion layer above the at least one light spreading layer, wherein the color conversion layer includes:
  a phosphor layer having a first upper surface and a first lower surface; and
  reflective structures, wherein the phosphor layer comprises a first plurality of quantum dots that convert light of a first color from the plurality of light-emitting diodes to light of a second color, wherein the phosphor layer comprises a second plurality of quantum dots that convert light of the first color from the plurality of light-emitting diodes to light of a third color, wherein the reflective structures have a reflectance greater than 40%, wherein the reflective structures have a second upper surface and a second lower surface, wherein the second upper surface is coplanar with the first upper surface, and wherein the second lower surface is interposed between the first lower surface and the first upper surface.

2. The display defined in claim 1, wherein the reflective structures do not include any of the first and second pluralities of quantum dots.

3. The display defined in claim 1, wherein the reflective structures have hexagonal cross-sections.

4. The display defined in claim 1, wherein the reflective structures are arranged in a honeycomb pattern.

5. A display, comprising:
a plurality of pixels; and
a backlight configured to produce backlight illumination for the plurality of pixels, wherein the backlight comprises:
 a printed circuit board;
 a plurality of light-emitting diodes mounted on the printed circuit board;
 at least one light spreading layer formed over the printed circuit board that spreads light received from the plurality of light-emitting diodes; and
 a color conversion layer above the at least one light spreading layer, wherein the color conversion layer includes a phosphor layer and reflective structures, wherein the phosphor layer comprises a first plurality of quantum dots that convert light of a first color from the plurality of light-emitting diodes to light of a second color, wherein the phosphor layer comprises a second plurality of quantum dots that convert light of the first color from the plurality of light-emitting diodes to light of a third color, wherein the reflective structures have a reflectance greater than 40%, and wherein the reflective structures are formed in an interconnected web that defines a plurality of cells for a phosphor material of the phosphor layer.

6. The display defined in claim 5, wherein the interconnected web includes a plurality of openings to allow flow between the cells.

7. A display, comprising:
- a plurality of pixels; and
- a backlight configured to produce backlight illumination for the plurality of pixels, wherein the backlight comprises:
  - a printed circuit board;
  - a plurality of light-emitting diodes mounted on the printed circuit board;
  - at least one light spreading layer formed over the printed circuit board that spreads light received from the plurality of light-emitting diodes; and
  - a color conversion layer above the at least one light spreading layer, wherein the color conversion layer includes a phosphor layer and reflective structures having a reflectance greater than 30%, wherein the reflective structures are formed in an interconnected web that defines a plurality of cells for a phosphor material of the phosphor layer, and wherein the interconnected web includes a plurality of openings to allow flow between the cells.

8. The display defined in claim 7, wherein the reflective structures are arranged in a honeycomb pattern.

* * * * *